US012131995B2

(12) United States Patent
Kim et al.

(10) Patent No.: US 12,131,995 B2
(45) Date of Patent: Oct. 29, 2024

(54) SEMICONDUCTOR DEVICE AND DATA STORAGE SYSTEM INCLUDING THE SAME

(71) Applicant: Samsung Electronics Co., Ltd., Suwon-si (KR)

(72) Inventors: Seungyoon Kim, Seoul (KR); Jeongyong Sung, Suwon-si (KR); Sanghun Chun, Suwon-si (KR); Jihwan Kim, Suwon-si (KR); Sunghee Chung, Suwon-si (KR); Jeehoon Han, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 18/370,913

(22) Filed: Sep. 21, 2023

(65) Prior Publication Data

US 2024/0014134 A1    Jan. 11, 2024

Related U.S. Application Data

(63) Continuation of application No. 17/475,128, filed on Sep. 14, 2021, now Pat. No. 11,791,262.

(30) Foreign Application Priority Data

Oct. 30, 2020   (KR) .................. 10-2020-0143002

(51) Int. Cl.
*H10B 43/27* (2023.01)
*H01L 23/528* (2006.01)
*H01L 29/423* (2006.01)

(52) U.S. Cl.
CPC .... *H01L 23/5283* (2013.01); *H01L 29/42356* (2013.01); *H10B 43/27* (2023.02)

(58) Field of Classification Search
None
See application file for complete search history.

(56) References Cited

U.S. PATENT DOCUMENTS

| 10,354,980 | B1 | 7/2019 | Mushiga et al. |
| 10,672,780 | B1 * | 6/2020 | Kawamura ............ H10B 43/27 |
| 2011/0151667 | A1 | 6/2011 | Hwang et al. |
| 2019/0279997 | A1 | 9/2019 | Nishimori et al. |
| 2019/0280003 | A1 | 9/2019 | Mushiga et al. |

(Continued)

FOREIGN PATENT DOCUMENTS

KR        101559958 B1    10/2015

*Primary Examiner* — Hsien Ming Lee
(74) *Attorney, Agent, or Firm* — Muir Patent Law, PLLC

(57) ABSTRACT

A semiconductor device includes a pattern structure; a stack structure including gate layers stacked in a first region on the pattern structure and extending into a second region; a memory vertical structure penetrating the stack structure in the first region; gate contact plugs electrically connected to the gate layers in the second region; and a first peripheral contact plug spaced apart from the gate layers, the gate layers including a first gate layer, the gate contact plugs including a first gate contact plug electrically connected to the first gate layer, side surfaces of the first gate contact plug and the first peripheral contact plug having different numbers of upper bending portions, and the number of upper bending portions of the side surface of the first gate contact plug being greater than the number of upper bending portions of the side surface of the first peripheral contact plug.

20 Claims, 47 Drawing Sheets

(56) References Cited

U.S. PATENT DOCUMENTS

2020/0161321 A1   5/2020  Guo et al.
2021/0125928 A1   4/2021  Kim et al.
2021/0210503 A1   7/2021  Matsuno et al.
2021/0358936 A1*  11/2021  Takuma ................. H10B 43/27

* cited by examiner

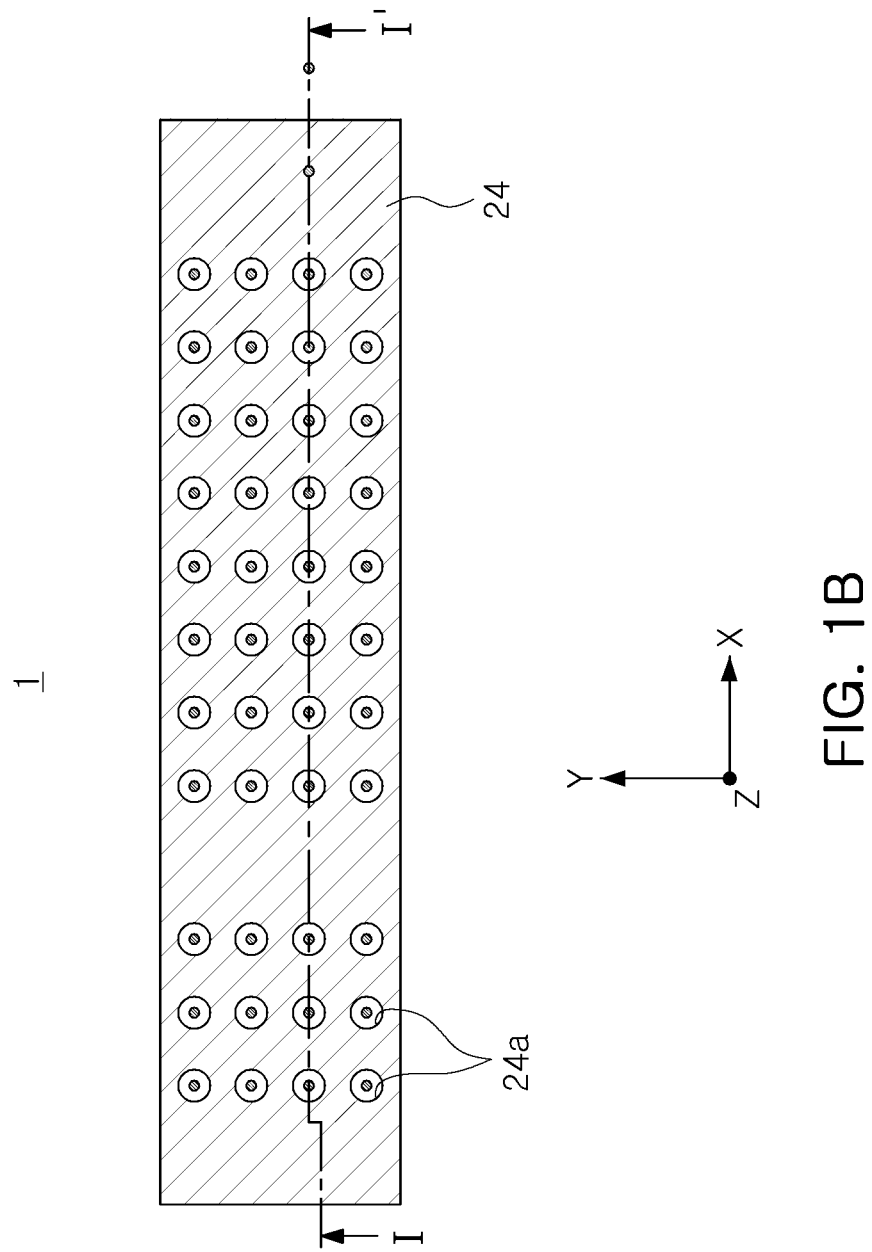

SEMICONDUCTOR DEVICE AND DATA STORAGE SYSTEM INCLUDING THE SAME

CROSS-REFERENCE TO RELATED APPLICATION(S)

This application is a continuation of U.S. patent application Ser. No. 17/475,128, filed on Sep. 14, 2021, which claims benefit of priority under 35 U.S.C. § 119 to Korean Patent Application No. 10-2020-0143002, filed on Oct. 30, 2020, in the Korean Intellectual Property Office, the disclosures of both of which are incorporated herein by reference in their entireties.

BACKGROUND

Example embodiments of the present disclosure relate to a semiconductor device and a data storage system including the same.

A semiconductor device which may store high-capacity data in an electronic system requiring data storage has been required. Accordingly, a method of increasing data storage capacity of a semiconductor device has been studied. For example, as one of methods for increasing data storage capacity of a semiconductor device, a semiconductor device including memory cells arranged three-dimensionally, instead of memory cells arranged two-dimensionally, has been suggested.

SUMMARY

An example embodiment of the present disclosure is to provide a semiconductor device which may improve integration density and reliability.

An example embodiment of the present disclosure is to provide a data storage system including a semiconductor device.

According to an example embodiment of the present disclosure, a semiconductor device includes a pattern structure; a stack structure including a plurality of gate layers stacked and spaced apart from each other in a vertical direction in a first region on the pattern structure and extending into a second region on the pattern structure; a memory vertical structure penetrating the stack structure in the first region; a plurality of gate contact plugs electrically connected to the plurality of gate layers in the second region; and a first peripheral contact plug spaced apart from the plurality of gate layers, wherein the plurality of gate layers include a first gate layer, wherein the plurality of gate contact plugs include a first gate contact plug in contact with and electrically connected to the first gate layer, wherein each of the plurality of gate contact plugs and the first peripheral contact plug includes a conductive gap fill pattern and a conductive liner layer covering a side surface and a bottom surface of the conductive gap fill pattern, wherein a side surface of the first gate contact plug and a side surface of the first peripheral contact plug have different numbers of upper bending portions on a level higher than a level of an uppermost gate layer of the plurality of gate layers, and wherein the number of upper bending portions of a first side of the side surface of the first gate contact plug, disposed in the first direction, is greater than the number of upper bending portions of a first side of the side surface of the first peripheral contact plug, disposed in the first direction, on a level higher than a level of the uppermost gate layer.

According to an example embodiment of the present disclosure, a semiconductor device includes a pattern structure; a stack structure including a plurality of gate layers stacked and spaced apart from each other in a vertical direction in a first region on the pattern structure and extending into a second region on the pattern structure; a memory vertical structure penetrating the stack structure in the first region; a plurality of gate contact plugs electrically connected to the plurality of gate layers in the second region, wherein the stack structure includes a lower stack structure including lower gate layers and an upper stack structure including upper gate layers on the lower stack structure, wherein each of the plurality of gate contact plugs includes a conductive gap fill pattern and a conductive liner layer covering a side surface and a bottom surface of the conductive gap fill pattern, wherein the plurality of gate contact plugs include a first gate contact plug electrically connected to a first upper gate layer of the upper gate layers, and a second gate contact plug electrically connected to a first lower gate layer of the lower gate layers, and wherein a first side of a side surface of each of the first and second gate contact plugs, disposed in a first direction, includes a plurality of upper bending portions disposed on different levels on a level higher than a level of an uppermost gate layer of the plurality of gate layers.

According to an example embodiment of the present disclosure, a data storage system includes a main substrate; a semiconductor device on the main substrate; and a controller electrically connected to the semiconductor device on the main substrate, wherein the semiconductor device includes: a pattern structure, a stack structure including a plurality of gate layers stacked and spaced apart from each other in a vertical direction in a first region on the pattern structure and extending into a second region on the pattern structure; a memory vertical structure penetrating the stack structure in the first region; and a plurality of gate contact plugs electrically connected to the plurality of gate layers in the second region, wherein the stack structure includes a lower stack structure including lower gate layers and an upper stack structure including upper gate layers on the lower stack structure, wherein each of the plurality of gate contact plugs includes a conductive gap fill pattern and a conductive liner layer covering a side surface and a bottom surface of the conductive gap fill pattern, wherein the plurality of gate contact plugs include a first gate contact plug electrically connected to a first upper gate layer of one of the upper gate layers, and a second gate contact plug electrically connected to a first lower gate layer of one of the lower gate layers, and wherein a first side of a side surface of each of the first and second gate contact plugs includes a plurality of upper bending portions on a level higher than the level of the uppermost gate layer of the plurality of gate layers.

BRIEF DESCRIPTION OF DRAWINGS

The above and other aspects, features, and advantages of the present disclosure will be more clearly understood from the following detailed description, taken in combination with the accompanying drawings, in which like numerals refer to like elements throughout. In the drawings:

FIGS. 1A, 1B, 2A, and 2B are plan diagrams illustrating a semiconductor device, according to an example embodiment of the present disclosure;

DETAILED DESCRIPTION

Hereinafter, embodiments of the present disclosure will be described as follows with reference to the accompanying drawings.

Figure 1A:
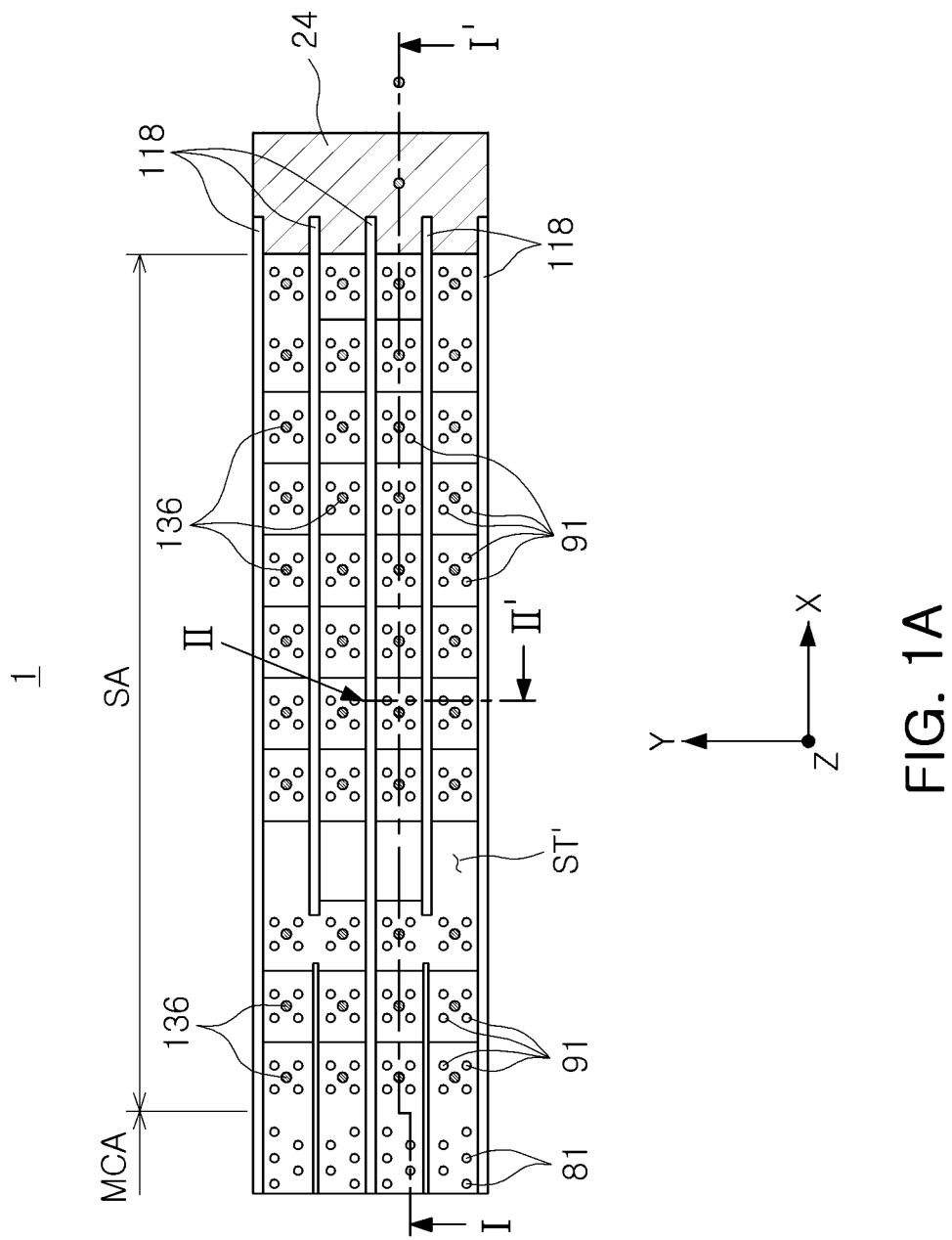
Figure 2A:
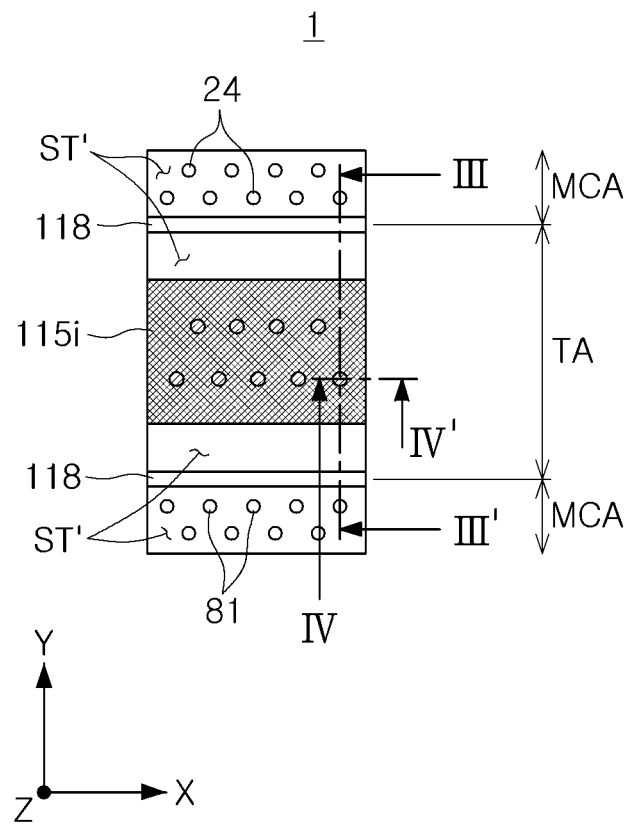
Figure 2B:
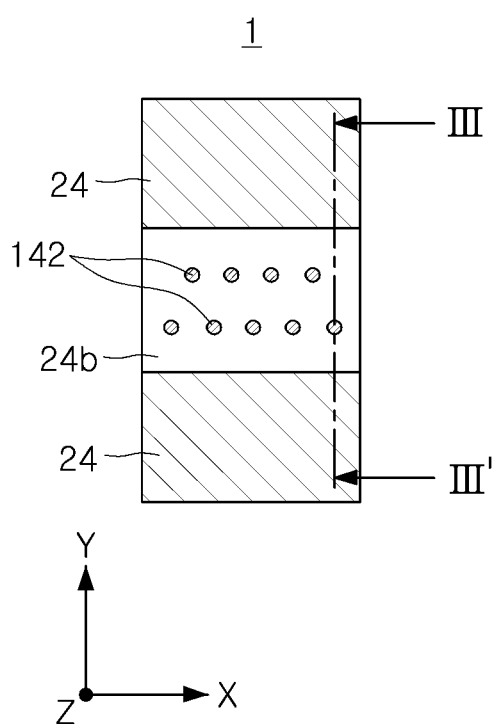
Figure 3A:
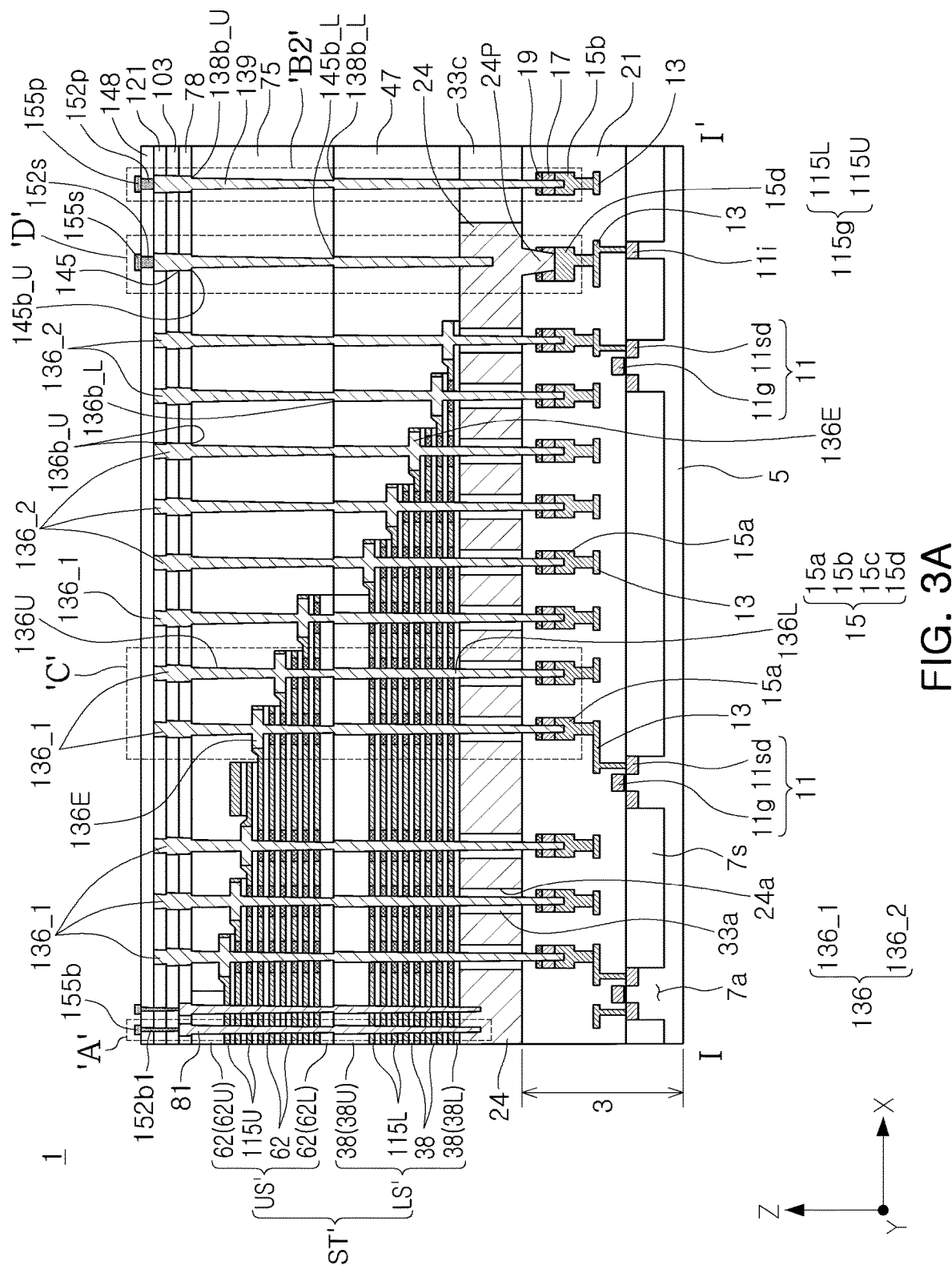
FIGS. 3A, 3B, and 3C are cross-sectional diagrams illustrating a semiconductor device, according to an example embodiment of the present disclosure.
Figure 3B:
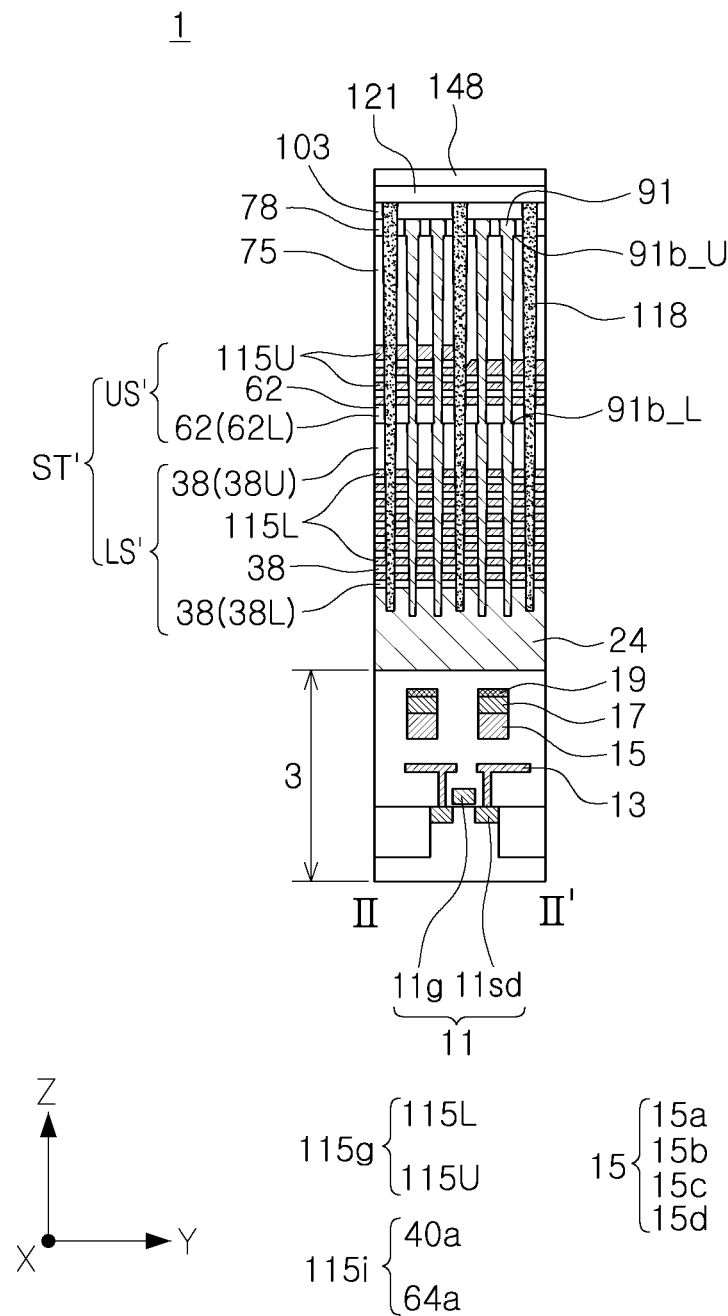
Figure 3C:
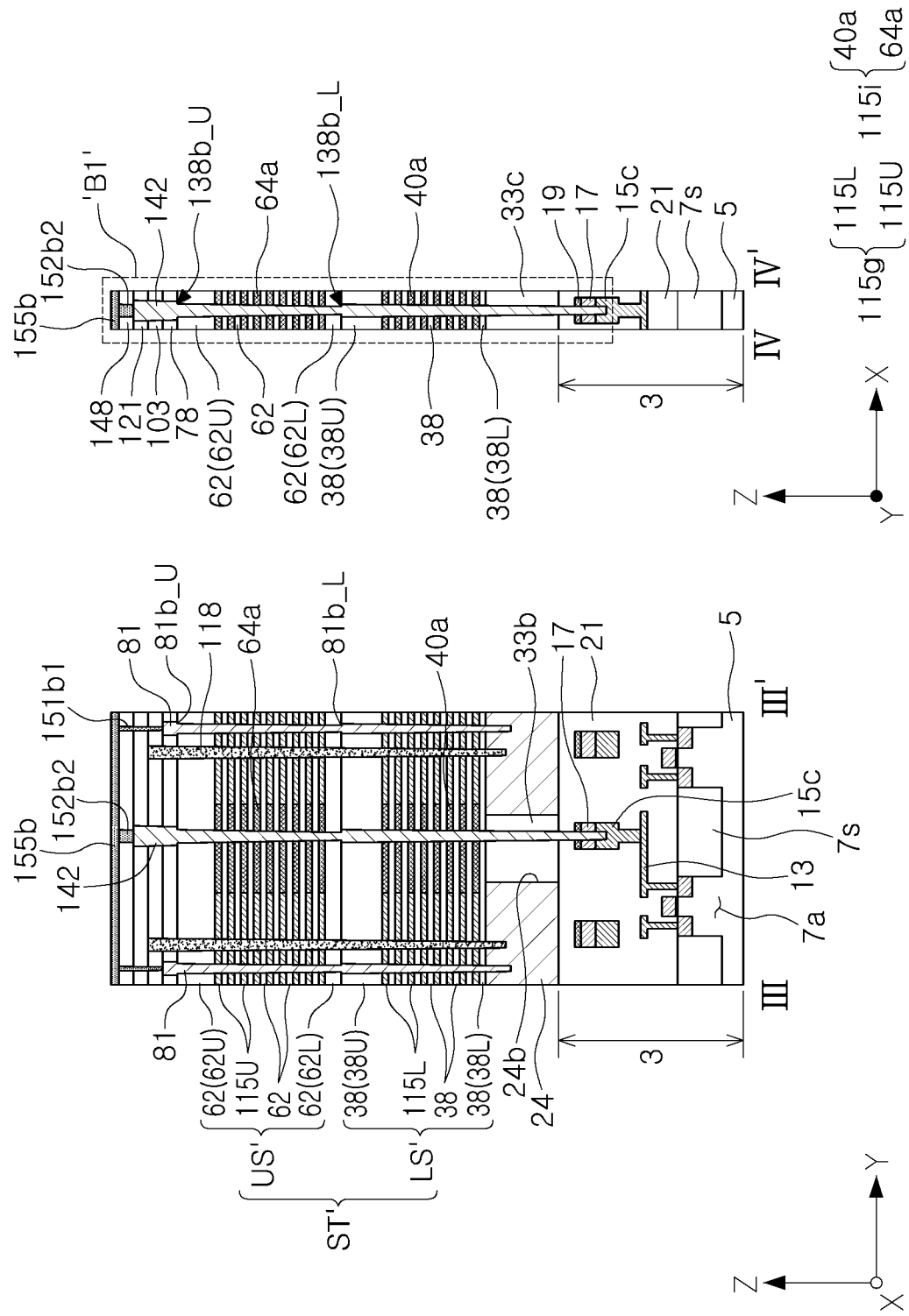

A semiconductor device according to an example embodiment will be described with reference to FIGS. 1A to 3C. In FIGS. 1A to 3C, FIG. 1A is a plan diagram illustrating a semiconductor device according to an example embodiment, FIG. 1B is a plan diagram illustrating a portion of elements in FIG. 1A, FIG. 2A is a plan diagram illustrating a semiconductor device according to an example embodiment, FIG. 3A is a cross-sectional diagram taken long line I-I' in FIG. 1A, FIG. 3B is a cross-sectional diagram taken long line II-II' in FIG. 1A, and FIG. 3C is a cross-sectional diagram taken long line in FIG. 2A.

Referring to FIGS. 1A to 3C, a semiconductor device 1 in the example embodiment may include a pattern structure 24, a stack structure ST' including a plurality of gate layers 115g stacked and spaced apart from each other in a vertical direction Z in a first region MCA on the pattern structure 24 and extending into a second region SA on the pattern structure 24, a memory vertical structure 81 penetrating through the structure ST' in the first region MCA, a plurality of gate contact plugs 136 electrically connected to the plurality of gate layers 115g in the second region SA, and a first peripheral contact plug 139 spaced apart from the plurality of gate layers 115g.

The stack structure ST' may further include insulating horizontal layers 115i disposed in a third region TA and disposed at substantially the same level as a level of the gate layers 115g. The insulating horizontal layers 115i may include lower and upper insulating horizontal layers 40a and 64a. As used herein, terms such as "same," "equal," "planar," or "coplanar," when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

In an example, the first region MCA may be referred to as a memory cell region or a memory cell array region in which memory cells may be formed, and the second region SA may be referred to as a staircase region in which the gate layers 115g are formed in a staircase shape or a contact region in which gate contact plugs electrically connected to the gate layers 115g are formed. The second region SA may be adjacent to the first region MCA in the first direction X. The third region TA may be adjacent to the first region MCA in the second direction Y. The second direction Y may be perpendicular to the first direction X. The third region TA may be referred to as a through region or a through insulating region.

The semiconductor device 1 may further include a lower structure 3.

The lower structure 3 may include a semiconductor substrate 5, an isolation region 7s defining a peripheral active region 7a on the semiconductor substrate 5, peripheral circuits 11 and 13 formed on the semiconductor substrate 5, peripheral pads 15 electrically connected to the peripheral circuits 11 and 13, and a lower insulating layer 21 covering the peripheral pads 15. The peripheral circuits 11 and 13 may include a circuit device 11 such as a transistor including a peripheral gate 11g and a peripheral source/drain 11sd, and a circuit wiring 13 electrically connected to the circuit device 11. The peripheral pads 15 may be electrically connected to the circuit wiring 13.

The peripheral pads 15 may include first to fourth peripheral pads 15a, 15b, 15c, and 15d. In an example, each of the peripheral pads 15 may include a conductive material, such as a metal material such as tungsten, for example. The lower structure 3 may further include a capping layer 17 formed on each of the peripheral pads 15 and an etch stop layer 19 formed on the capping layer 17. In an example, the capping layer 17 may be formed of a silicon layer, and the etch stop layer 19 may be formed of an insulating material, such as silicon oxide or silicon nitride, for example.

The pattern structure 24 may be disposed on the lower structure 3 and may include first openings 24a and second openings 24b. At least a portion of the pattern structure 24 may be formed of doped silicon, such as polysilicon having N-type conductivity, for example. In the pattern structure 24, a region formed of polysilicon having N-type conductivity may be a common source region.

In an example, the pattern structure 24 may be formed as a single layer, a silicon layer, for example.

In another example, the pattern structure 24 may include a plurality of pattern layers stacked. For example, the pattern structure 24 may include a lower pattern layer, an intermediate pattern layer on the lower pattern layer, and an upper pattern layer on the intermediate pattern layer. At least one of the lower pattern layer, the intermediate pattern layer and the upper pattern layer may be a silicon layer. For example, the lower pattern layer and the upper pattern layer may be a silicon layer, and at least a portion of the intermediate pattern layer may include a silicon layer.

In another example, the pattern structure 24 may include a metal layer and a silicon layer on the metal layer.

In an example, the pattern structure 24 may include a pattern via 24p extending downwardly from a lower surface of the pattern structure 24 and electrically connected to the fourth peripheral pad 15d. The pattern via 24p may be formed of a conductive material layer. For example, the pattern via 24p may be formed of a silicon layer. Side surfaces of the pattern via 24p may be sloped. For example, a width of the pattern via 24p may decrease as the pattern via 24p extends in the downward direction.

The pattern via 24p may be electrically connected to an impurity region 11i of the semiconductor substrate 5 through a circuit wiring 13 electrically connected to the fourth peripheral pad 15d. In an example, the impurity region 11i of the semiconductor substrate 5 may be a ground region. In another example, the impurity region 11i of the semiconductor substrate 5 may be a source/drain of a device included in the peripheral circuits 11 and 13.

The semiconductor device 1 may further include first intermediate insulating layers 33a filling the first openings 24a, a second intermediate insulating layer 33b filling the second openings 24b, and an external intermediate insulating layer 33c formed on an external side of the pattern structure 24.

The stack structure ST' may include a lower stack structure LS' and an upper stack structure US' on the lower stack structure LS'. The lower stack structure LS' may include lower gate layers 115L of the gate layers 115g, and the upper stack structure US' may include upper gate layers 115U of the gate layers 115g.

The lower stack structure LS' may further include lower interlayer insulating layers 38 alternately and repeatedly disposed with the lower gate layers 115L. In the lower stack structure LS', a lowermost layer may be a lowermost lower interlayer insulating layer 38L, and an uppermost layer may be an uppermost lower interlayer insulating layer 38U. The upper stack structure US' may further include upper interlayer insulating layers 62 alternately disposed and repeatedly with the upper gate layers 115U. In the upper stack structure US', a lowermost layer may be a lowermost upper interlayer insulating layer 62L, and an uppermost layer may be an uppermost upper interlayer insulating layer 62U.

The semiconductor device 1 may further include a first capping insulating layer 47, a second capping insulating layer 75, a third capping insulating layer 78, a fourth capping insulating layer 103, and a fifth capping insulating layer 121. The first capping insulating layer 47 may cover a portion of the pattern structure 24 not overlapping the stack structure ST', and a staircase region of the lower stack structure LS' covering the external intermediate insulating layer 33c and not overlapping the upper stack structure US'. The first capping insulating layer 47 may have an upper surface coplanar with an upper surface of the lower stack structure LS'. The second capping insulating layer 75 may cover the first capping insulating layer 47, may have an upper surface coplanar with an upper surface of the upper stack structure US', and may cover a staircase region of the upper stack structure US'. A lower surface of the second capping insulating layer 75 may contact the upper surface of the first capping insulating layer 47. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

In the staircase region of the lower stack structure LS', the lower gate layers 115L may be arranged in a staircase shape, and in the staircase region of the upper stack structure US', the upper gate layers 115U may be arranged in a staircase shape.

In example embodiments, the staircase shape is not limited to the shape illustrated in the drawings, and may be varied.

The third to fifth capping insulating layers 78, 103 and 124 may be stacked in order on the stack structure ST' and the second capping insulating layer 75. For example, the third capping insulating layer may be on and contacting the second capping insulating layer 75, the fourth capping insulating layer 103 may be on and contacting the third capping insulating layer 78, and the fifth capping insulating layer 124 may be on and contacting the fourth capping insulating layer 103.

In an example, the first to fifth capping insulating layers 47, 75, 78, and 103, and 124 may be formed of silicon oxide.

In an example, the memory vertical structure 81 may penetrate the third capping insulating layer 78 and the stack structure ST', may extend into the pattern structure 24, and may be in contact with the pattern structure 24.

In example embodiments, the "bending portion" may be defined as an inconsistent portion between a lower side surface disposed below the bending portion and having a predetermined inclination and an upper side surface disposed above the bending portion and having a predetermined inclination, with reference to the bending portion. For example, the bending portion of the side surface may be a portion extending from a lower end of the lower side surface and an upper end of the upper side surface when the lower end of the lower side surface and the upper end of the upper side surface are not aligned in the vertical direction. Alternatively, the bending portion of the side surface may be a portion extending from the lower side surface and the upper side surface of different inclinations when the inclination of the lower side surface and the inclination of the upper side surface are different. The "bending portion" may be referred to as an inflection portion.

A side surface of the memory vertical structure 81 may include at least two bending portions 81b_L and 81b_U. For example, a first side of a side surface of the memory vertical structure 81, disposed in one direction, may include a lower bending portion 81b_L and an upper bending portion 81b_U. The upper bending portion 81b_U may be disposed on a level higher than a level of the lower bending portion 81b_L. For example, on the side surface of the memory vertical structure 81, the lower bending portion 81b_L may be disposed between a lowermost upper gate layer of the upper gate layers 115U and an uppermost lower gate layer of the lower gate layers 115L, and the upper bending portion 81b_U may be disposed on a level higher than a level of the uppermost upper gate layer of the upper gate layers 115U.

The plurality of gate contact plugs 136 may penetrate the fifth capping insulating layer 121, the fourth capping insulating layer 103, and the third capping insulating layer 78, may extend downwardly, and may be in contact with the first peripheral pads 15a. Accordingly, the plurality of gate contact plugs 136 may be electrically connected to the peripheral circuits 11 and 13 through the first peripheral pads 15a. The plurality of gate contact plugs 136 may penetrate the stack structure ST' in the second region SA.

The plurality of gate contact plugs 136 may include first gate contact plugs 136_1 and second gate contact plugs 136_2. The first gate contact plugs 136_1 may be electrically connected to the upper gate layers 115U, and the second gate contact plugs 136_2 may be electrically connected to the lower gate layers 115L.

A side surface of each of the plurality of gate contact plugs 136 may include a lower bending portion 136b_L, and a plurality of upper bending portions 136b_U disposed on a level higher than a level of the lower bending portion 136b_L. For example, on a first side of side surfaces of each of the plurality of gate contact plugs 136, disposed in one direction, the lower bending portion 136b_L may be disposed between a lowermost upper gate layer of the upper gate layers 115U and an uppermost lower gate layer of the lower gate layers 115L, and the plurality of upper bending portions 136b_U may be disposed on a level higher than a level of the uppermost upper gate layer of the upper gate layers 115U.

In an example, on a first side of a side surface of one of the gate contact plugs 136, disposed in one direction, the number of the plurality of upper bending portions 136b_U may be two.

In the description below, one first gate contact plug 136_1 and one upper gate layer 115U electrically connected to each other, and one second gate contact plug 136_2 and one lower gate layer 115L electrically connected to each other will be described for ease of description.

Each of the first and second gate contact plugs 136_1 and 136_2 may include a lower plug portion 136L and an upper plug portion 136U on the lower plug portion 136L.

The first gate contact plug 136_1 may further include a gate contact portion 136E extending from the upper plug portion 136U in a horizontal direction and in contact with a conductive material portion of the upper gate layer 115U. The second gate contact plug 136_2 may further include a gate contact portion 136E extending from the lower plug portion 136L in a horizontal direction and in contact with a conductive material portion of the lower gate layer 115L.

The upper gate layer 115U may have a first thickness in the first region MCA, and a portion of the upper gate layer 115U in contact with the gate contact portion 136E of the first gate contact plug 136_1 may have a second thickness greater than the first thickness. The lower gate layer 115L may have a first thickness in the first region MCA, and a portion of the lower gate layer 115L in contact with the gate contact portion 136E of the second gate contact plug 136_2 may have the second thickness. Thickness may refer to the thickness or height measured in the vertical direction Z.

In an example, the gate contact portion 136E may have the second thickness.

In another example, the gate contact portion 136E may have a third thickness greater than the second thickness.

The semiconductor device 1 may further include a second peripheral contact plug 142 (in FIG. 3C). The second peripheral contact plug 142 may penetrate the fifth capping insulating layer 121, the fourth capping insulating layer 103, and the third capping insulating layer 78, may extend downwardly, may penetrate the insulating horizontal layers 115i and the second intermediate insulating layer 33b in order, and may be in contact with the third peripheral pad 15c. The first peripheral contact plug 139 may penetrate the fifth capping insulating layer 121, the fourth capping insulating layer 103, the third capping insulating layer 78, the second capping insulating layer 75, the first capping insulating layer 47, the external intermediate insulating layer 33c, and the lower insulating layer 21, may extend downwardly, and may be in contact with the second peripheral pad 15b. The first peripheral contact plug 139 may penetrate the external intermediate insulating layer 33c and may be spaced apart from the pattern structure 24 and the gate layers 115g.

In an example, the first peripheral contact plug 139 and the second peripheral contact plug 142 may have substantially the same cross-sectional structure. For example, a side surface of each of the first and second peripheral contact plugs 139 and 142 may include at least two bending portions 138b_L and 138b_U. For example, the first side of the side surface of each of the first and second peripheral contact plugs 139 and 142, disposed in either direction, may include a lower bending portion 138b_L and an upper bending portion 138b_U. The upper bending portion 138b_U may be disposed on a level higher than a level of the lower bending portion 138b_L.

The semiconductor device 1 may further include a source contact plug 145 (in FIG. 3A). The source contact plug 145 may penetrate the fifth capping insulating layer 121, the fourth capping insulating layer 103, the third capping insulating layer 78, the second capping insulating layer 75, and the first capping insulating layer 47, may extend downwardly, may be spaced apart from the gate layers 115g, and may be in contact with the pattern structure 24.

A side surface of the source contact plug 145 may include at least two bending portions 145b_L and 145b_U. For example, a first side of the side surface of the source contact plug 145, disposed in one direction, may include a lower bending portion 145b_L and an upper bending portion 145b_U. The upper bending portion 145b_U may be disposed on a level higher than a level of the lower bending portion 145b_L.

The semiconductor device 1 may further include a support vertical structure 91 (in FIG. 3B) penetrating the stack structure ST' in the second region SA. A side surface of the support vertical structure 91 may include at least two bending portions 91b_L and 91b_U. For example, a first side of a side surface of the support vertical structure 91, disposed in one direction, may include a lower bending portion 91b_L and an upper bending portion 91b_U.

In an example, lower bending portions 81b_L, 136b_L, 138b_L, 145b_L, and 91b_L of the side surfaces of the memory vertical structure 81, the gate contact plugs 136, the first peripheral contact plug 139, the second peripheral contact plug 142, the source contact plug 145, and the support vertical structure 91 may be disposed at substantially the same level.

In an example, each of the side surfaces of the memory vertical structure 81, the gate contact plugs 136, the first peripheral contact plug 139, the second peripheral contact plug 142, the source contact plug 145, and the support vertical structure 91 may include at least one lower bending portion 81b_L, 136b_L, 138b_L, 145b_L, and 91b_L at a level between the lower gate layer 115L and the upper gate layer 115U of the plurality of gate layers 115g, adjacent to each other in the vertical direction Z.

In an example, the gate contact plugs 136, the first peripheral contact plug 139, the second peripheral contact plug 142, and the source contact plug 145 may have upper surfaces disposed at substantially the same level.

In an example, upper surfaces of the memory vertical structure 81 and the support vertical structure 91 may be disposed on a level lower than a level of upper surfaces of the gate contact plugs 136, the first peripheral contact plug 139, the second peripheral contact plug 142, and the source contact plug 145.

In an example, side surfaces of the memory vertical structure 81, the first peripheral contact plug 139, the second peripheral contact plug 142, the source contact plug 145, and the support vertical structure 91, disposed in one direction, may include the same number of upper bending portions on a level higher than a level of an uppermost gate layer of the gate layers 115.

In an example, the upper bending portions 81b_U, 138b_U, 145b_U, and 91b_U of the side surfaces of the memory vertical structure 81, the first peripheral contact plug 139, the second peripheral contact plug 142, the source contact plug 145, and the support vertical structure 91, disposed in one direction, may be disposed at substantially the same level on a level higher than the level of the uppermost gate layer of the gate layers 115.

In an example, on a level higher than the level of the uppermost gate layer of the gate layers 115, a first side of side surfaces of one of the gate contact plugs 136, the first gate contact plug 136_1, for example, may include "n" number of upper bending portions, and a first side of the side surface of each of the memory vertical structure 81, the first peripheral contact plug 139, the second peripheral contact plug 142, the source contact plug 145, and the support vertical structure 91, disposed in the first direction, may include "m" number of upper bending portions, where "n" and "m" are natural numbers, and "n" may be greater than In an example, "n" may be 2, and "m" may be 1.

The semiconductor device 1 may further include separation structures 118. The separation structures 118 may penetrate the stack structure ST' on the pattern structure 24. In an example, the separation structures 118 may be formed of an insulating material, silicon oxide, for example. In another example, each of the separation structures 118 may include a conductive pattern and an insulating spacer covering a side surface of a the conductive pattern.

Upper surfaces of the separation structures 118 may be disposed on a level higher than a level of the upper surface of the memory vertical structure 81, and may be disposed on a level lower than a level of upper surfaces of the gate contact plugs 136, the first peripheral contact plugs 139, the second peripheral contact plug 142, and the source contact plug 145. For example, upper surfaces of the separation structures 118 may be coplanar with an upper surface of the fourth capping insulating layer 103, upper surfaces of the gate contact plugs 136, the first peripheral contact plugs 139, the second peripheral contact plug 142, and the source contact plug 145 may be coplanar with an upper surface of the fifth capping insulating layer 121, and upper surfaces of the memory vertical structure 81 and the support vertical structure 91 may be coplanar with an upper surface of the third capping insulating layer 78.

The semiconductor device 1 may further include an upper insulating layer 148 on the fifth capping insulating layer 121.

The semiconductor device 1 may further include a first bit line connection plug 152b1 penetrating the upper insulating layer 148, extending downwardly, and electrically connected to the memory vertical structure 81, a second bit line connection plug 152b2 penetrating the upper insulating layer 148 and electrically connected to the second peripheral contact plug 142, a peripheral connection plug 152p penetrating the upper insulating layer 148 and electrically connected to the first peripheral contact plug 139, and a source connection plug 152s penetrating the upper insulating layer 148 and electrically connected to the source contact plug 145. Upper surfaces of the first bit line connection plug 152b1, the second bit line connection plug 152b2, the peripheral connection plug 152p, and the source connection plug 152s may be coplanar with an upper surface of the upper insulating layer 148.

In an example, entire upper surfaces of the gate contact plugs 136 may be covered by the upper insulating layer 148. For example, the upper insulating layer 148 may be in contact with the upper surfaces of the gate contact plugs 136.

The semiconductor device 1 may further include a bit line 155b electrically connected to the first bit line connection plug 152b1 and the second bit line connection plug 152b2 on the upper insulating layer 148, a peripheral wiring 155p electrically connected to the peripheral connection plug 152p, and a source wiring 155s electrically connected to the source connection plug 152s.

Figure 4:
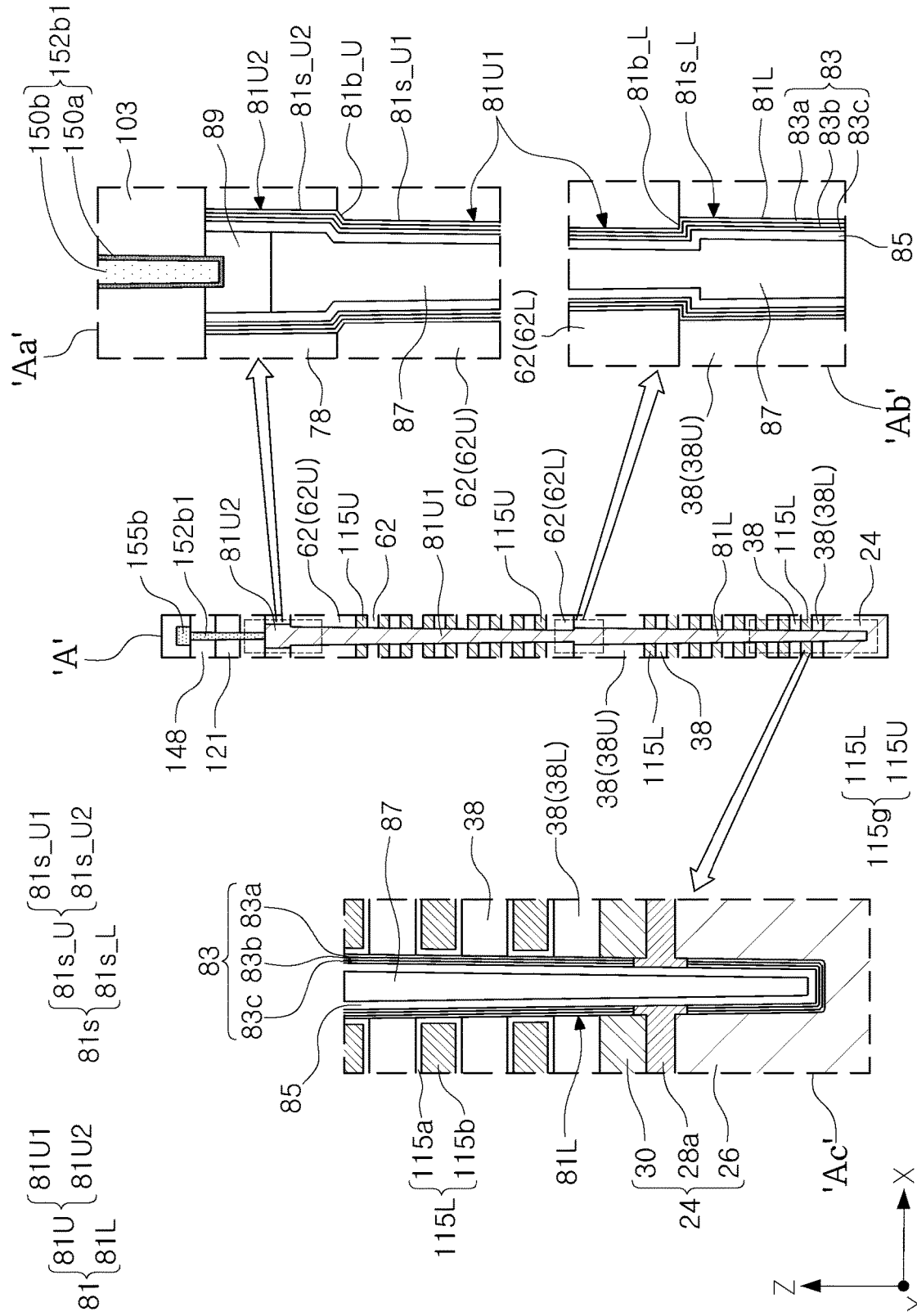
FIG. 4 is an enlarged cross-sectional diagram illustrating a portion of a semiconductor device, according to an example embodiment of the present disclosure.

Examples of the stack structure ST', the pattern structure 24, the memory vertical structure 81, and the first bit line connection plug 152b1 will be described with reference to FIG. 4. FIG. 4 is an enlarged cross-sectional diagram illustrating portion "A" in FIG. 3A.

In an example, referring to FIG. 4, in the stack structure ST', each of the gate layers 115g may include a first layer 115a and a second layer 115b. The first layer 115a may cover upper and lower surfaces of the second layer 115b and may extend to a region between the memory vertical structure 81 and the second layer 115b.

In an example, the first layer 115a may include a dielectric material, and the second layer 115b may include a conductive material. For example, the first layer 115a may include a high-k dielectric such as AlO, and the second layer 115b may include a conductive material such as TiN, WN, Ti, or W.

In another example, the first layer 115a may include a first conductive material (e.g., TiN or W, etc.), and the second layer 115b may include a second conductive material (e.g., Ti or W) different from the first conductive material.

In another example, each of the first and second layers 115a and 115b may be formed of a doped polysilicon, a metal-semiconductor compound (e.g., TiSi, TaSi, CoSi, NiSi or WSi), a metal nitride (e.g., TiN, TaN or WN) or a metal (e.g., Ti or W).

In an example, among the gate layers 115g, at least a portion of the intermediate gate layers disposed between the lower gate layer and the upper gate layer may be word lines.

The memory vertical structure 81 may include a gap-fill insulating layer 87, a channel material layer 85 covering an external surface and a bottom surface of the gap-fill insulating layer 87, a data storage structure 83 covering an external surface and a bottom surface of the channel material layer 85, and a pad material layer 89 on the gap-fill insulating layer 87. The pad material layer 89 may contact an upper surface of the gap-fill insulating layer 87.

The data storage structure 83 may include a first dielectric layer 83c covering an external surface and a bottom surface of the channel material layer 85, a data storage material layer 83b covering an external surface and a bottom surface of the first dielectric layer 83c, and a second dielectric layer 83a covering an external surface and a bottom surface of the data storage material layer 83b. The second dielectric layer 83a may be in contact with the channel material layer 85, and the data storage material layer 83b may be spaced apart from the channel material layer 85.

The gap-fill insulating layer 87 may include silicon oxide, such as ALD (Atomic Layer Deposition) silicon oxide which may be formed by an atomic layer deposition process, or silicon oxide having voids formed therein, for example.

The first dielectric layer 83c may include silicon oxide or silicon oxide doped with impurities. The second dielectric layer 83a may include at least one of silicon oxide and a high-k dielectric. The data storage material layer 83b may include a material able to trap charges, silicon nitride, for example.

The data storage material layer 83b of the data storage structure 83 of the memory vertical structure 81 may include regions which may store data in a semiconductor device such as a flash memory device. The channel material layer 85 may include polysilicon. The pad material layer 89 may include at least one of a doped polysilicon, a metal nitride (e.g., TiN, etc.), a metal (e.g., W, etc.), and a metal-semiconductor compound (e.g., TiSi, etc.).

The memory vertical structure 81 may include a lower vertical portion 81L, a first upper vertical portion 81U1 on the lower vertical portion 81L, and a second upper vertical portion 81U2 on the first upper vertical portion 81U1.

In the memory vertical structure 81, the lower vertical portion 81L may penetrate the lower stack structure LS', may extend into the pattern structure 24, and may be in contact with the pattern structure 24. The first upper vertical portion 81U1 may penetrate the upper stack structure US', and the second upper vertical portion 81U2 may penetrate the third capping insulating layer 78.

In an example, a width of the upper region of the lower vertical portion 81L may be different from a width of the lower region of the first upper vertical portion 81U1. For example, a width of the upper region of the lower vertical portion 81L may be greater than a width of the lower region of the first upper vertical portion 81U1. In some embodiments, each of the lower vertical portion 81L and the first upper vertical portion 81U1 may have a tapered shape that narrows in a downward direction.

In an example, a width of the upper region of the first upper vertical portion 81U1 may be different from a width of the lower region of the second upper vertical portion 81U2. For example, the width of the upper region of the first upper vertical portion 81U1 may be less than the width of the lower region of the second upper vertical portion 81U2.

In an example, on a first side of a side surface of the memory vertical structure 81, disposed in one direction, an upper end of a lower side surface 81s_L of the lower vertical portion 81L may not be aligned with a lower end of the first upper side surface 81s_U1 of the first upper vertical portion 81U1 in the vertical direction Z, and an upper end of the first upper side surface 81s_U1 of the first upper vertical portion 81U1 may not be aligned with the lower end of the second upper side 81s_U2 of the upper vertical portion 81U2 in the vertical direction Z. Accordingly, the first side of the side surface of the memory vertical structure 81, disposed in one direction, may include the lower bending portion 81b_L extending from the upper end of the lower side surface 81s_L of the lower vertical portion 81L and the lower end of the first upper side surface 81s_U1 of the first upper vertical portion 81U1, which may not be aligned with each other, and the upper bending portion 81b_U extending from the upper end of the first upper side surface 81s_U1 of the first upper vertical portion 81U1 and the lower end of the second upper side surface 81s_U2 of the second upper vertical portion 81U2, which may not be aligned with each other. In some embodiments, the lower bending portion 81b_L may have a surface that extends in a direction different from directions in which the upper end of the lower side surface 81s_L of the lower vertical portion 81L and the lower end of the first upper side surface 81s_U1 of the first upper vertical portion 81U1 extend. For example, the lower bending portion 81b_L may have a surface that is coplanar with an upper surface of uppermost lower interlayer insulating layer 38U. In some embodiments, the upper bending portion 81b_U may extend in a direction different from the directions in which the upper end of the first upper side surface 81s_U1 of the first upper vertical portion 81U1 and the lower end of the second upper side surface 81s_U2 of the second upper vertical portion 81U2 extend.

The first bit line connection plug 152b1 may be in contact with and electrically connected to the pad material layer 89 of the memory vertical structure 81. In an example, the first bit line connection plug 152b1 may include a gap-fill conductive layer 150b and a conductive liner layer 150a covering a side surface and a bottom surface of the gap-fill conductive layer 150b.

The pattern structure 24 may include a lower pattern layer 26, a first intermediate pattern layer 28a on and contacting the lower pattern layer 26, and an upper pattern layer 30 on and contacting the first intermediate pattern layer 28a. The lower pattern layer 26, the first intermediate pattern layer 28a, and the upper pattern layer 30 may include polysilicon. The first intermediate pattern layer 28a may penetrate the data storage structure 83 of the memory vertical structure 81 and may be in contact with the channel material layer 85. In some embodiments, a portion of the first intermediate pattern layer 28a in contact with the channel material layer 85 may have a thickness in the vertical direction Z greater than a thickness of a portion of the first intermediate pattern layer 28 provided between the lower pattern layer 26 and the upper pattern layer 30.

Figure 5A:
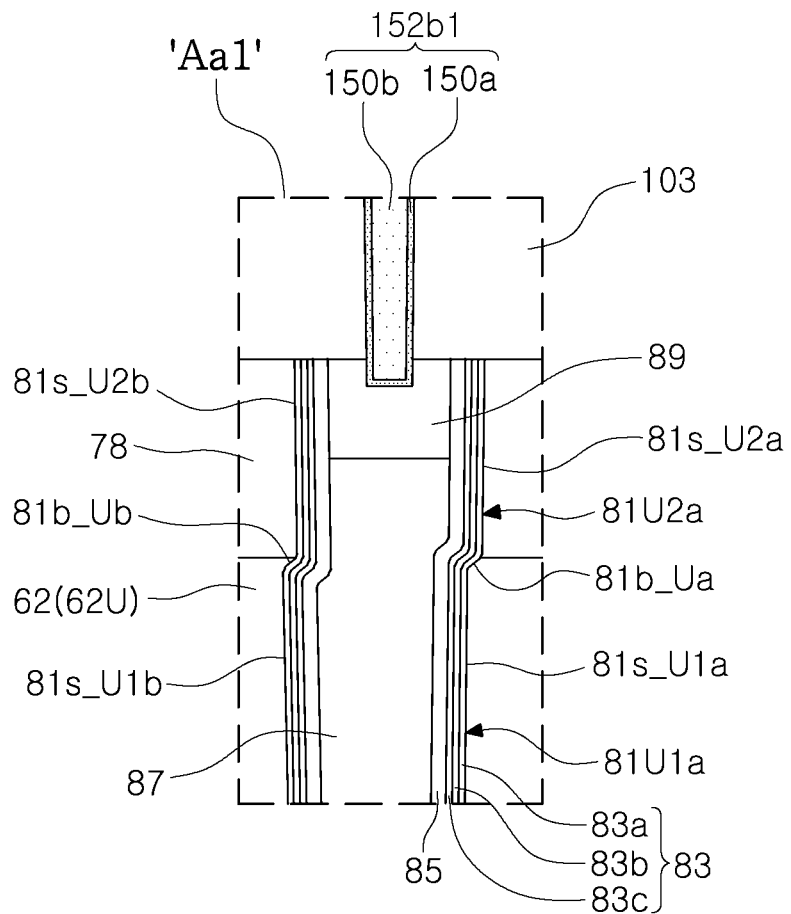
FIGS. 5A to 5C are enlarged cross-sectional diagrams illustrating a modified example of a portion of a semiconductor device, according to an example embodiment of the present disclosure.

In the description below, a modified example of the memory vertical structure 81 described in FIG. 4 will be described with reference to FIG. 5A. FIG. 5A is an enlarged diagram illustrating a region Aa1 corresponding to region denoted by "Aa" in FIG. 4 to illustrate a modified example of the first upper vertical portion 81U1 and the second upper vertical portion 81U2 of the memory vertical structure 81 described in FIG. 4.

In the modified example, referring to FIG. 5A, in the memory vertical structure 81, a vertical central axis of the first upper vertical portion 81U1a and a vertical central axis of the second upper vertical portion 81U2 may not be aligned. The vertical central axis of the first upper vertical portion 81U1a may be taken in a vertical direction Z, which may penetrate a center between both side surfaces 81s_U1a and 81s_U1b of the first upper vertical portion 81U1a, and the vertical central axis of the second upper vertical portion 81U1b may be taken in a vertical direction Z, which may penetrate a center between both side surfaces 81s_U2a and 81s_U2b of the second upper vertical portion 81U2a.

The both side surfaces 81s_U1a and 81s_U1b of the first upper vertical portion 81U1a and the both side surfaces 81s_U2a and 81s_U2b of the second upper vertical portion 81U2a may not be aligned in the vertical direction Z, and bending portions 81b_Ua and 81b_Ub connecting the both side surfaces 81s_U1a and 81s_U1b of the first upper vertical portion 81U1a to the both side surfaces 81s_U2a and 81s_U2b of the second upper vertical portion 81U2a may be formed.

In the memory vertical structure 81, the bending portion 81b_Ua disposed in the +X direction may not overlap the first upper vertical portion 81U1a and may overlap the second upper vertical portion 81U1b. The bending portion 81b Ub disposed in the X direction may overlap the first upper vertical portion 81U1a and may not overlap the second upper vertical portion 81U1b.

Figure 5B:
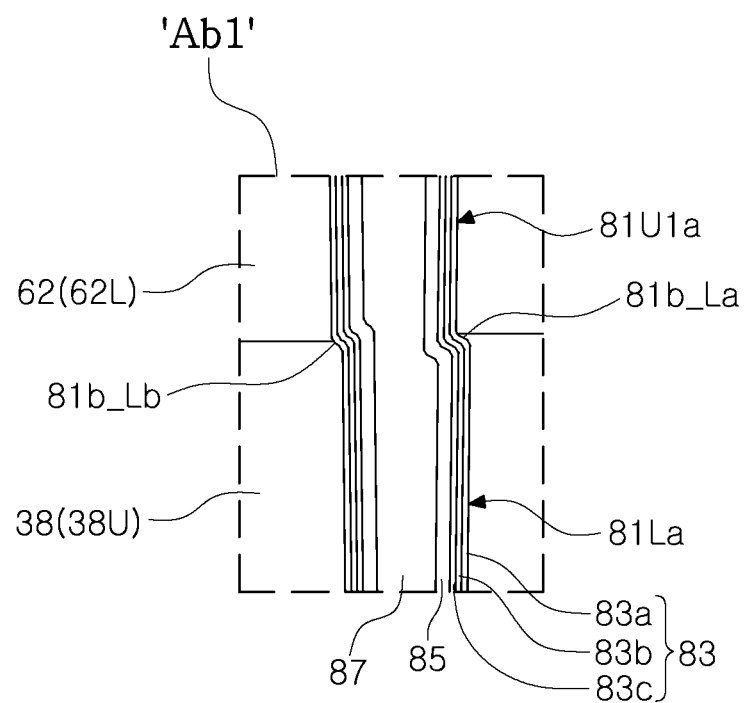

In the description below, a modified example of the memory vertical structure 81 in FIG. 4 will be described with reference to FIG. 5B. FIG. 5B is an enlarged diagram illustrating a region Ab1 corresponding to region denoted by "Ab" in FIG. 4 to illustrate a modified example of the lower vertical portion 81L and the first upper vertical portion 81U1 of the memory vertical structure 81 described in FIG. 4.

In a modified example, referring to FIG. 5B, in the memory vertical structure 81, a vertical central axis of the first upper vertical portion 81U1a and a vertical central axis of the lower vertical portion 81La may not be aligned. The vertical central axis of the first upper vertical portion 81U1a may be taken in a vertical direction Z, which may cross a center between both side surfaces of the first upper vertical portion 81U1a, and the vertical central axis of the lower vertical portion 81La may be taken in the vertical direction Z, which may cross a center between the both side surfaces of the lower vertical portion 81La.

The both side surfaces of the first upper vertical portion 81U1a and the both side surfaces of the lower vertical portion 81La may not be aligned in the vertical direction Z, and bending portions 81b_La and 81b_Lb connecting the both side surfaces of the first upper vertical portion 81U1a and the both side surfaces of the lower vertical portion 81La may be formed.

Figure 5C:
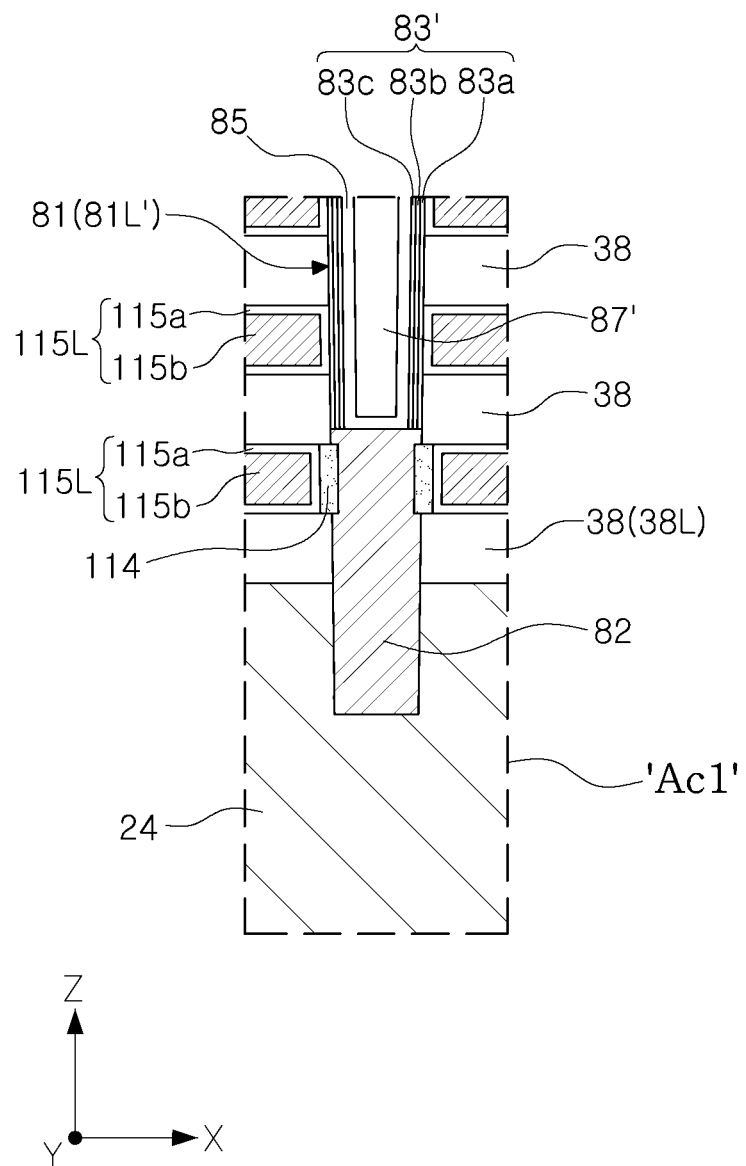

In the description below, a modified example of the memory vertical structure 81 and the pattern structure 24 in FIG. 4 will be described with reference to FIG. 5C. FIG. 5C is an enlarged diagram illustrating a region Ac1 corresponding to region denoted by "Ac" in FIG. 4 to illustrate a modified example of the lower vertical portion 81L of the memory vertical structure 81 in FIG. 4 and a modified example of the pattern structure 24 in FIG. 4.

In a modified example, referring to FIG. 5C, a lower vertical portion 81L' of the memory vertical structure 81 may include an epitaxial channel layer 82 including a portion disposed in the pattern structure 24, disposed on a level higher than a level of an upper surface of at least lowermost lower gate layer of the lower gate layers 115L, and having an upper surface disposed on a level lower than a level of a lower surface of the second lowermost lower gate layer, a gap-fill insulating layer 87' disposed on the epitaxial channel layer 82, a channel material layer 85' interposed between the gap-fill insulating layer 87' and the epitaxial channel layer 82 and covering a side surface of the gap-fill insulating layer 87', and a data storage structure 83' covering an external side surface of the channel material layer 85'. The data storage structure 83' may include a first dielectric layer 83c, a second dielectric layer 83a, and a data storage material layer 83b between the first and second dielectric layers 83c and 83a.

The lower vertical portion 81L' of the memory vertical structure 81 may include a dielectric layer 114 between at least a lowermost lower gate layer of the lower gate layers 115L and the epitaxial channel layer 82. The dielectric layer 114 may contact the epitaxial channel layer 82.

Figure 6:
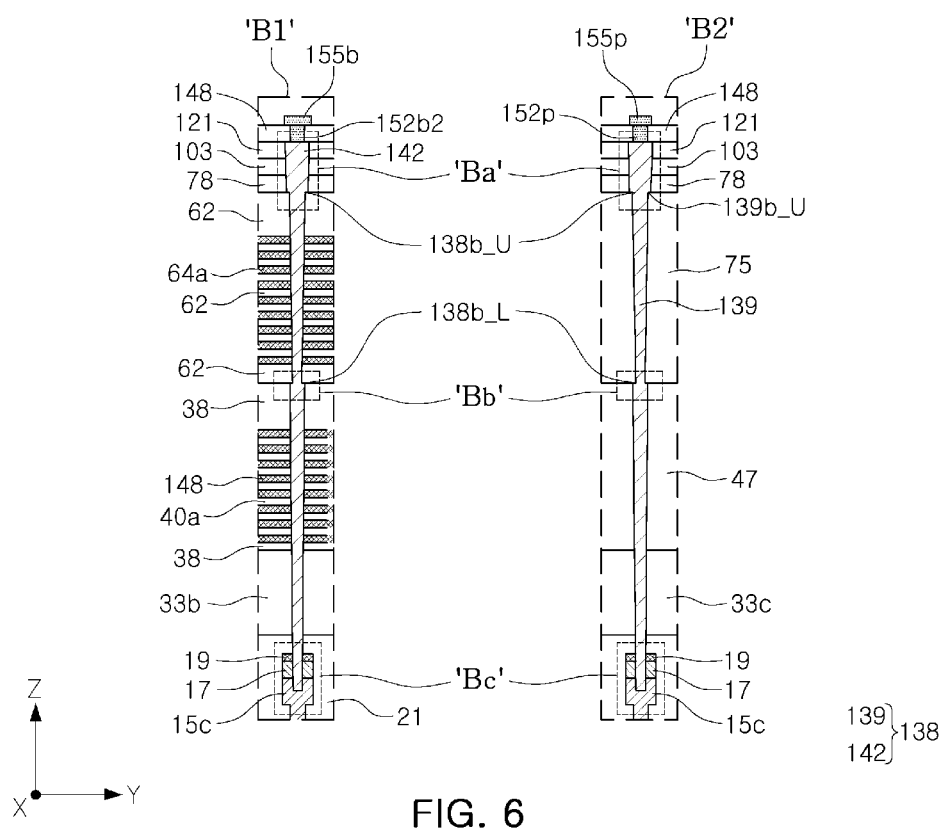
FIG. 6 is an enlarged cross-sectional diagram illustrating a portion of a semiconductor device, according to an example embodiment of the present disclosure.
Figure 7A:
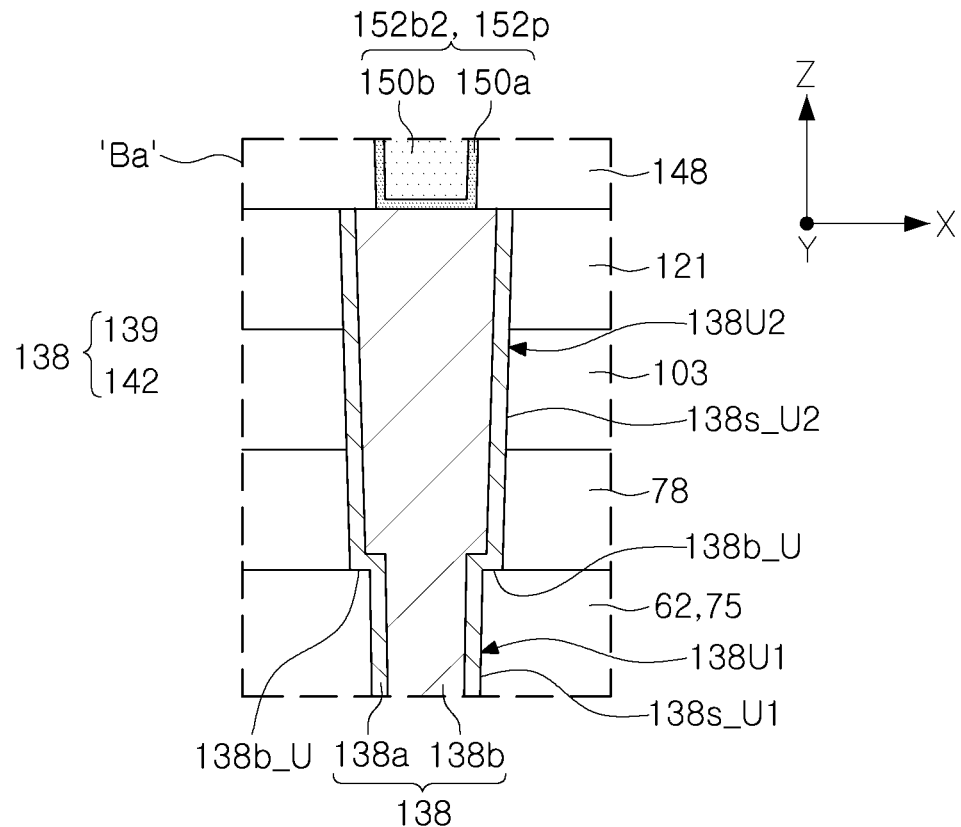
FIGS. 7A to 7C are enlarged cross-sectional diagrams illustrating a portion of a semiconductor device, according to an example embodiment of the present disclosure.
Figure 7B:
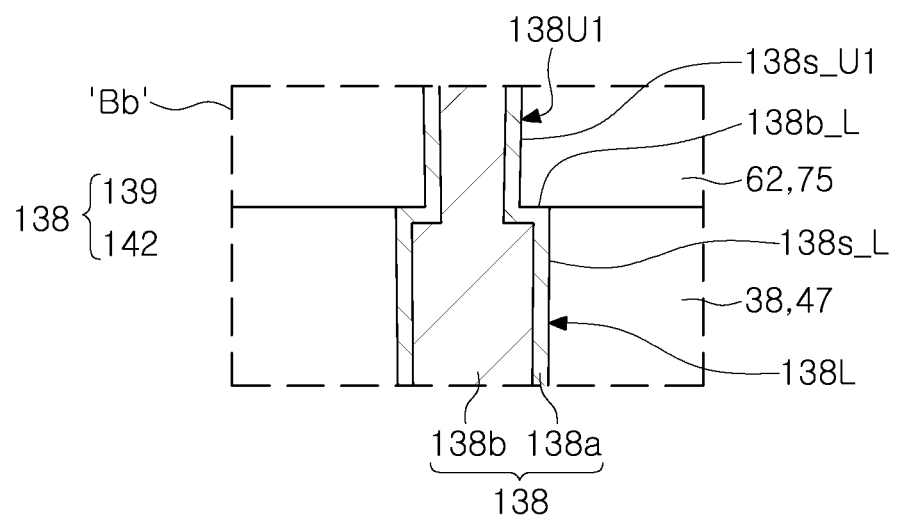
Figure 7C:
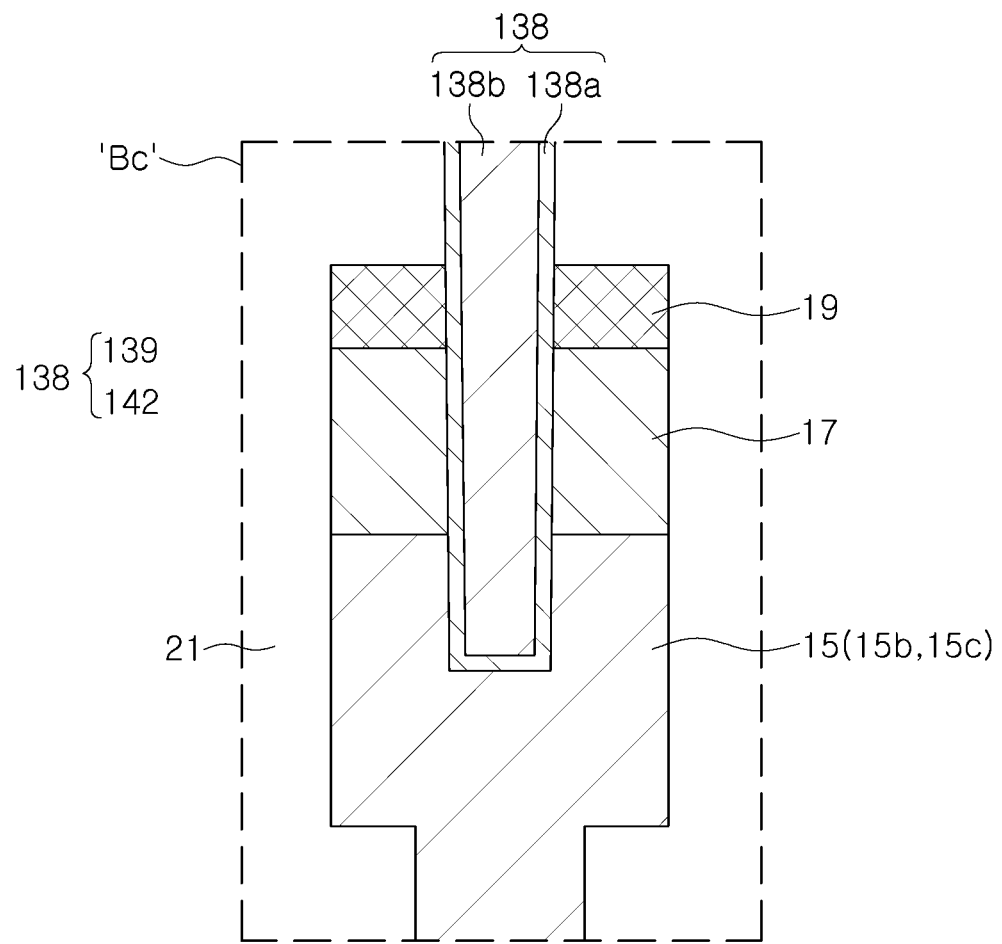

In the description below, examples of the first peripheral contact plug 139 and the second peripheral contact plug 142 will be described with reference to FIGS. 6, 7A, 7B, and 7C. FIG. 6 is an enlarged diagram illustrating region "B1" in FIG. 3C and region "B2" in FIG. 3A. FIG. 7A is an enlarged diagram illustrating region "Ba" in FIG. 6. FIG. 7B is an enlarged diagram illustrating region "Bb" in FIG. 6. FIG. 7C is an enlarged diagram illustrating region "Bc" in FIG. 6.

Referring to FIGS. 6, 7A, 7B, and 7C, as described in the aforementioned example embodiment with reference to FIGS. 3A and 3C, the first peripheral contact plug 139 and the second peripheral contact plug 142 may have substantially the same cross-sectional structure. The first and second peripheral contact plugs 139 and 142 may form contact plugs 138.

FIGS. 7A, 7B, and 7C illustrate a single contact plug 138, but the contact plug 138 may be replaced with the first and second peripheral contact plugs 139 and 142.

Each of the first and second peripheral contact plugs 139 and 142 may include a lower plug portion 138L, a first upper plug portion 138U1 on the lower plug portion 138L, and a second upper plug portion 138U2 on the first upper plug portion 138U1.

In an example, a width of an upper region of the lower plug portion 138L may be different from a width of a lower region of the first upper plug portion 138U1. For example, a width of the upper region of the lower plug portion 138L may be greater than a width of the lower region of the first upper plug portion 138U1.

In an example, a width of the upper region of the first upper plug portion 138U1 may be different from a width of the lower region of the second upper plug portion 138U2. For example, the width of the upper region of the first upper plug portion 138U1 may be less than the width of the lower region of the second upper plug portion 138U2.

In an example, on a first side of a side surface of each of the first and second peripheral contact plugs 139 and 142, disposed in one direction, an upper end of a lower side surface 128s_L of the lower plug portion 138L may not be aligned with a lower end of the first upper side surface 138s_U1 of the first upper plug portion 138U1 in the vertical direction Z, and an upper end of the upper side surface 138s_U1 of the first upper plug portion 138U1 may not be aligned with a lower end of the second upper side 138s_U2 of the second upper plug portion 138U2 in the vertical direction Z. Accordingly, the first side of the side surface of each of the first and second peripheral contact plugs 139 and 142, disposed in one direction, may include the lower bending portion 138b_L extending from the upper end of the lower side surface 138s_L of the lower plug portion 138L and the lower end of the first upper side surface 138s_U1 of the first upper plug portion 138U1, which may not be aligned with each other, and the upper bending portion 138b_U extending from the upper end of the first upper side surface 138s_U1 of the first upper vertical portion 138U1 and the lower end of the second upper side surface 138s_U2 of the second upper vertical portion 138U2, which may not be aligned with each other.

In an example, the second bit line connection plug 152b2 and the peripheral connection plug 152p may include a material the same as a material of the first bit line connection plug 152b1, such as the gap-fill conductive layer 150b and the conductive liner layer 150a covering the side surface and the bottom surface of the gap-fill conductive layer 150b.

In an example, each of the first and second peripheral contact plugs 139 and 142 may include a contact gap-fill conductive pattern 138b and a contact conductive liner layer 138a covering the side surface and the bottom surface of the contact gap-fill conductive pattern 138b. The contact gap-fill conductive pattern 138b may include a metal material (e.g., W, etc.), and the contact conductive liner layer 138a may include metal nitride (e.g., TiN, TaN, or WN).

Each of the first and second peripheral contact plugs 139 and 142 may penetrate the etch stop layer 19 and the capping layer 17 in order and may be in contact with the peripheral pads 15.

Figure 8A:
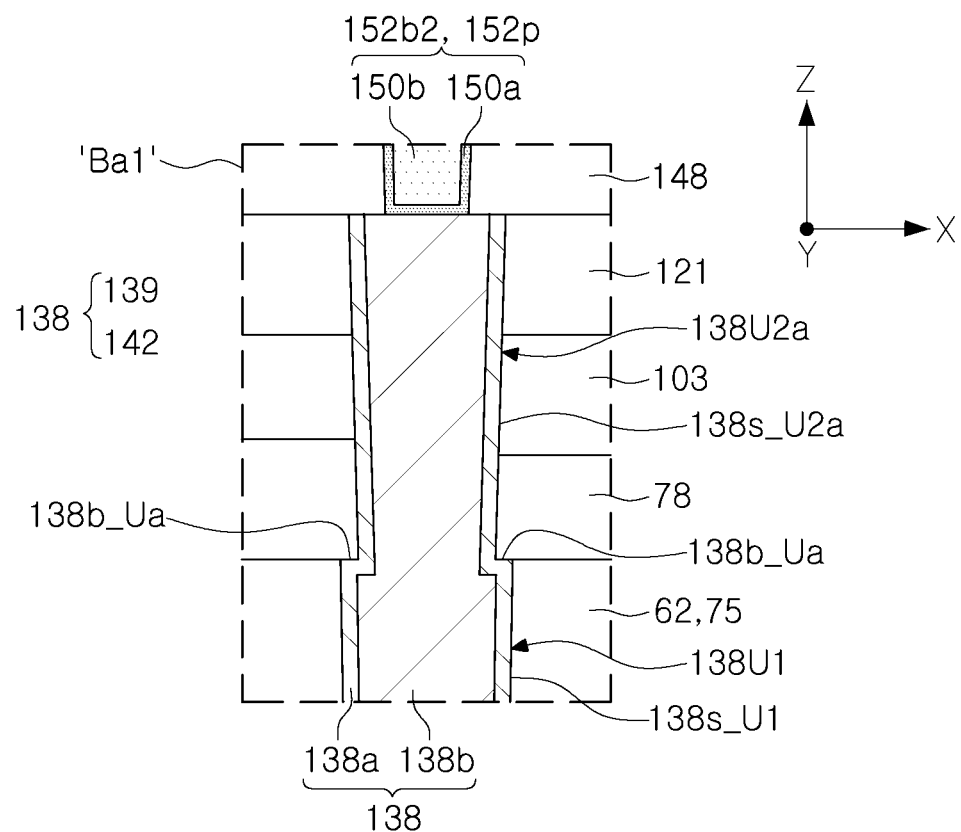
FIGS. 8A to 8C are enlarged cross-sectional diagrams illustrating a modified example of a portion of a semiconductor device, according to an example embodiment of the present disclosure.

In the description below, a modified example of the contact plug 138 in FIG. 7A will be described with reference to FIG. 8A. FIG. 8A is an enlarged diagram illustrating region "Ba1" corresponding to region "Ba" in FIG. 7A to illustrate a modified example of the first upper plug portion 138U1 and the second upper plug portion 138U2 of the contact plug 138 in FIG. 7A.

In a modified example, referring to FIG. 8A, a width of an upper region of the first upper plug portion 138U1 may be greater than a width of a lower region of the second upper plug portion 138U2a. Accordingly, a first side of a side surface of the contact plug 138, disposed in one direction, may include an upper bending portion 81b_U extending from the upper end of the first upper side surface 138s_U1 of the first upper plug portion 138U1 and the lower end of the second upper side surface 138s U2a of the second upper plug portion 138U2a, which may not be aligned with each other.

Figure 8B:
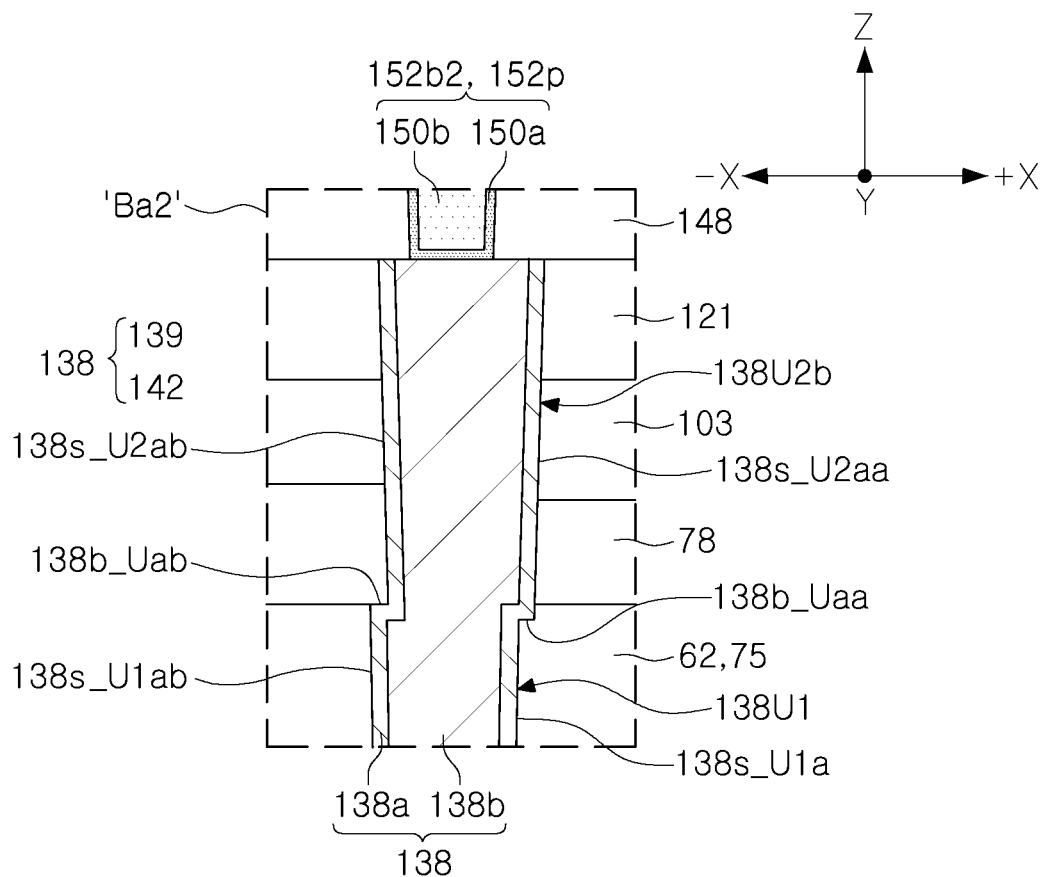

In the description below, another modified example of the contact plug 138 in FIG. 7A will be described with reference to FIG. 8B. FIG. 8B is an enlarged diagram illustrating region "Ba2" corresponding to region "Ba" in FIG. 7A to illustrate a modified example of the first upper plug portion 138U1 and the second upper plug portion 138U2 of the contact plug 138 in FIG. 7A.

In the modified example, referring to FIG. 8B, in the contact plug 138, a vertical central axis of the first upper plug portion 138U1 and a vertical central axis of the second upper plug portion 138U2b may not be aligned. The vertical central axis of the first upper plug portion 138U1 may cross a center between both side surfaces 138s_U1a and 138s_U1b of the first upper plug portion 138U1 in the vertical direction Z, and the vertical central axis of the second upper plug portion 138 U2b may cross a center between both side surfaces 138s_U2aa and 138s_U2ab of the second upper plug portion 138U2b in the vertical direction Z.

Both side surfaces 138s_U1a and 138s_U1b of the first upper plug portion 138U1 and both side surfaces 138s_U2aa and 138s_U2ab of the second upper plug portion 138U2b may not be aligned in the vertical direction Z, such that the side surface of the contact plug 138 may include a bending portion 138b_Uaa disposed in the +X direction and a bending portion 138b_Uab disposed in the −X direction.

Figure 8C:
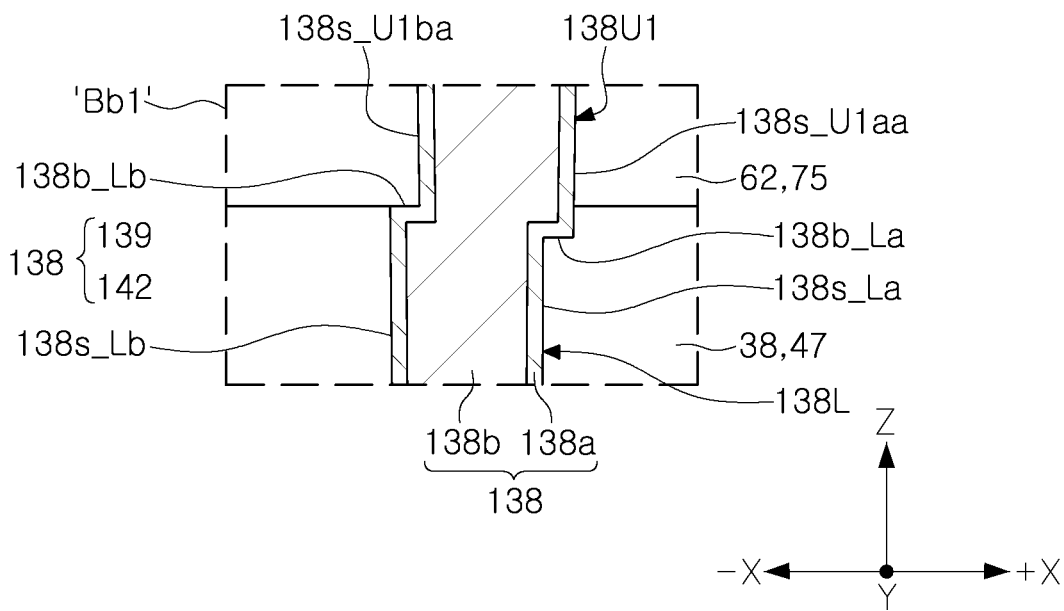

In the description below, another modified example of the contact plug 138 in FIG. 7B will be described with reference to FIG. 8C. FIG. 8C is an enlarged diagram illustrating region "Bb1" corresponding to region "Bb" in FIG. 7B to illustrate a modified example of the first upper plug portion 138U1 and the second upper plug portion 138U2 of the contact plug 138 in FIG. 7B.

In the modified example, referring to FIG. 8C, in the contact plug 138, a vertical central axis of the first upper plug portion 138U1 and a vertical central axis of the lower plug portion 138L may not be aligned. The vertical central axis of the first upper plug portion 138U1 may cross a center between both side surfaces 138s_U1aa and 138s_U1ba of the first upper plug portion 138U1 in a vertical direction Z, and the vertical central axis of the lower plug portion 138L may cross a center between both side surfaces 138s_La and 138s_Lb of the lower plug portion 138L in the vertical direction Z.

The both side surfaces 138s_U1aa and 138s_U1ba of the first upper plug portion 138U1 and the both side surfaces 138s_La and 138s_Lb of the lower plug portion 138L may not be aligned in the vertical direction Z, such that the side surface of the contact plug 138 may include a bending portion 138b_La disposed in the +X direction and a bending portion 138b_Lb disposed in the −X direction.

Figure 9:
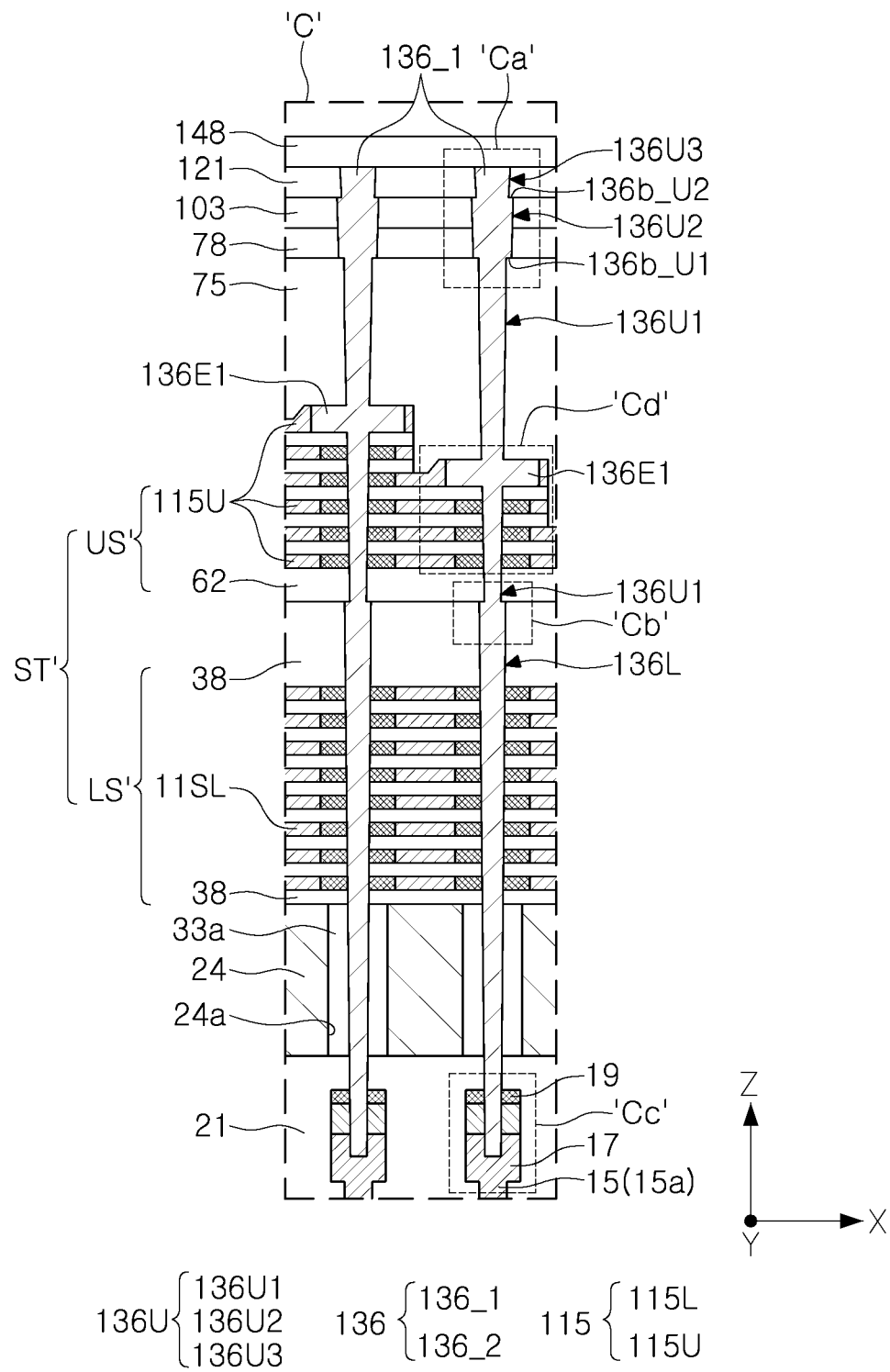
FIG. 9 is an enlarged cross-sectional diagram illustrating a portion of a semiconductor device, according to an example embodiment of the present disclosure.
Figure 10A:
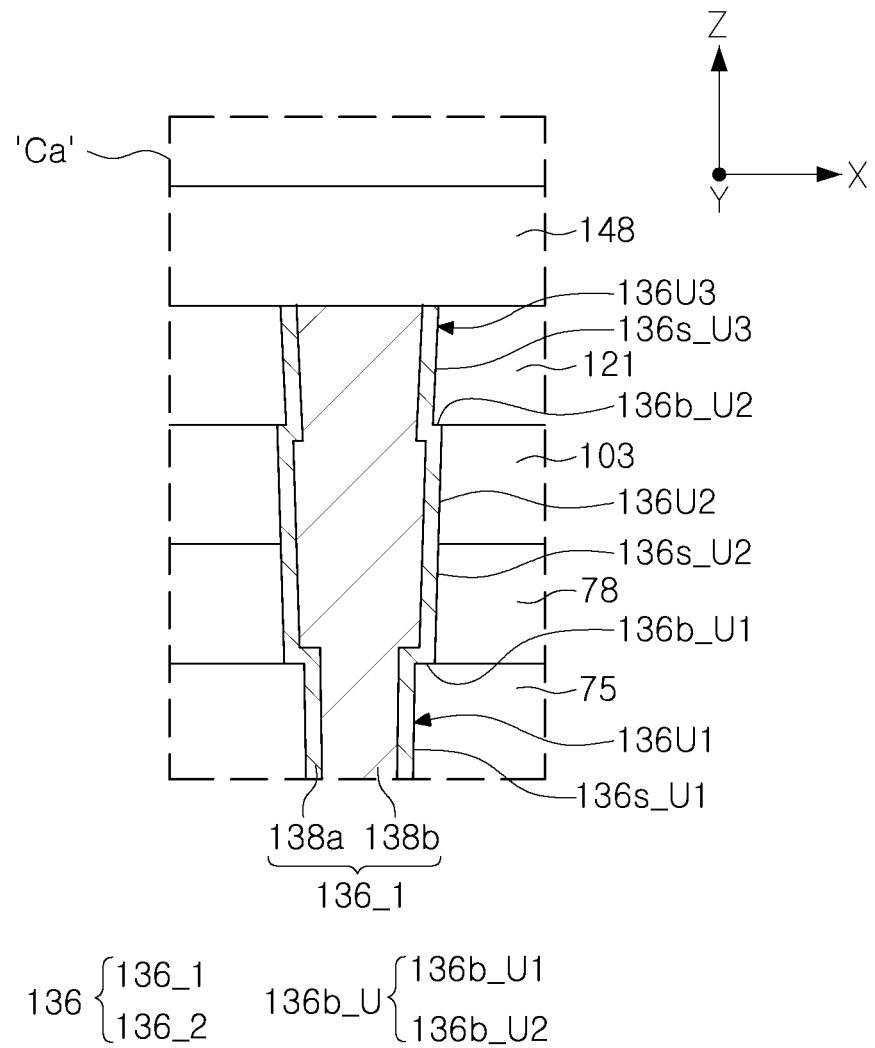
FIGS. 10A and 10B are enlarged cross-sectional diagrams illustrating a portion of a semiconductor device, according to an example embodiment of the present disclosure.
Figure 10B:
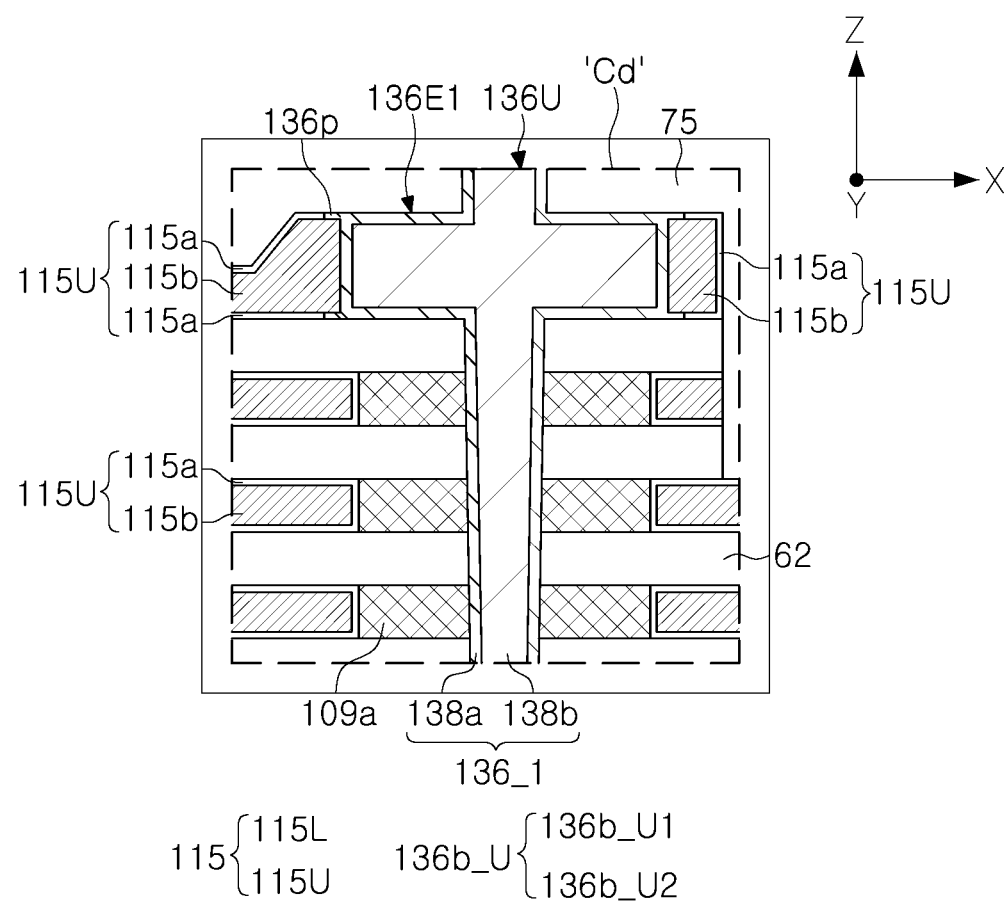

In the description below, the stack structure ST' and the gate contact plugs 136 will be described with reference to FIGS. 9, 10A, and 10B. FIG. 9 is an enlarged diagram illustrating portion "C." FIG. 10A is an enlarged diagram illustrating portion "Ca" in FIG. 9. FIG. 10B is an enlarged diagram illustrating portion "Cd" in FIG. 10A.

Referring to FIGS. 9, 10A, and 10B, as described in FIG. 3A, each of the plurality of gate contact plugs 136 may include a lower plug portion 136L and an upper portion 136U on the lower plug portion 136L. The upper plug portion 136U may include a first upper plug portion 136U1, a second upper plug portion 136U2 on the first upper plug portion 136U1, and a third upper plug portion 136U3 on the second upper plug portion 136U2.

Each of the plurality of gate contact plugs 136 may include a material the same as a material of the first and second peripheral contact plugs 139 and 142. For example, each of the plurality of gate contact plugs 136 may include the contact gap fill conductive layer 138b and the contact conductive liner layer 138a covering a side surface and a bottom surface of the contact gap fill conductive layer 138b.

An upper end of the first upper plug portion 136U1 may be disposed on a level substantially the same as a level of an upper surface of the second capping insulating layer 75, the second upper plug portion 136U2 may penetrate the second and third capping insulating layers 78 and 103, and the third upper plug portion 136U3 may penetrate the fourth capping insulating layer 121.

As described in FIG. 3A, a side surface of the upper plug portion 136U may include the plurality of upper bending portions 136b_U.

In an example, a width of the upper region of the first upper plug portion 136U1 may be different from a width of the lower region of the second upper plug portion 136U2, and a width of the upper region of the second upper plug portion 136U2 may be different from a width of the lower region of the third upper plug portion 136U3. For example, the width of the upper region of the first upper plug portion 136U1 may be less than the width of the lower region of the second upper plug portion 136U2, and the width of the upper region of the second upper plug portion 136U2 may be greater than the width of the lower region of the third upper plug portion 136U3.

In an example, on a first side of the side surface of each of the gate contact plugs 136, disposed in one direction, an upper end of the first upper side surface 136s_U1 of the first upper plug portion 136U1 may not be aligned with the lower end of the second upper side surface 136s_U2 of the second upper plug portion 136U2 in the vertical direction Z, and an upper end of the second upper side surface 136s_U2 of the second upper plug portion 136U2 may not be aligned with the lower end of the third upper side surface 136s_U3 of the third upper plug portion 136U3 in the vertical direction Z. Accordingly, on the first side of the side surface of each of the gate contact plugs 136, disposed in one direction, the upper end of the first upper side surface 136s_U1 of the first upper plug portion 136U1 may include the first upper bending portion 136b_U1 extending from a lower end of the second upper side surface 136s_U2 of the second upper plug portion 136U2, which may not be aligned with each other, and the upper end of the second upper side surface 136s_U2 of the second upper plug portion 136U2 may include the second upper bending portion 136b_U2 extending from the lower end of the third upper side surface 136s_U3 of the third upper plug portion 136U3, which may not be aligned with each other.

The second upper bending portion 136b_U2 may be disposed on a level higher than a level of the first upper bending portion 136b_U1.

In an example, on a level higher than a level of the uppermost gate layer of the gate layers 115, the first upper bending portion 136b_U1 on the side surface of each of the gate contact plugs 136 may be disposed at substantially the same level as a level of the upper bending portions 81b_U, 139b_U, 142b_U, 145b_U, and 91b_U of the side surfaces of the memory vertical structure 81, the first peripheral contact plug 139, the second peripheral contact plug 142, the source contact plug 145, and the support vertical structure 91. In example embodiments, a horizontal surface of the first upper bending portion 136b_U1 may be coplanar with a lower surface of third capping insulating layer 78, and a horizontal surface of the second upper bending portion 136b_U2 may be coplanar with an upper surface of the fourth capping insulating layer 103.

In an example, a cross-sectional shape of one gate contact plug 136 of the portion "Cb" in FIG. 9 may be substantially the same as a cross-sectional shape of the contact plug 138 in FIG. 7B or a cross-sectional shape of the contact plug 138 in FIG. 8C.

In an example, a cross-sectional shape of the gate contact plug 136 of the portion "Cc" in FIG. 9 may be substantially the same as a cross-sectional shape of the contact plug 138 in FIG. 7C.

The gate layers 115g may include the first layer 115a and the second layer 115b illustrated in FIG. 4. As in FIG. 3A, each of the plurality of gate contact plugs 136 may include the conductive material portion of the gate layers 115g, the gate contact portion 136E electrically connected to and in contact with the second layer 115b.

One of the gate contact portions 136E, the gate contact portion 136E1 of the first gate contact plug 136_1, for example, may further include a protrusion 136P extending to cover the upper and lower surfaces of the second layer 115b of the upper gate layer 115U.

Each of the gate contact plugs 136 may include one gate contact portion 136E, and when the gate layers 115g are disposed below one gate contact portion 136E, buffer insulating patterns 109a may be disposed between the gate layers 115g disposed in a lower portion of the gate contact portion 136E and each of the gate contact plugs 136 to electrically insulate the gate layers 115g disposed in a lower portion of the gate contact portion 136E from each of the gate contact plugs 136.

Figure 11A:
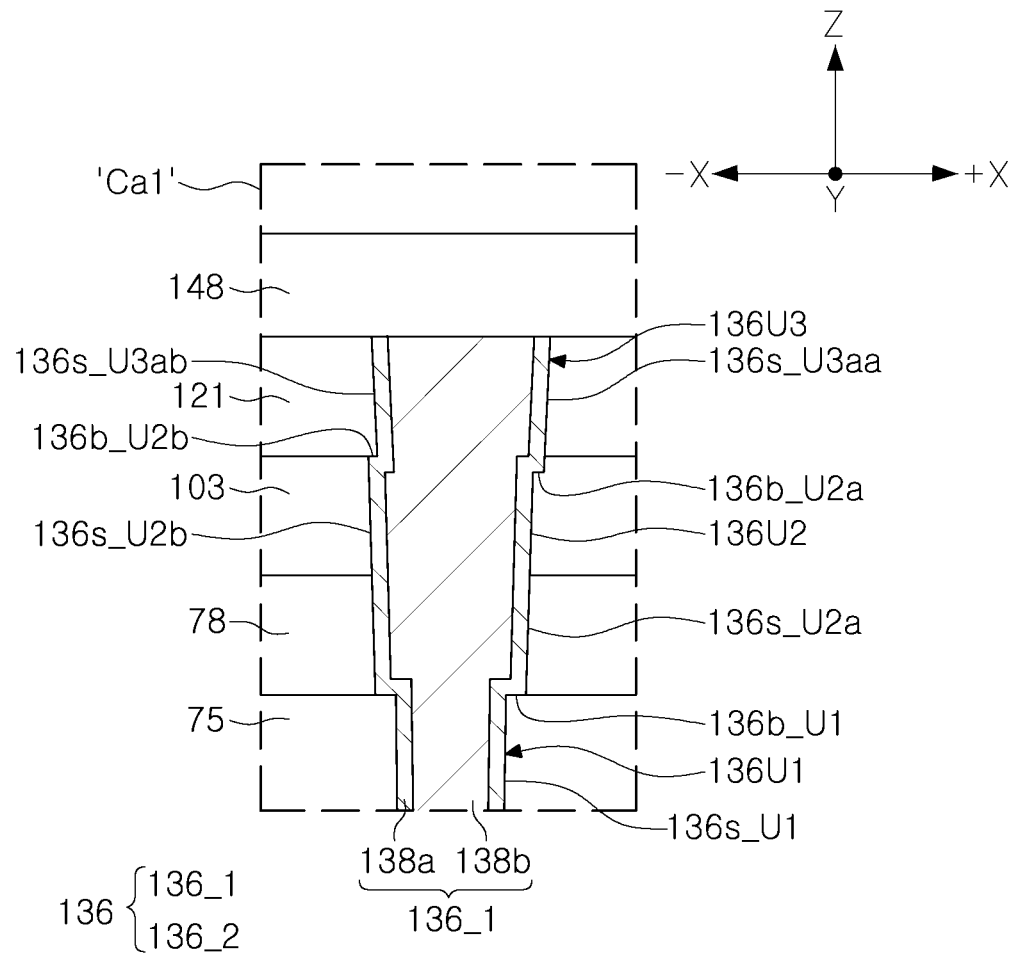
FIGS. 11A to 11C are enlarged cross-sectional diagrams illustrating a modified example of a portion of a semiconductor device, according to an example embodiment of the present disclosure.

In the description below, a modified example of the gate contact plug 136 described in FIG. 10A will be described with reference to FIG. 11A. FIG. 11A is an enlarged diagram illustrating region "Ca1" corresponding to a region "Ca" in FIG. 7A to illustrate a modified example of the second upper plug portion 136U2 and the third upper plug portion 136U3 of the gate contact plug 136 in FIG. 10A.

In a modified example, referring to FIG. 11A, in the gate contact plug 136, a vertical central axis of the second upper plug portion 136U2 and a vertical central axis of the third upper plug portion 136U3 may not be aligned. The vertical central axis of the second upper plug portion 136U2 may cross a center between both side surfaces 136s_U2a and 136s_U2b of the second upper plug portion 138U2 in a vertical direction Z, and the vertical central axis of the third upper plug portion 136U3 may cross a center between both side surfaces 136s_U3aa and 136s_U3ab of the third upper plug portion 136U3 in a vertical direction Z. The both side surfaces 136s_U2a and 136s_U2b of the second upper plug portion 138U2 and the both side surfaces 136s_U3aa and 136s_U3ab of the third upper plug portion 136U3 may not be aligned in the vertical direction Z. Accordingly, the side surface of the gate contact plug 136 may include a bending portion 136b_U2a disposed in the +X direction and a bending portion 136b_U2b disposed in the −X direction.

In the description below, a modified example of the gate contact plug 136 described in FIG. 10A will be described with reference to FIG. 11B. FIG. 11A is an enlarged diagram illustrating region "Ca2" corresponding to a region "Ca" in FIG. 10A to illustrate a modified example of the second upper plug portion 136U2 and the third upper plug portion 136U3 of the gate contact plug 136 in FIG. 10A.

Figure 11B:
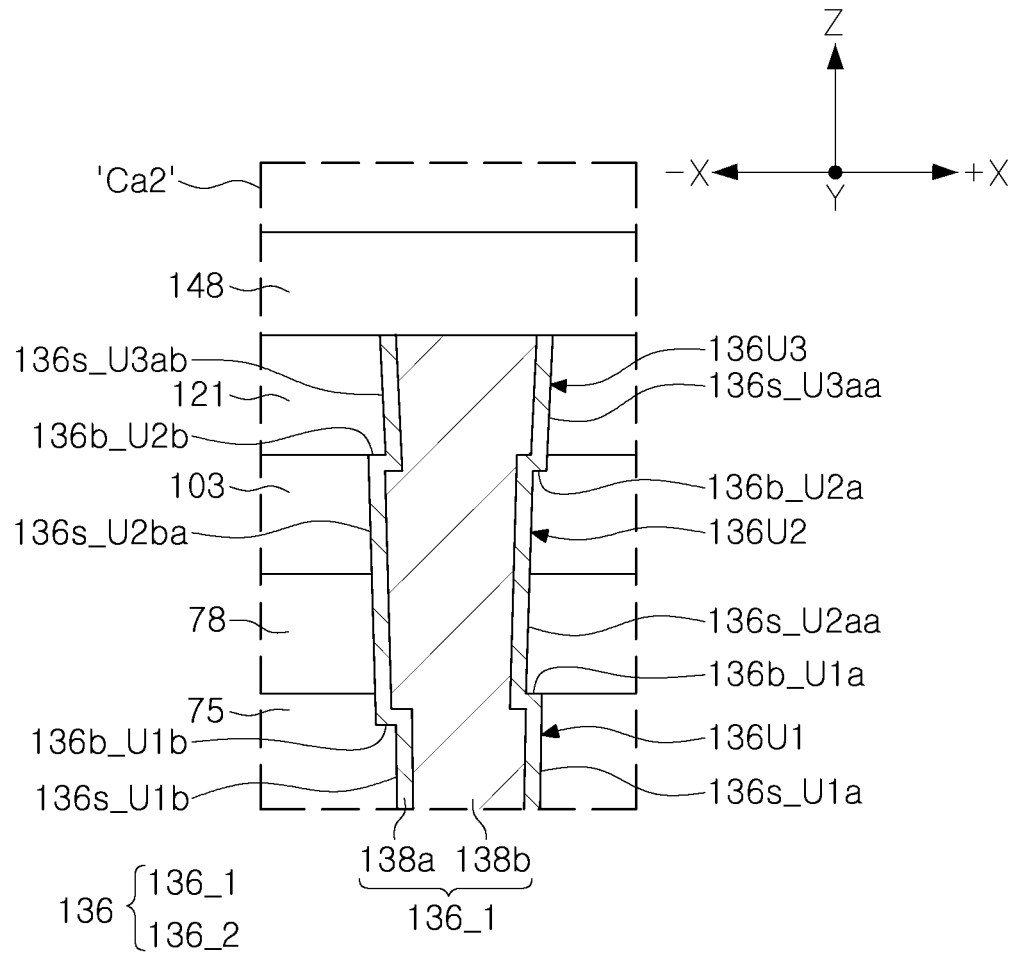

In the modified example, referring to FIG. 11B, in the gate contact plug 136, vertical central axes of the second upper plug portion 136U2 and the third upper plug portion 136U3 may not be aligned as in FIG. 11A.

The vertical central axis of the first upper plug portion 136U1 and the vertical central axis of the second upper plug portion 136U2 may not be aligned. The vertical central axis of the first upper plug portion 136U1 may be taken in a vertical direction Z, crossing a center between both side surfaces 136s_U1a and 136s_U1b of the first upper plug portion 136U1, and the vertical central axis of the second upper plug portion 136U2 may be taken in the vertical direction Z, crossing a center between both side surfaces 136s_U2aa and 136s_U2ab of the second upper plug portion 136U2.

Since the both side surfaces 136s_U1a and 136s_U1b of the first upper plug portion 136U1 and the both side surfaces 136s_U2aa and 136s_U2ab of the second upper plug portion 136U2 may not be aligned in the vertical direction Z, the side surface of the gate contact plug 136 may include an bending portion 136b_U1a disposed in the +X direction and an bending portion 136b_U1b disposed in the −X direction.

Figure 11C:
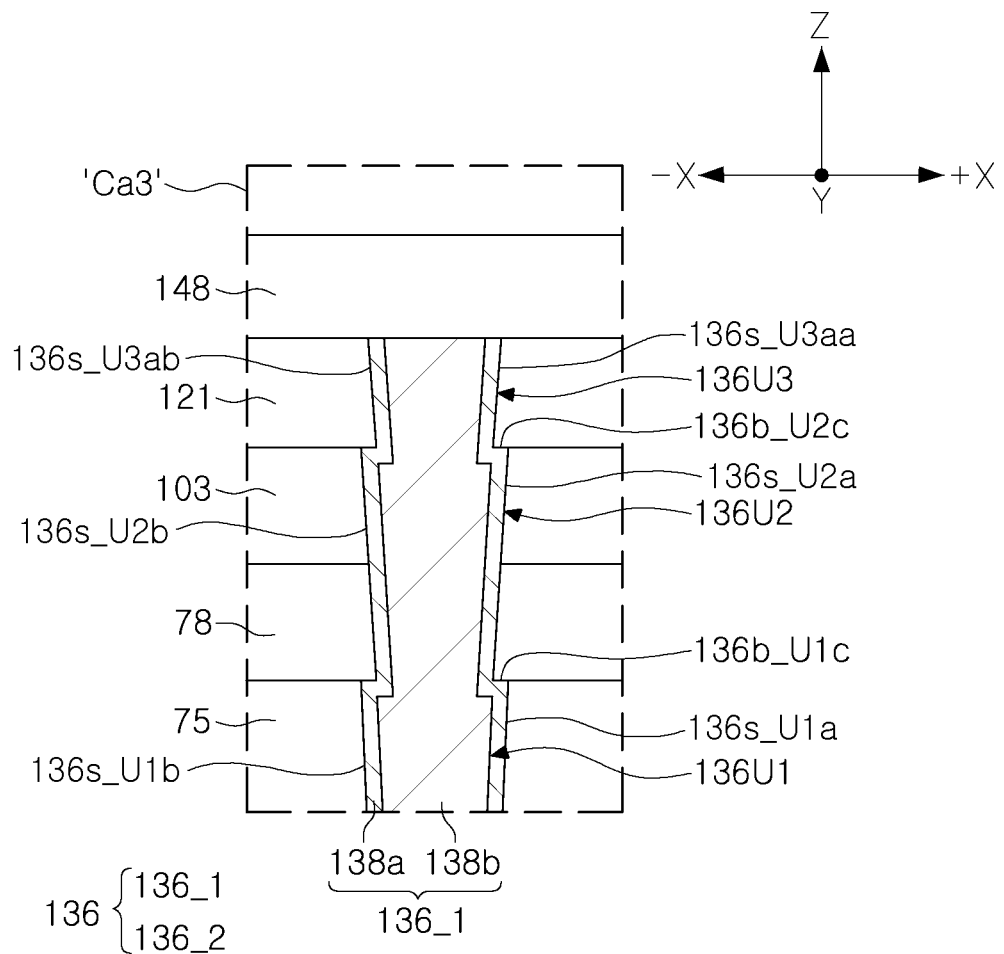

In the description below, a modified example of the gate contact plug 136 described in FIG. 10A will be described with reference to FIG. 11C. FIG. 11C is an enlarged diagram illustrating region "Ca1" corresponding to a region "Ca" in FIG. 7A to illustrate a modified example of the second upper plug portion 136U2 and the third upper plug portion 136U3 of the gate contact plug 136 in FIG. 10A.

In a modified example, referring to FIG. 11C, a width of an upper region of the first upper plug portion 136U1 may be greater than a width of a lower region of the second upper plug portion 136U2, and a width of an upper region of the second upper plug portion 136U2 may be greater than a width of a lower region of the third upper plug portion 136U3. Accordingly, a first side of the side surface of the gate contact plug 136, disposed in one direction, may include a first upper bending portion 136b_U1c extending from the upper end of the side surface of the first upper plug portion 136U1 and the lower end of the side surface of the second upper plug portion 136U2, which may not be aligned with each other, and a second upper bending portion 136b_U2c extending from an upper end of the side surface of the second upper plug portion 136U2 and a lower end of the side surface of the third upper plug portion 136U3, which may not be aligned with each other.

The vertical central axis of the second upper plug portion 136U2 and the vertical central axis of the third upper plug portion 136U3 may not be aligned. The vertical central axis of the second upper plug portion 136U2 may be taken in the vertical direction Z, crossing a center between both side surfaces 136s_U2a and 136s_U2b of the second upper plug portion 136U2, and the vertical central axis of the third upper plug portion 136U3 may be taken in the vertical direction Z, crossing a center between both side surfaces 136s_U3aa and 136s_U3ab of the third upper plug portion 136U3. The both side surfaces 136s_U2a and 136s_U2b of the second upper plug portion 136U2 and the both side surfaces 136s_U3aa and 136s_U3ab of the third upper plug portion 136U3 may not be aligned in the vertical direction Z. Accordingly, the side surface of the gate contact plug 136 may include a bending portion 136b_U2a disposed in the +X direction and a bending portion 136b_U2b disposed in the −X direction.

Figure 12:
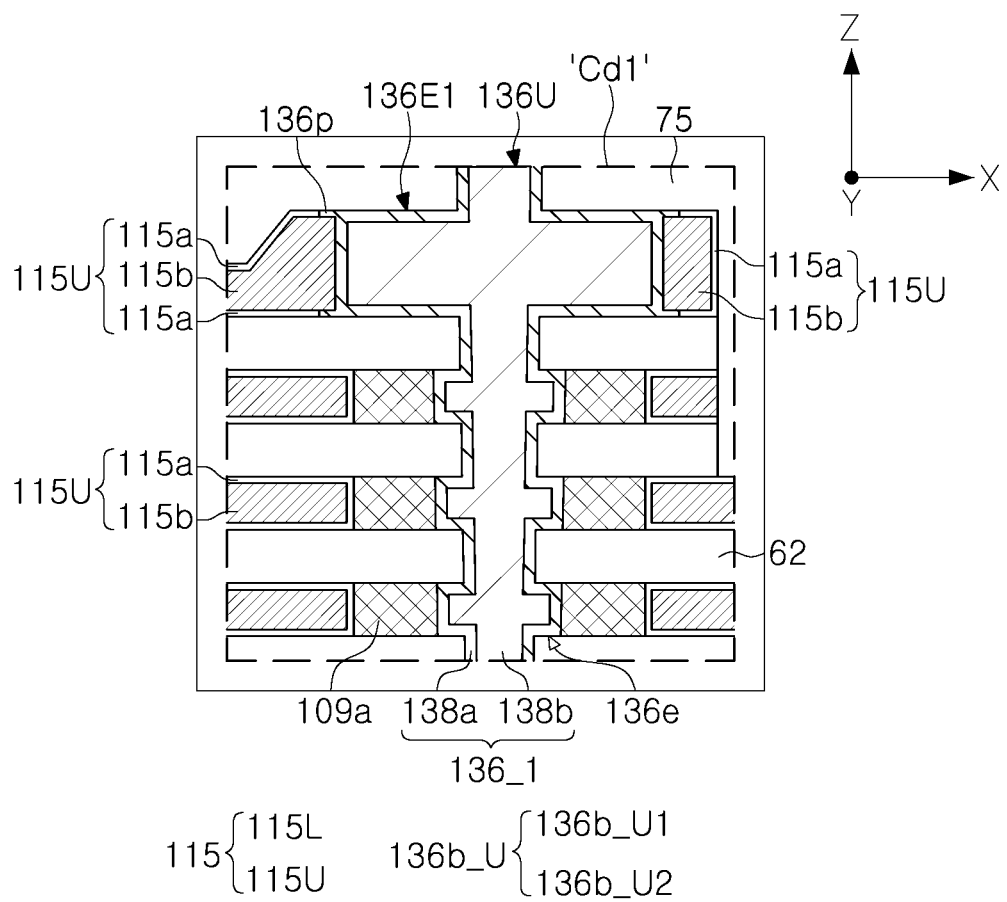
FIG. 12 is an enlarged cross-sectional diagram illustrating a modified example of a portion of a semiconductor device, according to an example embodiment of the present disclosure.

In the description below, a modified example of the gate contact plug 136 described with reference to FIG. 10B will be described with reference to FIG. 12. FIG. 12 is an enlarged diagram illustrating a region corresponding to region "Cd" in FIG. 10B to illustrate a modified example of the gate contact plug 136 in FIG. 10B.

In the modified example, referring to FIG. 12, one of the gate contact plugs, a first gate contact plug 136_1, for example, may include the gate contact portion 136E as described above. The first gate contact plug 136_1 may further include extension portions 136p extending from a lower portion of the gate contact portion 136E in a direction of the buffer insulating patterns 109a. Accordingly, one of the gate contact plugs, the first gate contact plug 136_1, for example, may have a curved side surface below the gate contact portion 136E. For example, a width of the first gate contact plug 136_1 may be increased at the same level as a level of the buffer insulating patterns 109a disposed below the gate contact portion 136E.

Figure 13:
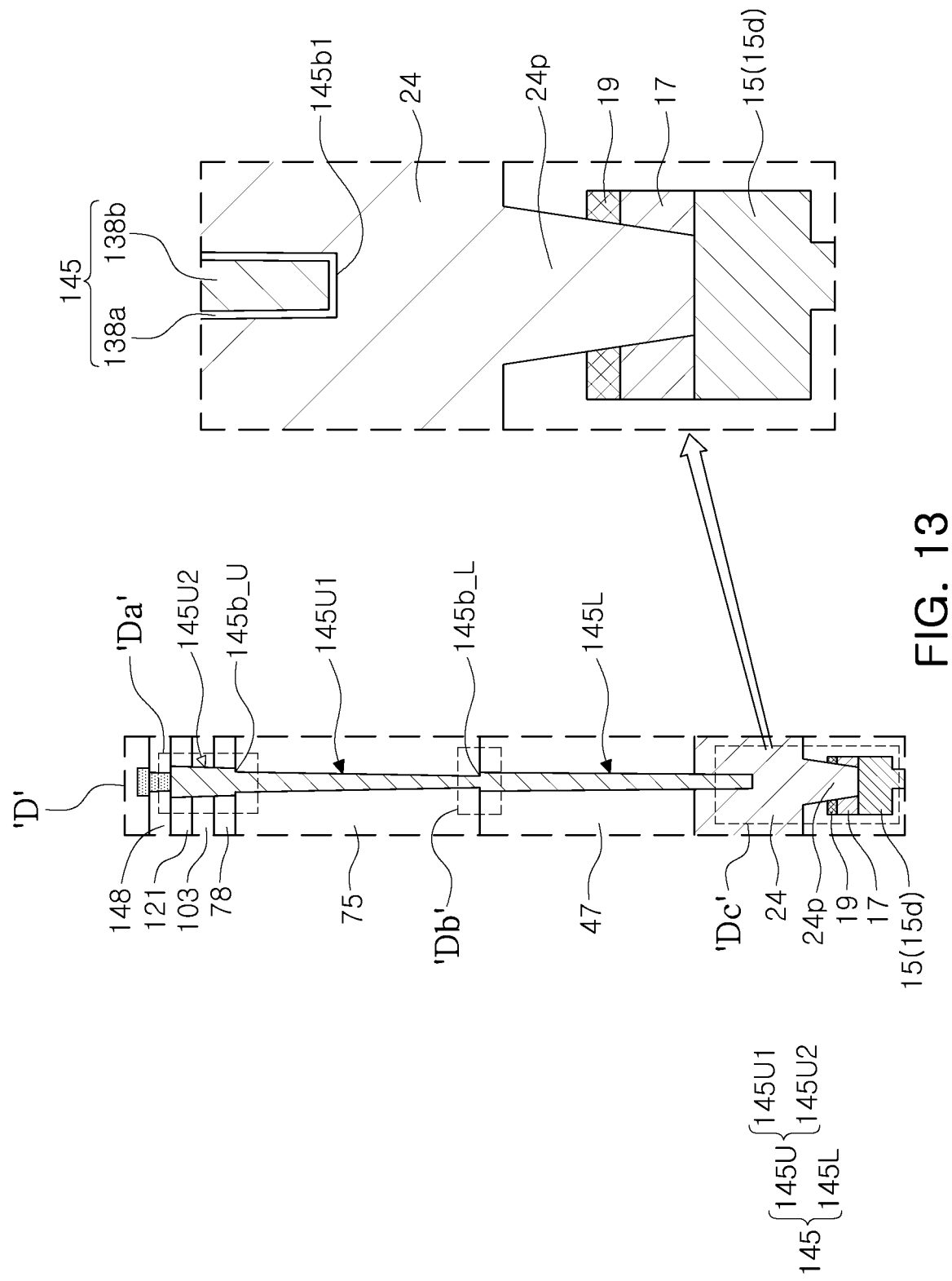
FIG. 13 is an enlarged cross-sectional diagram illustrating a portion of a semiconductor device, according to an example embodiment of the present disclosure.

In the description below, the source contact plug 145 will be described with reference to FIG. 13. FIG. 13 is an enlarged diagram illustrating portion "D" in FIG. 3A.

Referring to FIG. 13, the source contact plug 145 may include a lower plug portion 145L, a first upper plug portion 145U1 on the lower plug portion 145L, and a second upper plug portion 145U2 on the first upper plug portion 145U1.

In FIG. 13, a cross-sectional shape of the source contact plug 145 in portion "Da" may be substantially the same as a cross-sectional shape of the contact plug 138 denoted by "Ba" in FIGS. 6 and 7A, a cross-sectional shape of the contact plug 138 denoted by "Ba1", or a cross-sectional shape of the contact plug 138 denoted by "Ba2" in FIG. 8C.

In FIG. 13, a cross-sectional shape of the source contact plug 145 in portion "Db" may be substantially the same as a cross-sectional shape of the contact plug 138 denoted by "Bb" in FIGS. 6 and 7B or a cross-sectional shape of the contact plug 138 denoted by "Bb1" in FIG. 8C.

In an example, a lower surface 145b1 of the source contact plug 145 may be disposed on a level lower than a level of an upper surface of the pattern structure 24, and may be disposed on a level higher than a level of an upper surface of the pattern via 24p.

Figure 14A:
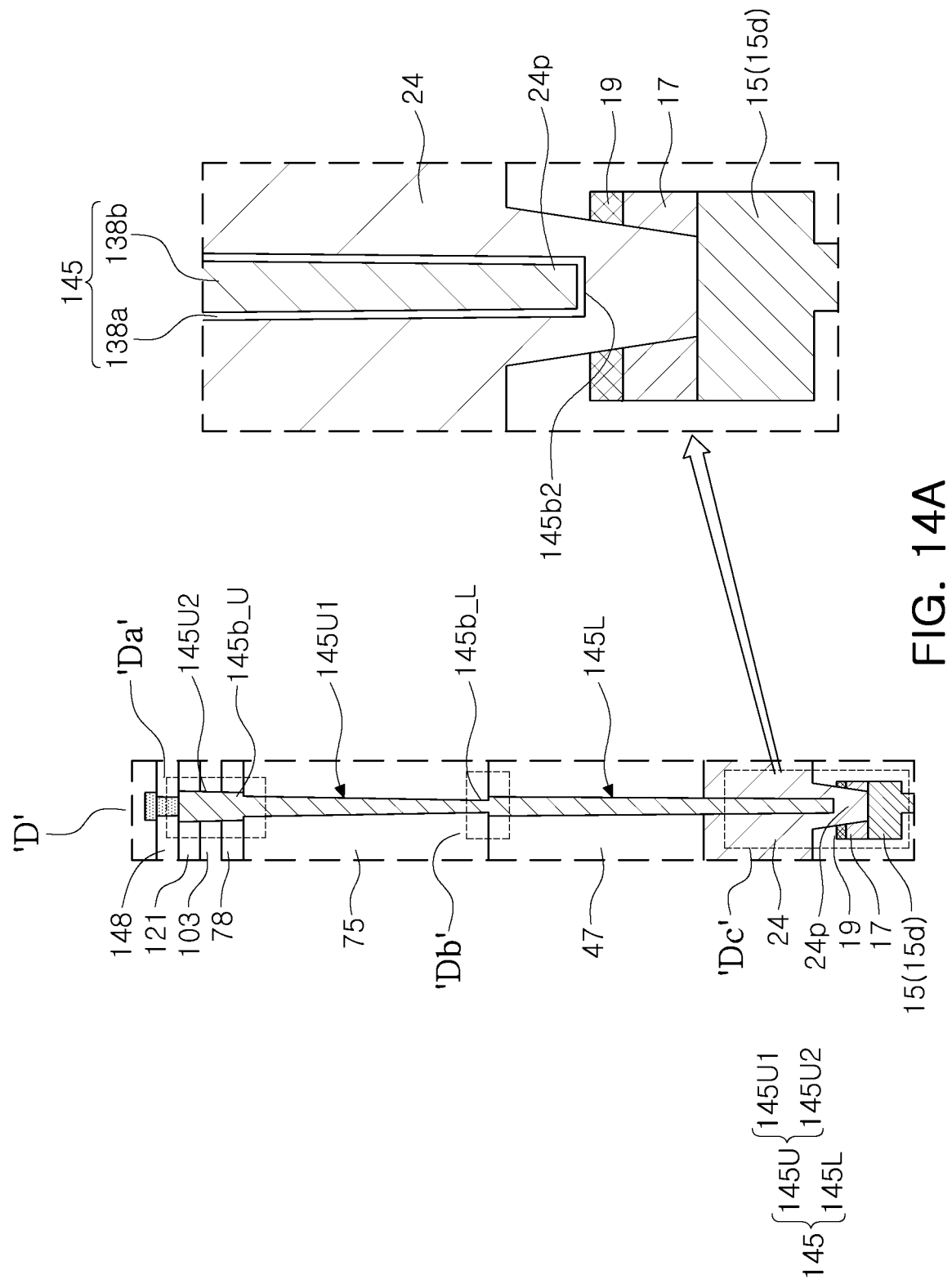
FIG. 14A is an enlarged cross-sectional diagram illustrating a modified example of a portion of a semiconductor device, according to an example embodiment of the present disclosure.

In the description below, a modified example of the source contact plug 145 in FIG. 13 will be described with reference to FIG. 14A. FIG. 14A is an enlarged diagram illustrating portion "D" in FIG. 3A.

Referring to FIG. 14A, a lower surface 145b2 of the source contact plug 145 may be disposed on a level lower than a level of an upper surface of the pattern via 24p, and may be disposed on a level higher than a level of a lower surface of the pattern via 24p. The upper surface of the pattern via 24p may be at the same level as an upper surface of the lower insulating layer 21.

Figure 14B:
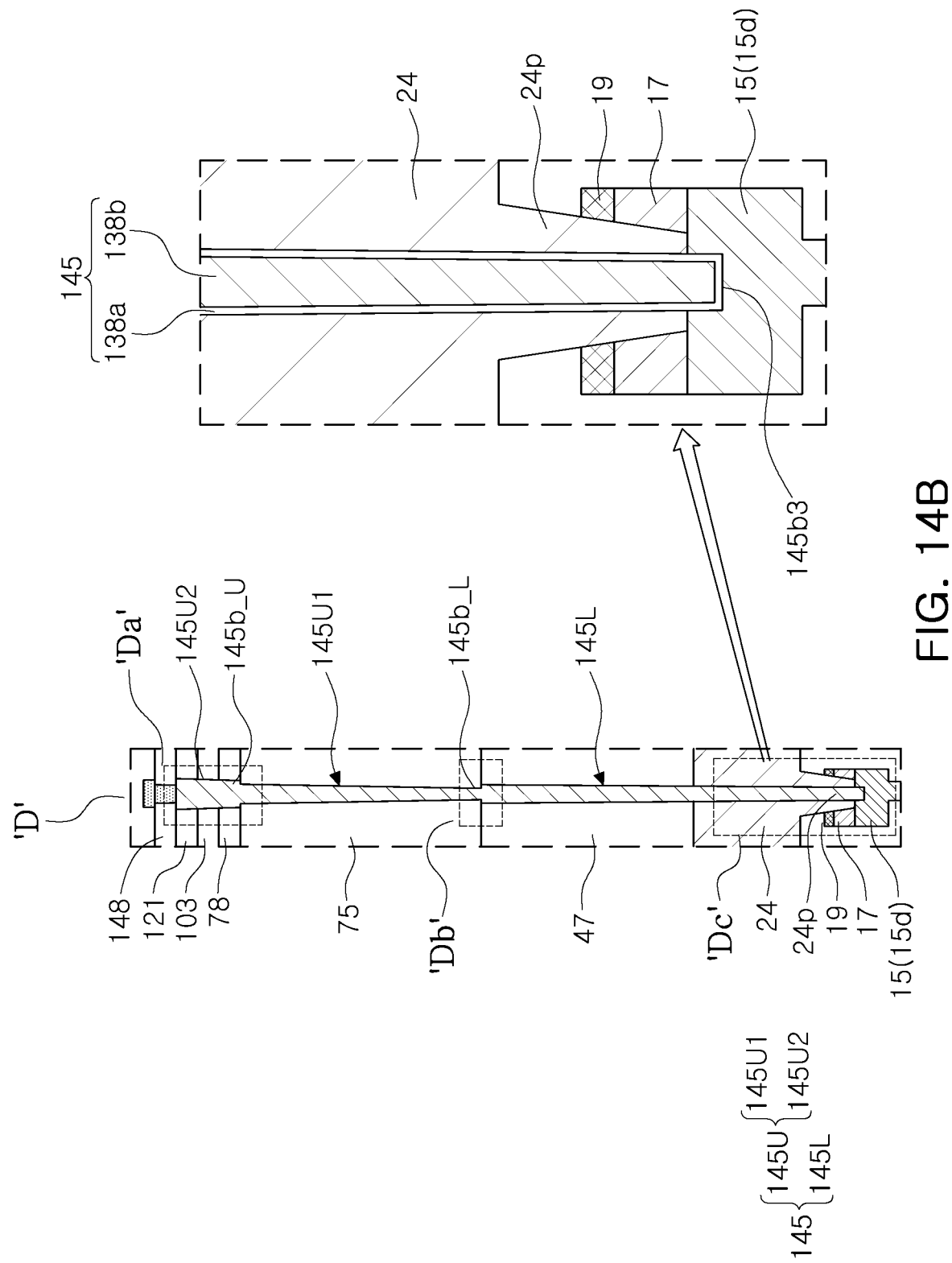
FIG. 14B is an enlarged cross-sectional diagram illustrating a modified example of a portion of a semiconductor device, according to an example embodiment of the present disclosure.

In the description below, a modified example of the source contact plug 145 in FIG. 13 will be described with reference to FIG. 14B. FIG. 14B is an enlarged diagram illustrating portion "D" in FIG. 3A.

Referring to FIG. 14B, a lower surface 145b3 of the source contact plug 145 may penetrate the pattern via 24p and may be in contact with the fourth peripheral pad 15d.

Figure 15:
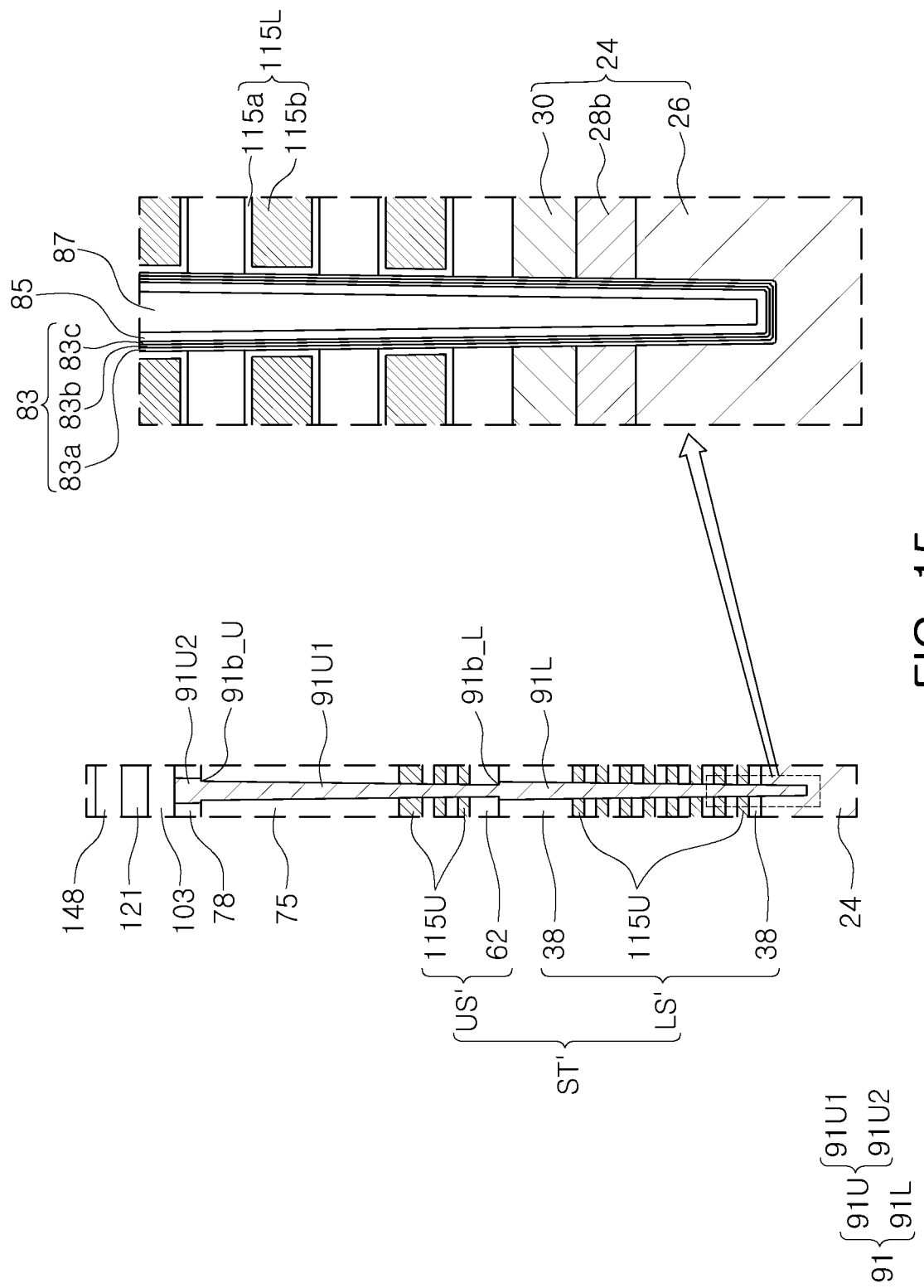
FIG. 15 is an enlarged cross-sectional diagram illustrating a portion of a semiconductor device, according to an example embodiment of the present disclosure.

In the description below, the pattern structure 24 and the support vertical structure 91 will be described with reference to FIG. 15. FIG. 15 is an enlarged diagram illustrating portion "E" in FIG. 3B.

Referring to FIG. 15, the support vertical structure 91 may include material layers 83, 85, 87, and 89 substantially the same as those of the memory vertical structure 81 described in FIG. 4. The support vertical structure 91 may have a shape and a structure substantially the same as those of the memory vertical structure 81 described in FIG. 4 on a level higher than a level of the pattern structure 24. For example, the support vertical structure 91 may include a lower vertical portion 91L, a first upper vertical portion 91U1 on the lower vertical portion 91L, and a second upper vertical portion 91U2 on the first upper vertical portion 91U1. For example, as in FIG. 3B, a first side of a side surface of the support vertical structure 91, disposed in one direction, may include the lower bending portion 91b_L between a side surface of the lower vertical portion 91L and a side surface of the first upper vertical portion 91U1, and an upper bending portion 91b U between a side surface of the first upper vertical portion 91U1 and a side surface of the second upper vertical portion 91U2.

The pattern structure 24 may include a lower pattern layer 26, a second intermediate pattern layer 28b on the lower pattern layer 26, and an upper pattern layer 30 on the first intermediate pattern layer 28b. The lower pattern layer 26 and the upper pattern layer may include polysilicon. The second intermediate pattern layer 28b may include polysilicon and/or an insulating material.

Figure 16:
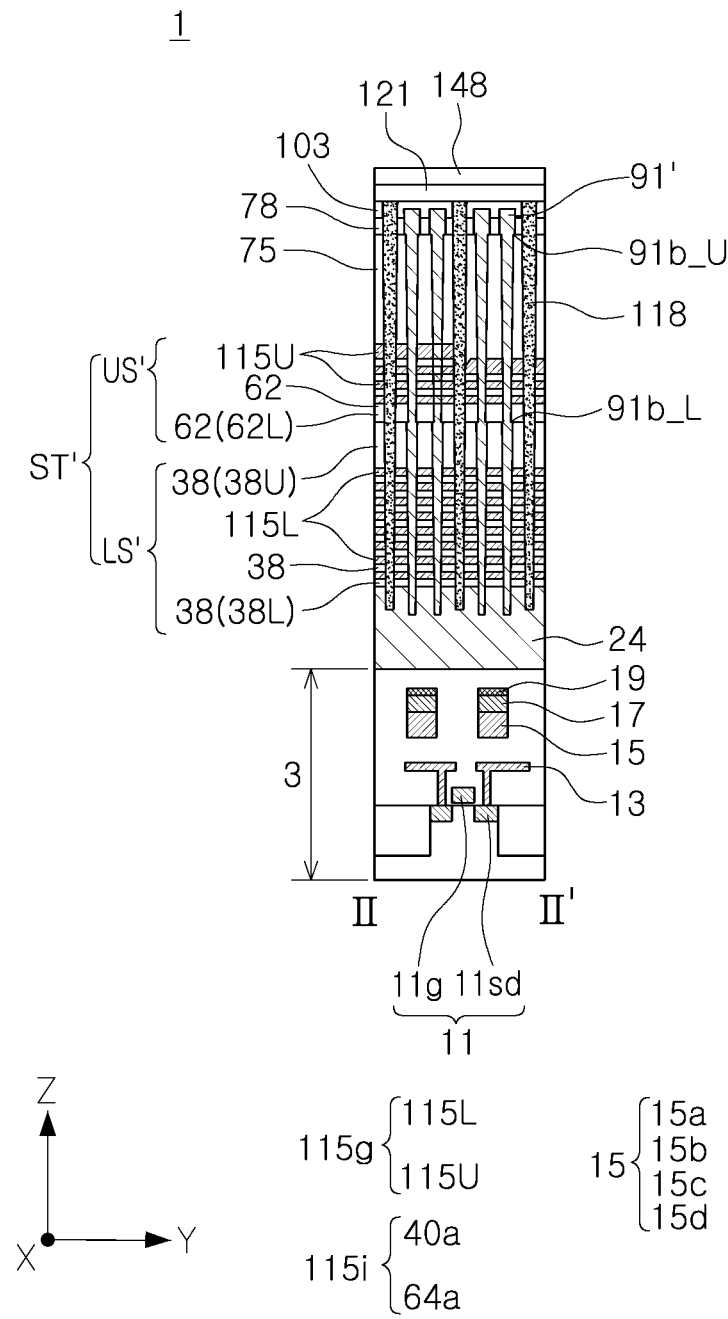
FIG. 16 is a cross-sectional diagram illustrating a modified example of a portion of a semiconductor device, according to an example embodiment of the present disclosure.

In the description below, a modified example of the support vertical structure 91 will be described with reference to FIG. 16. FIG. 16 is a cross-sectional diagram illustrating a modified example of the support vertical structure 91 in FIG. 3B.

Referring to FIG. 16, the support vertical structure 91' may have an upper surface disposed on a level higher than a level of the support structure 19 (in FIGS. 3B and 15) described above. For example, the upper surface of the support vertical structure 91' may be disposed on a level higher than a level of the upper surface of the memory vertical structure 81, and may be disposed on a level lower than a level of the contact plugs 138 and the upper surfaces of the separation structures 118.

The support vertical structure 91' may include a material different from a material of the memory vertical structure 81. For example, the support vertical structure 91' may not include the same material included in the data storage material layer 83b and the channel material layer 85 of the memory vertical structure 81. The support vertical structure 91' may be formed of silicon oxide.

Figure 17:
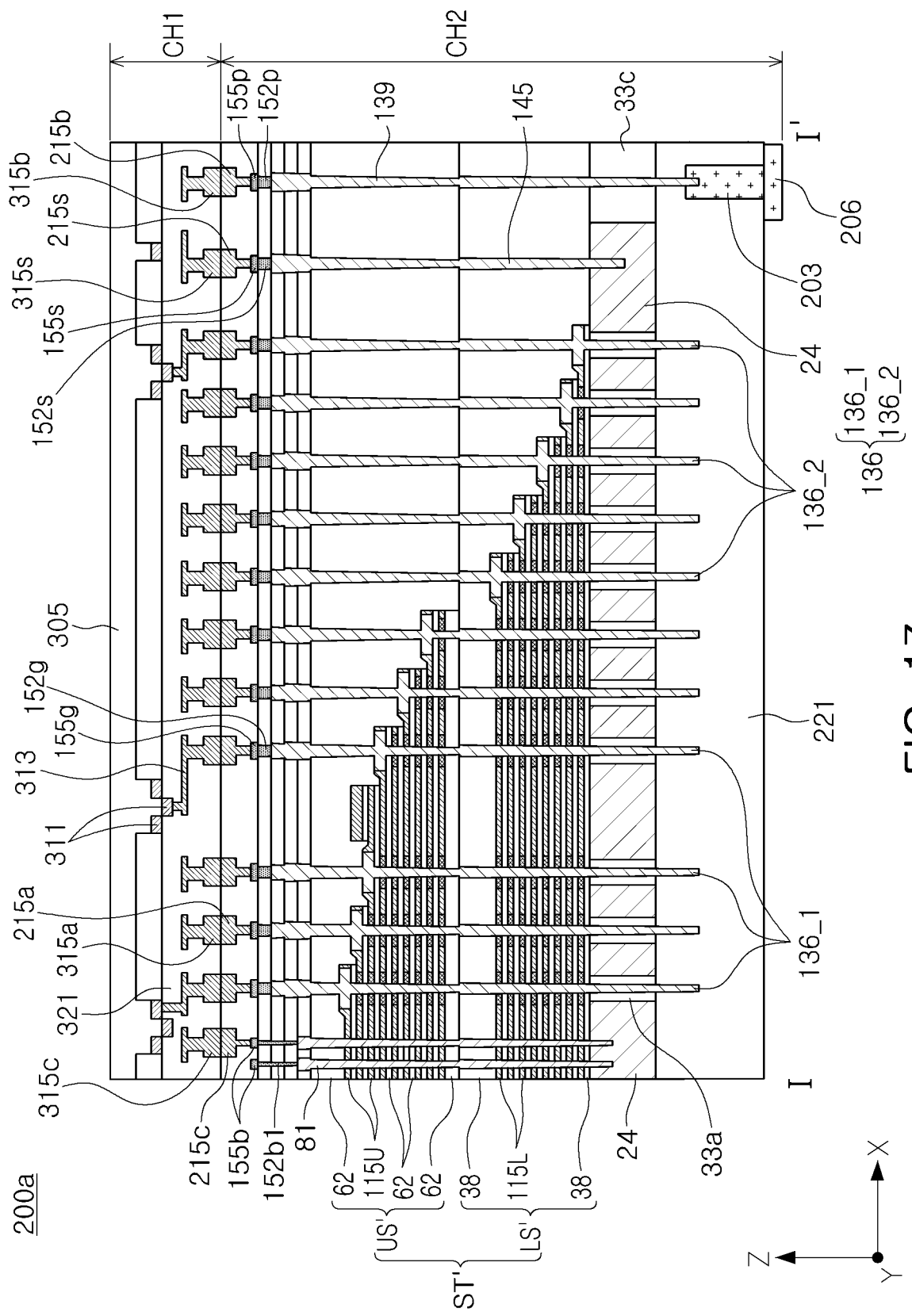
FIG. 17 is a cross-sectional diagram illustrating a modified example of a portion of a semiconductor device, according to an example embodiment of the present disclosure.

In the description below, a modified example of a semiconductor device will be described with reference to FIG. 17. FIG. 17 is a cross-sectional diagram illustrating a modified example of a semiconductor device according to an example embodiment.

Referring to FIG. 17, a semiconductor device 200a according to an example embodiment may include a first chip structure CH1 and a second chip structure CH2 bonded to the first chip structure CH1.

In an example, the second chip structure CH2 may include the pattern structure 24 having the openings as described above, the first intermediate insulating layer 33a and the external intermediate insulating layer 33c, the memory vertical structure 81, the stack structure ST', the gate contact plugs 136, the first peripheral contact plug 139 and the source contact plug 145, the bit line 155b, the source wiring 155s, and the peripheral wiring 155p.

The second chip structure CH2 may further include an insulating layer 221 disposed below the pattern structure 24, the first intermediate insulating layer 33a, and the external intermediate insulating layer 33c.

The second chip structure CH2 may further include gate connection plugs 152g disposed on the gate contact plugs 136 and gate wirings 155g on the gate connection plugs 152g.

The second chip structure CH2 may include first bonding patterns 215a, 215c, 215s, and 215b and a first bonding insulating layer 214 surrounding side surfaces of the first bonding patterns 215a, 215c, 215s, and 215b. The first bonding patterns 215a, 215c, 215s, and 215b may be electrically connected to the bit line 155b, the gate wires 155g, the source wiring 155s, and the peripheral wiring 155p. The first bonding patterns 215a, 215c, 215s, and 215b may include a metal material such as a copper material.

The second chip structure CH2 may further include an input and output pad 206 disposed below the insulating layer 221, and an input and output connection pattern 203 electrically connecting the input and output pad 206 to the first peripheral contact plug 139.

In an example, the first chip structure CH1 may include elements the same as those of the lower structure 3 as in the aforementioned example embodiment. For example, the first chip structure CH1 may include a semiconductor substrate 305, a peripheral circuit 311 and 313 disposed below the semiconductor substrate 305 and including a circuit device 311 and a peripheral wiring 313 electrically connected to the circuit device 311, second bonding patterns 315a, 315c, 315s, and 315b electrically connected to the peripheral wiring 313 and bonded to the first bonding patterns 215a, 215c, 215s, and 215b, and a second bonding insulating layer 314 bonded to the first bonding insulating layer 214.

Figure 18:
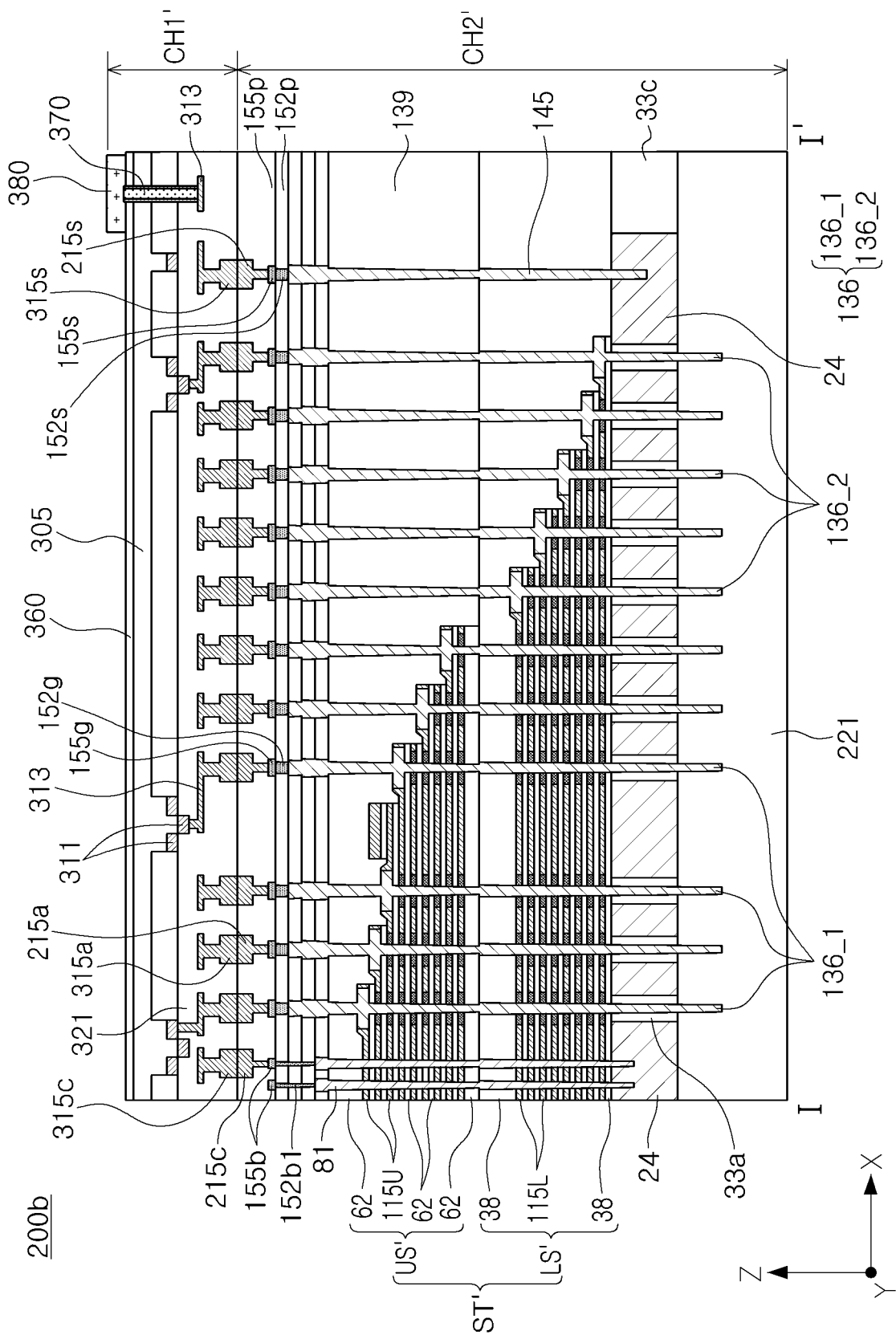
FIG. 18 is a cross-sectional diagram illustrating another modified example of a portion of a semiconductor device, according to an example embodiment of the present disclosure.

In the description below, a modified example of the semiconductor device will be described with reference to FIG. 18. FIG. 18 is a cross-sectional diagram illustrating a modified example of the semiconductor device in FIG. 17. In the description below, the modified portion of the semiconductor device 200a in FIG. 17 will be described.

Referring to FIG. 18, a semiconductor device 200b according to an example embodiment may include a first chip structure CH1 and a second chip structure CH2 bonded to the first chip structure CH1.

The first chip structure CH1 may further include a protective insulating layer 360 on the semiconductor substrate 305, an input and output pad 380 on the protective insulating layer 360, and an input and output through electrode 370 electrically connected to the input and output pad 380, penetrating the protective insulating layer 360 and the semiconductor substrate 305, and electrically connected to the circuit wiring 313.

In an example, in the second chip structure CH2 in FIG. 17, the input and output pad 206, the input and output connection pattern 203, and the first peripheral contact plug 139 in FIG. 17 may not be provided.

In another example, the second chip structure CH2 may have the same structure as in FIG. 17.

In the description below, an example of a method of forming a semiconductor device according to an example embodiment will be described with reference to FIGS. 19A to 27B. In FIGS. 19A to 27B, FIGS. 19A, 20A, 21A, 22A, 23, 24A, 25A, and 26A are cross-sectional diagrams taken along line I-I' in FIG. 1A. FIGS. 19B, 20B, 21B, 22B, 24B, and 26B are cross-sectional diagrams taken along lines II-IF and in FIG. 2A.

Figure 19A:
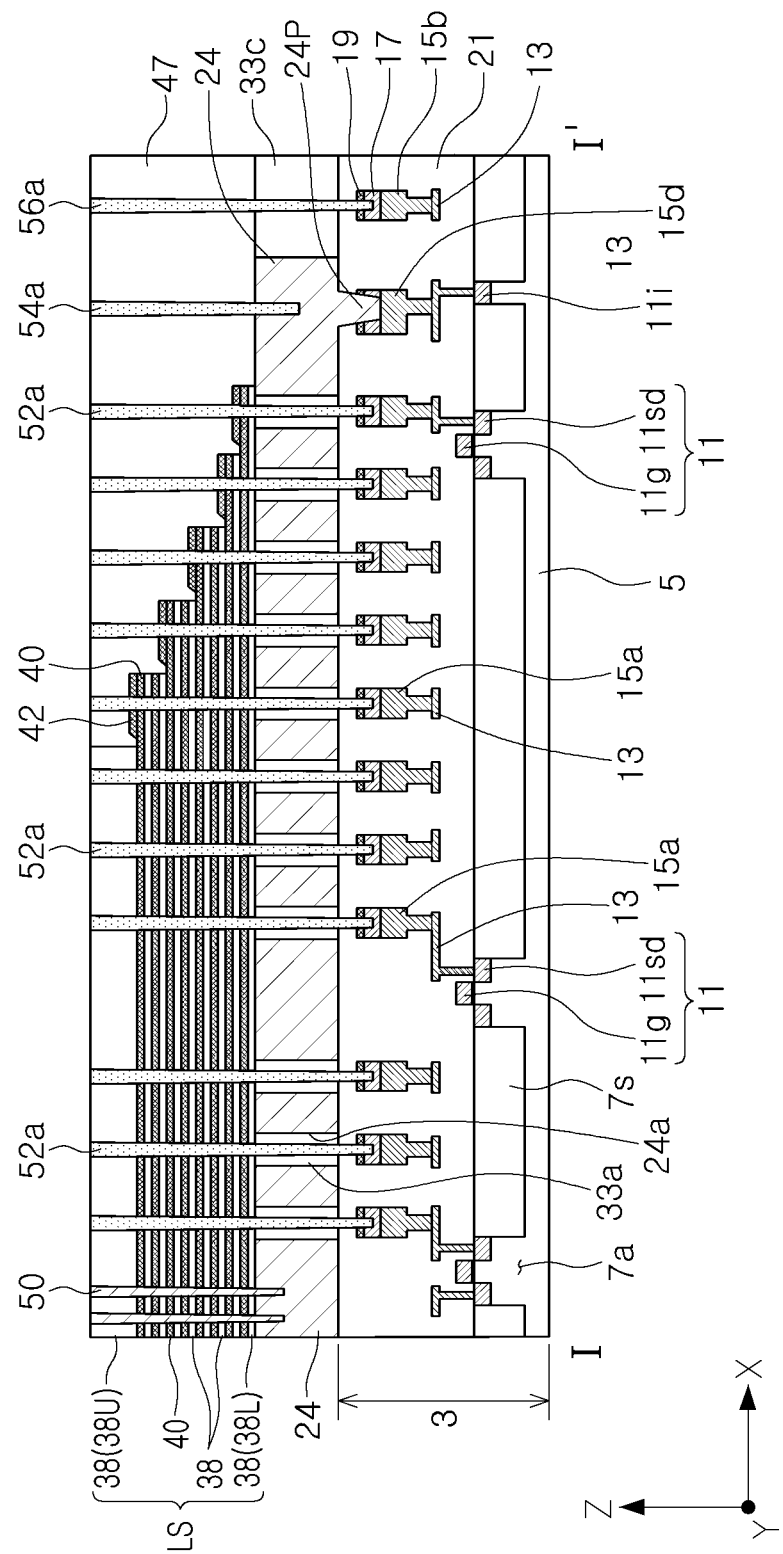
FIGS. 19A, 19B, 20A, 20B, 21A, 21B, 22A, 22B, 23, 24A, 24B, 25A, 25B, 26A, and 26B are cross-sectional diagrams illustrating a method of manufacturing a semiconductor device, according to an example embodiment of the present disclosure.
Figure 19B:
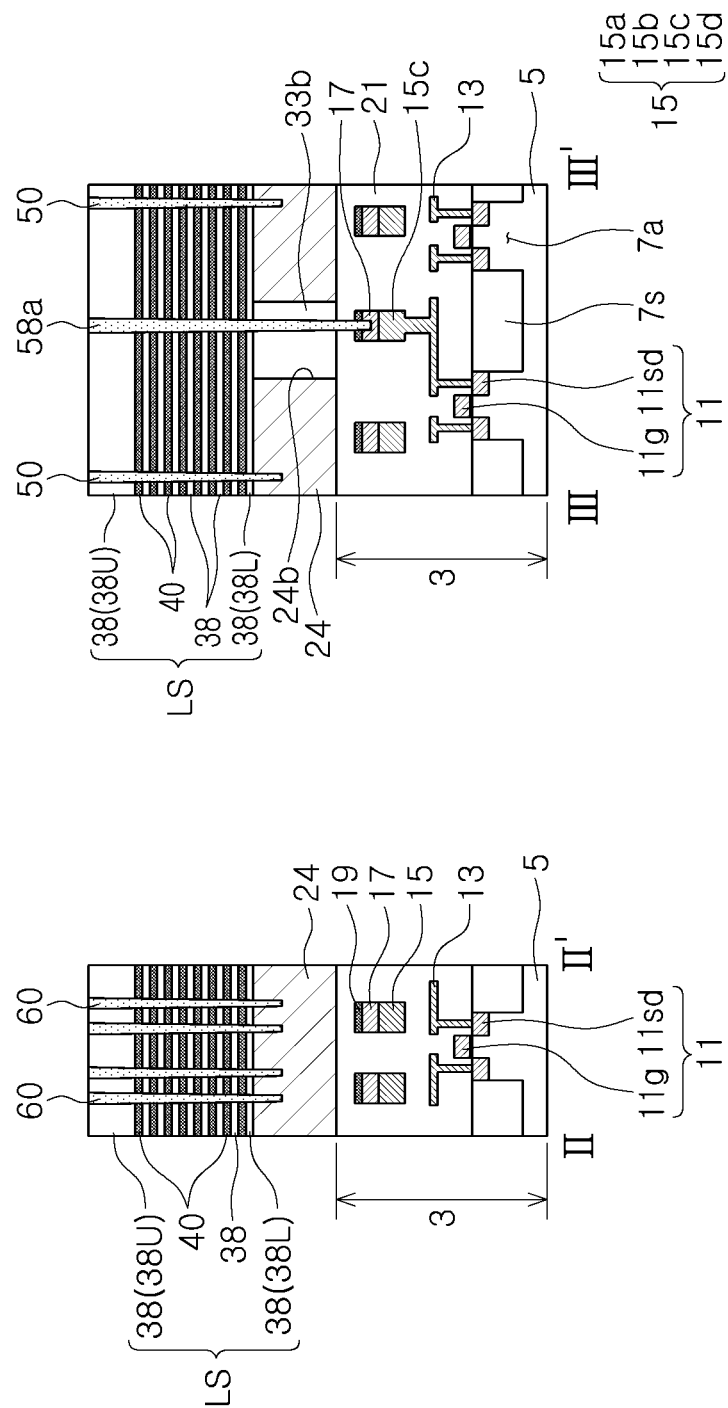

Referring to FIGS. 19A and 19B, a lower structure 3 may be formed. The lower structure 3 may include a semiconductor substrate 5, an isolation region 7s defining a peripheral active region 7a on the semiconductor substrate 5, peripheral circuits 11 and 13 formed on the semiconductor substrate 5, peripheral pads 15 electrically connected to the peripheral circuits 11 and 13, and a lower insulating layer 21 covering the peripheral circuits 11 and 13 and the peripheral pads 15 on the semiconductor substrate 5. The peripheral circuits 11 and 13 may include a circuit device 11 such as a transistor including a peripheral gate 11g and a peripheral source/drain 11sd, and a circuit wiring 13 electrically connected to the circuit device 11. The peripheral pads 15 may be electrically connected to the circuit wiring 13.

The peripheral pads 15 may include first to fourth peripheral pads 15a, 15b, 15c, and 15d. In an example, each of the peripheral pads 15 may include a conductive material, a metal material such as tungsten, for example.

The lower structure 3 may further include a capping layer 17 formed on each of the peripheral pads 15 and an etch stop layer 19 formed on the capping layer 17. In an example, the capping layer 17 may be formed of a silicon layer, and the etch stop layer 19 may be formed of an insulating material, silicon oxide or silicon nitride, for example.

A pattern structure 24 having first openings 24a and a second opening 24b may be formed on the lower structure 3.

In an example, the pattern structure 24 may be formed as a single layer, a silicon layer, for example.

In another example, the pattern structure 24 may include a plurality of pattern layers stacked in order. For example, the pattern structure 24 may include a lower pattern layer, an intermediate pattern layer on the lower pattern layer, and an upper pattern layer on the intermediate pattern layer. At least one of the lower pattern layer, the intermediate pattern layer, and the upper pattern layer may be a silicon layer. For example, the lower pattern layer and the upper pattern layer may be a silicon layer, and the intermediate pattern layer may be a material layer different from the silicon layer, such as a silicon oxide layer and/or a silicon nitride layer, for example.

In another example, the pattern structure 24 may include a metal layer and a silicon layer on the metal layer.

In an example, the pattern structure 24 may include a pattern via 24P extending downwardly from the lower surface of the pattern structure 24 and electrically connected to the fourth peripheral pad 15d. The pattern via 24P may be formed as a silicon layer.

Intermediate insulating layers filling the first and second openings 24a and 24b of the pattern structure 24 and formed on an external side of the pattern structure 24 may be formed. The intermediate insulating layers may be formed of silicon oxide. The intermediate insulating layers include first intermediate insulating layers 33a filling the first openings 24a, a second intermediate insulating layer 33b filling the second openings 24b, and an external intermediate insulating layer 33c formed on an external side of the pattern structure 24.

A preliminary lower stack structure LS may be formed on the pattern structure 24.

The preliminary lower layered structure LS may be formed by forming a lower interlayer insulating layers 38 and a lower horizontal layers 40 alternately and repeatedly stacked, forming lower pads of the lower horizontal layers 40 arranged in a staircase shape by patterning the lower interlayer insulating layers 38 and the lower horizontal layers 40, and forming lower pad layers 42 on the lower pads of the lower horizontal layers 40.

A first capping insulating layer 47 having an upper surface coplanar with an upper surface of the preliminary lower stack structure LS may be formed. The first capping insulating layer 47 may be formed of silicon oxide. The first capping insulating layer 47 may cover the lower pad layers 42, which are arranged in a staircase shape.

Lower sacrificial patterns penetrating the structure including the preliminary lower stack structure LS and the first capping insulating layer 47 may be formed. The forming the lower sacrificial patterns may include forming lower holes penetrating the structure including the preliminary lower stack structure LS and the first capping insulating layer 47 by performing a first semiconductor process including a photo process and an etching process each performed once, and filling the lower holes with a sacrificial material.

The lower sacrificial patterns may include a lower sacrificial memory vertical portion 50, lower sacrificial gate contact portions 52a, a lower sacrificial source contact portion 54a, a first lower sacrificial peripheral contact portion 56a, a second lower sacrificial contact portion 58a, and a lower sacrificial support vertical portion 60.

The lower sacrificial memory vertical portion 50, the lower sacrificial source contact portion 54a, and the lower sacrificial support vertical portion 60 may be in contact with the pattern structure 24. For example, lower surfaces of the lower sacrificial memory vertical portion 50, the lower sacrificial source contact portion 54a, and the lower sacrificial support vertical portion 60 may be below an upper surface of the pattern structure 24.

The lower sacrificial gate contact portions 52a may penetrate the first intermediate insulating layers 33a filling the first openings 24a and may be in contact with the capping layer 17 in contact with the first peripheral pads 15a. The first lower sacrificial peripheral contact portion 56a may penetrate the external intermediate insulating layer 33c and may be in contact with the capping layer 17 on the second peripheral pad 15b. The second lower sacrificial peripheral contact portion 58a may penetrate the second intermediate insulating layer 33b and may be in contact with the capping layer 17 on the third peripheral pad 15c.

Figure 20A:
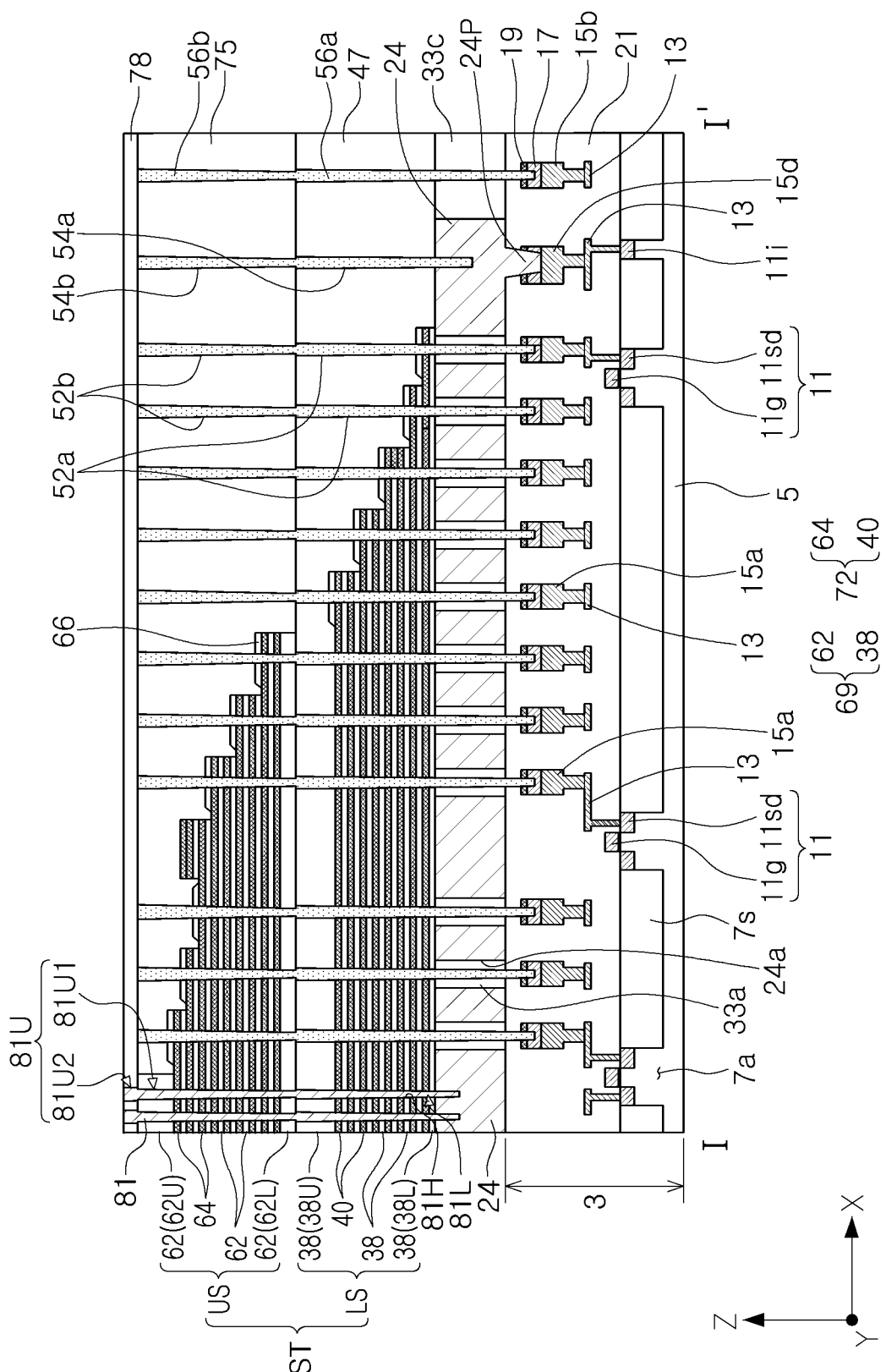
Figure 20B:
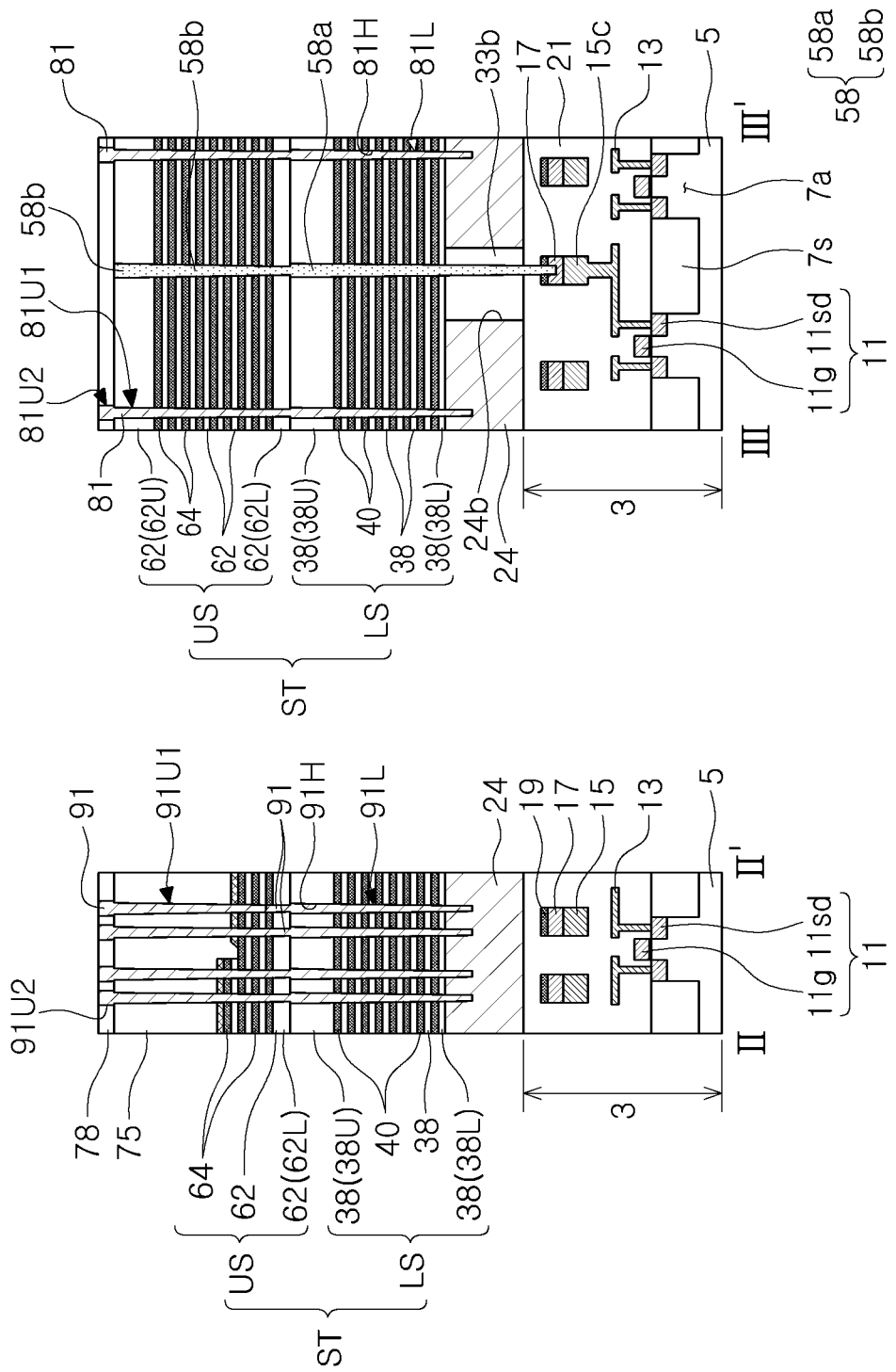

Referring to FIGS. 20A and 20B, a preliminary upper stack structure US may be formed on the preliminary lower stack structure LS and the first capping insulating layer 47.

The preliminary upper stack structure US may be formed by forming upper interlayer insulating layers 62 and upper horizontal layers 64 alternately and repeatedly stacked, forming upper pads of the upper horizontal layers 64 arranged in a staircase shape by patterning the upper interlayer insulating layers 62 and the lower horizontal layers 64, forming upper pads of the upper horizontal layers 64 arranged in a staircase shape, and forming upper pad layers 66 on the upper pads of the upper horizontal layers 64.

The preliminary lower stack structure LS and the preliminary upper stack structure US may form a preliminary stack structure ST. The lower interlayer insulating layers 38 and the upper interlayer insulating layers 62 may form interlayer insulating layers. The lower horizontal layers 40 and the upper horizontal layers 64 may form preliminary horizontal layers. In an example, the interlayer insulating layers may be formed of silicon oxide, the lower and upper horizontal layers 40 and 64 may be formed of a first silicon nitride, and the lower and upper pad layers 42 and 66 may be formed of a second silicon nitride.

The upper pad layers 66 may be arranged in a staircase shape. Accordingly, the lower and upper pad layers 42 and 66 may be arranged in a staircase shape. The lower and upper pad layers 42 and 66 may overlap the first intermediate insulating layers 33a filling the first openings 24a of the pattern structure 24 in a vertical direction Z.

A second capping insulating layer 75 having an upper surface coplanar with the upper surface of the preliminary stack structure ST may be formed. The second capping insulating layer 75 may be formed of silicon oxide. The second capping insulating layer 75 may cover the first capping insulating layer 47 and the upper pad layers 66 arranged in a staircase shape.

Upper sacrificial patterns penetrating the structure including the preliminary upper stack structure US and the second capping insulating layer 75 may be formed. The forming the upper sacrificial patterns may include forming first upper holes penetrating the structure including the preliminary upper stack structure US and the second capping insulating layer 45 by performing a second semiconductor process including a photo process and an etching process each performed once, and filling the first upper holes with a sacrificial material.

The upper sacrificial patterns may include an upper sacrificial memory vertical portion (the portion 81U1 in FIG. 20A), upper sacrificial gate contact portions 52b, an upper sacrificial source contact portion 54b, a first upper sacrificial peripheral contact portion 56b, a second upper sacrificial contact portion 58b, and an upper sacrificial support vertical portion (the portion 91U1 in FIG. 20B).

The upper sacrificial memory vertical portion may be formed on the lower sacrificial memory vertical portion 50 (in FIGS. 19A and 19B), and the upper sacrificial source contact portion 54b may be formed on the lower sacrificial source contact portion 54a. The upper sacrificial support vertical portion may be formed on the lower sacrificial support vertical portion 60 (in FIG. 19B), and the upper sacrificial gate contact portions 52b may be formed on the lower sacrificial gate contact portions 52a. The first upper sacrificial peripheral contact portion 56b may be formed on the first lower sacrificial peripheral contact portion 56a, and the second upper sacrificial contact portion 58b may be formed on the second lower sacrificial peripheral contact portion 58a.

A third capping insulating layer 78 may be formed on the preliminary stack structure ST and the second capping insulating layer 75.

Second upper holes exposing the upper sacrificial memory vertical portion (the portion 81U1 in FIG. 20A) and the upper sacrificial support vertical portion (the portion 91U1 in FIG. 20B), penetrating the third capping insulating layer 78, may be performed by performing a third semiconductor process including a photo process and an etching process each performed once. Thereafter, the upper sacrificial memory vertical portion (the portion 81U1 in FIG. 20A), the lower sacrificial memory vertical portion (the portion 81L in FIGS. 20A and 20B), the upper sacrificial support vertical portion (the portion 91U1 in FIG. 20B) and the lower sacrificial support vertical portion (the portion 91L in FIG. 20B) may be selectively removed to form memory vertical holes 81H and support vertical holes 91H.

In an example, vertical structures simultaneously filling the memory vertical holes 81H and the support vertical holes 91H may be formed. For example, memory vertical structures 81 may be formed in the memory vertical holes 81H, and support vertical structures 91 may be formed in the support vertical holes 91H.

In an example, the forming the memory vertical structures 81 and the support vertical structures 91 may include forming a dielectric structure on side surfaces of each of the vertical holes 81H and 91H, forming channel layer covering the dielectric structure in the vertical holes 81H and 91H, forming a core region partially filling each of the vertical holes 81H and 91H on the channel layer, and forming a pad pattern filling the upper region of the vertical holes 81H and 91H on the core region.

Figure 21A:
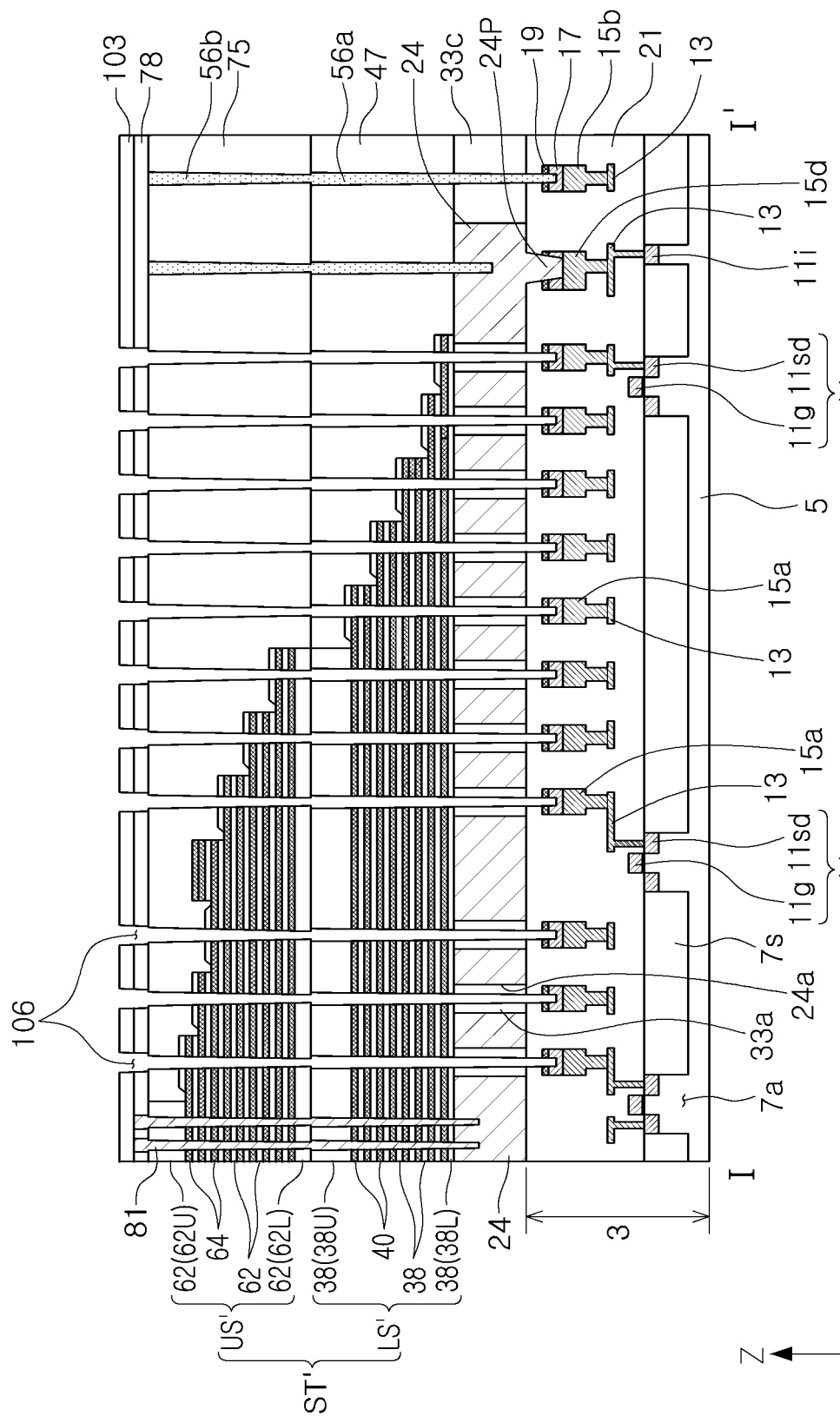
Figure 21B:
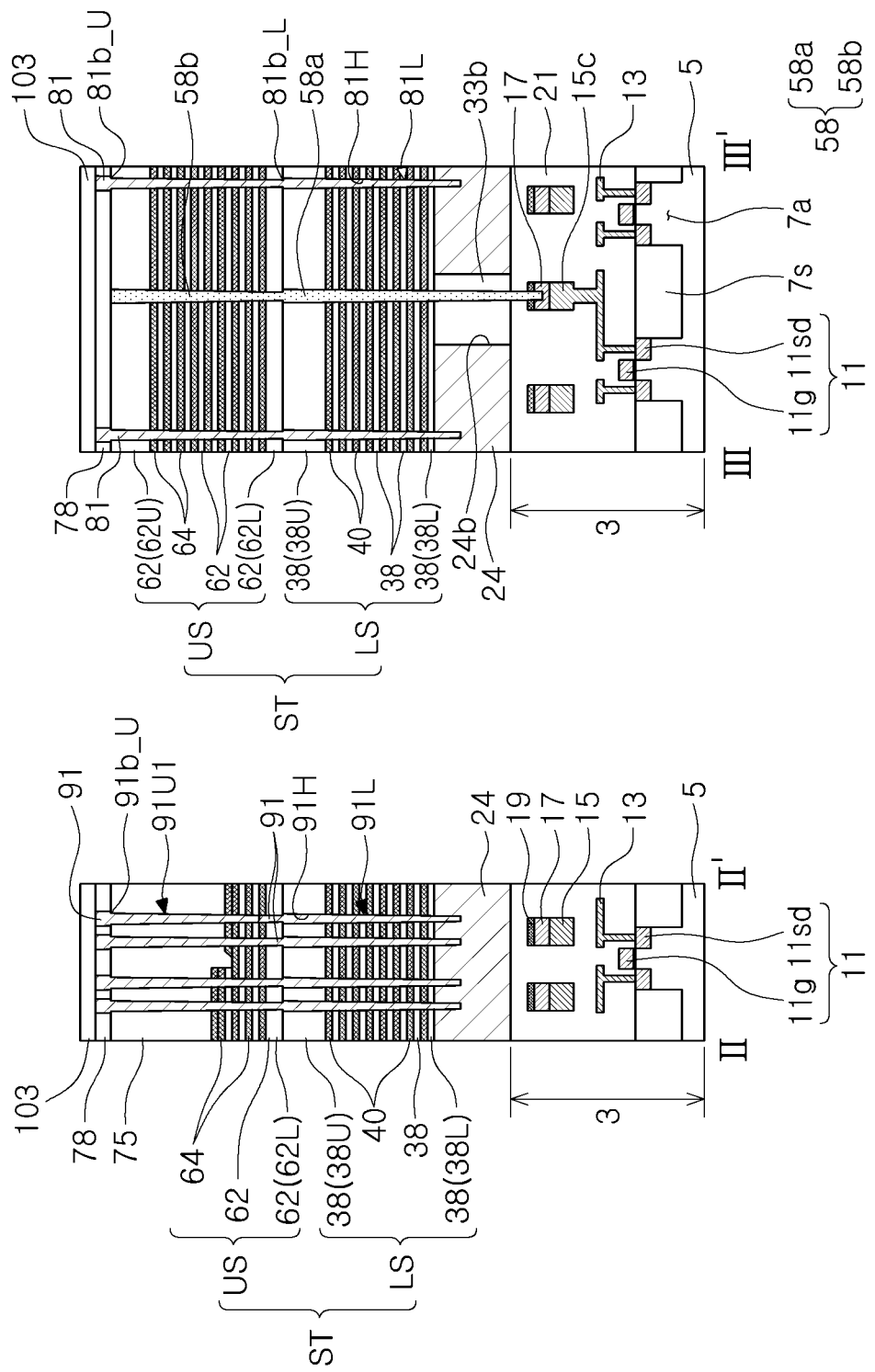

Referring to FIGS. 21A and 21B, a fourth capping insulating layer 103 may be formed on the third capping insulating layer 78.

Third upper holes penetrating the third and fourth capping insulating layers 78 and 103 may be formed by performing a fourth semiconductor process including a photo process and an etching process each performed once. The third upper holes may expose the upper sacrificial gate contact portions 52b.

Thereafter, gate contact holes 106 including the third upper holes may be formed by etching the upper sacrificial gate contact portions 52b and the lower sacrificial gate contact portions 52a in order.

Figure 22A:
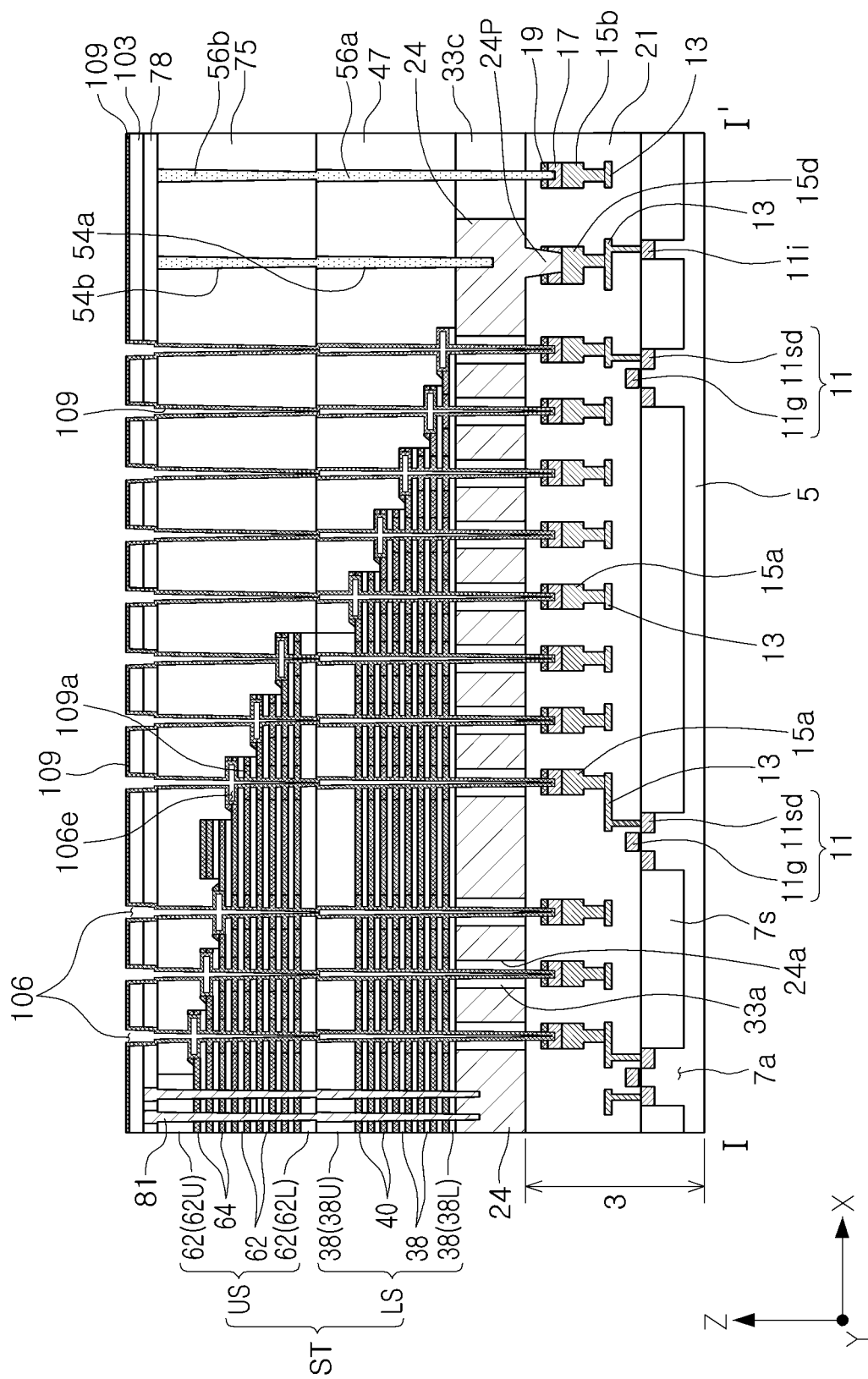
Figure 22B:
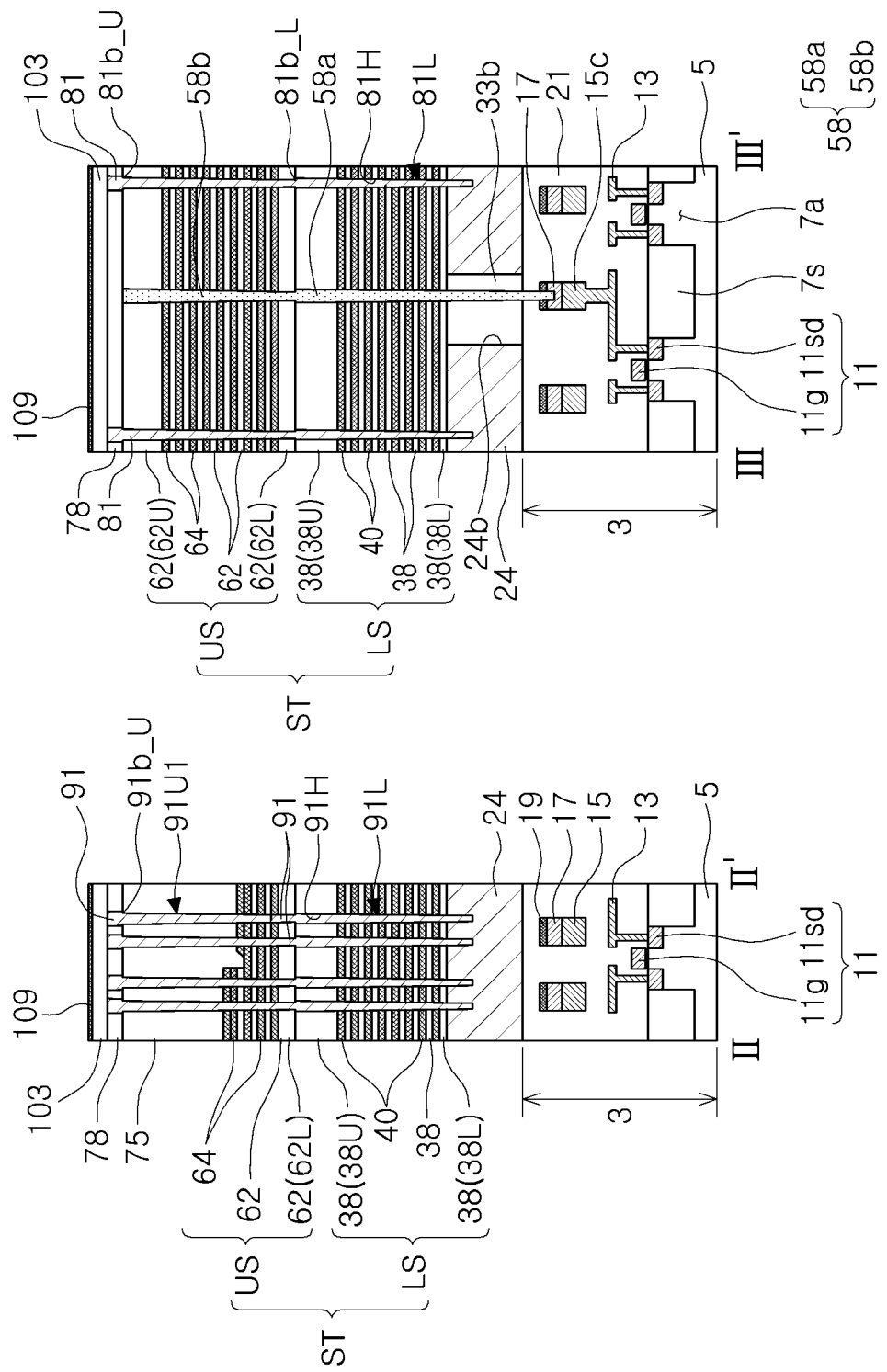

Referring to FIGS. 22A and 22B, extended holes extending from the gate contact holes 106 may be formed by partially etching the preliminary horizontal layers (e.g., lower horizontal layers 40 and the upper horizontal layers 64) and the lower and upper pad layers 42 and 66 exposed by the gate contact holes 106.

Portions of the preliminary horizontal layers in contact with the lower and upper pad layers 42 and 66 and the lower and upper pad layers 42 and 66 may be defined as pad portions.

A thickness of each of the pad portions may be greater than a thickness of each of the preliminary horizontal layers. Accordingly, in the expanded holes, the pad portions may be etched earlier than the preliminary horizontal layers due to an etching loading effect. In another example, when the lower and upper pad layers 42 and 66 are formed of a material etched earlier than the material of the preliminary horizontal layers, the pad portions may be etched earlier than the preliminary horizontal layers.

Among the expanded holes, expanded holes formed by etching the pad portions may be defined as pad expanded holes 106e. The pad expanded holes 106e may be arranged in a staircase shape.

A buffer insulating layer 109 may be formed on the structure in which the gate contact holes 106 and the expanded holes are formed.

The buffer insulating layer 109 may cover sidewalls of the gate contact holes 106, may not fill the pad expanded holes 106e among the extended holes and may conformally cover internal walls of the pad expanded holes 106e, may fill the other expended holes, and may cover an upper portion of the fourth capping insulating layer. Among the expanded holes, the buffer insulating layer 109 filling the other expanded holes other than the pad expanded holes 106e may be defined as buffer insulating patterns 109a.

In an example, the buffer insulating layer 109 may be formed of silicon oxide.

In another example, the buffer insulating layer 109 may be formed of a high-k dielectric (e.g., AlO, HfO, or the like).

Figure 23:
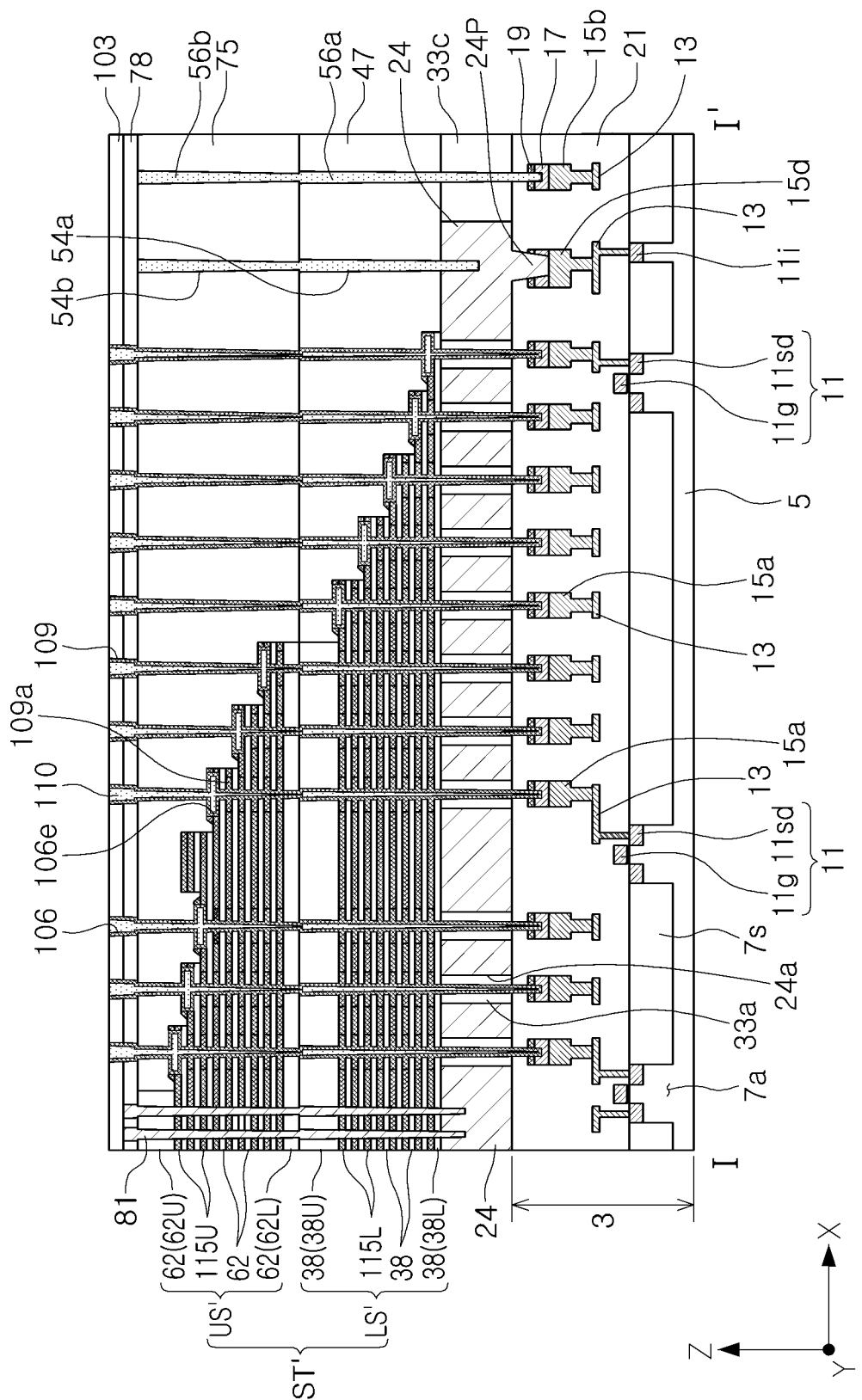

Referring to FIG. 23, sacrificial gate contact plugs 110 filling the gate contact holes 106 and the pad expanded holes 106e may be formed on the buffer insulating layer 109.

Figure 24A:
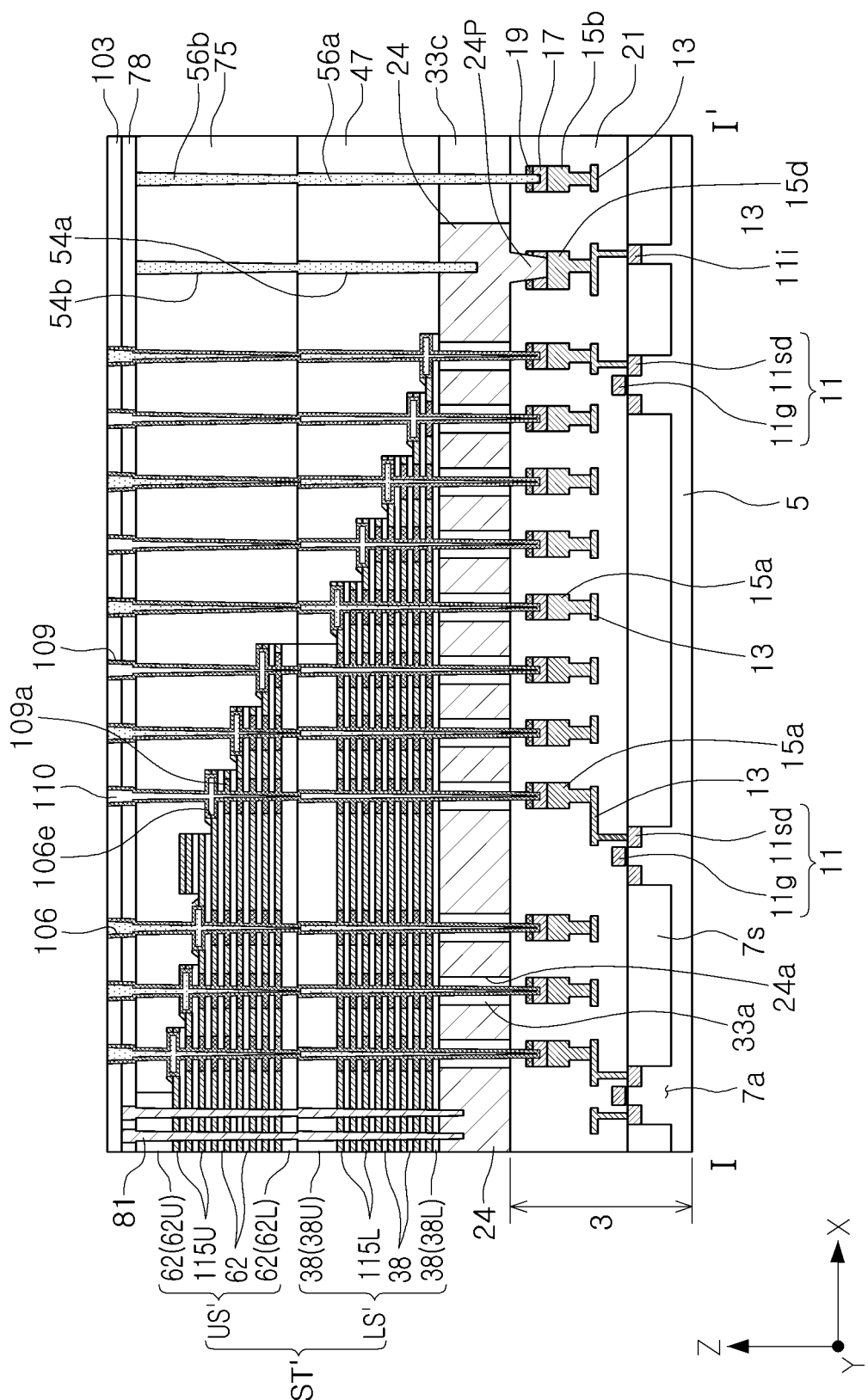
Figure 24B:
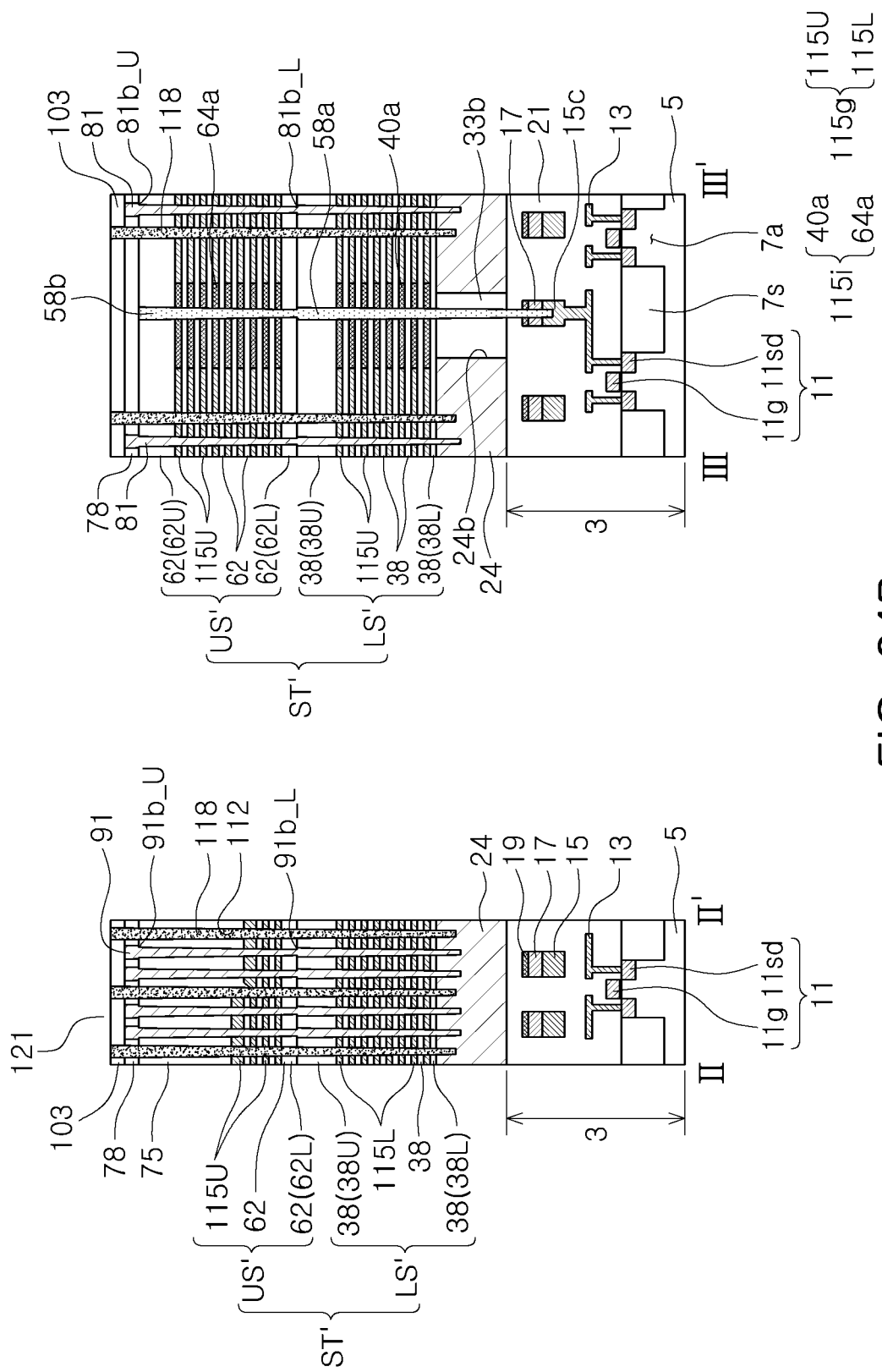

Referring to FIGS. 24A and 24B, separation trenches 112 may be formed. A structure formed up to the fourth capping insulating layer 103 on the pattern structure 24 may be penetrated. The lower and upper horizontal layers 40 and 64 of the preliminary stack structure ST may be exposed by the separation trenches 112.

Empty spaces may be formed by etching the lower and upper horizontal layers 40 and 64 exposed by the separation trenches 112 and etching the lower and upper pad layers 42 and 66, and gate layers 115g may be formed in the empty spaces. Gate layers formed in the space from which the lower horizontal layers 40 and the lower pad layers 42 are removed may be referred to as lower gate layers 115L, and gate layers formed in the space from which the upper horizontal layers 64 and the upper pad layers 66 may be referred to as upper gate layers 115U.

In an example, the lower and upper horizontal layers 40 and 64 may remain, and may be formed as lower and upper insulating horizontal layers 40a and 64a. The lower and upper insulating horizontal layers 40a and 64a may form insulating horizontal layers 115i.

Accordingly, the preliminary lower stack structure LS may be formed as a lower stack structure LS' including the lower gate layers 115L. The preliminary upper stack structure US may be formed as an upper stack structure US' filling the upper gate layers 115U. Accordingly, the preliminary stack structure ST may be formed as a stack structure ST'.

Separation structures 118 filling the separation trenches 112 may be formed. In an example, the separation structures 118 may be formed of an insulating material, silicon oxide, for example. In another example, each of the separation structures 118 may include an insulating spacer covering side surface of the separation trench 112 and conductive patterns filling the other portion of the separation trench 112.

Figure 25A:
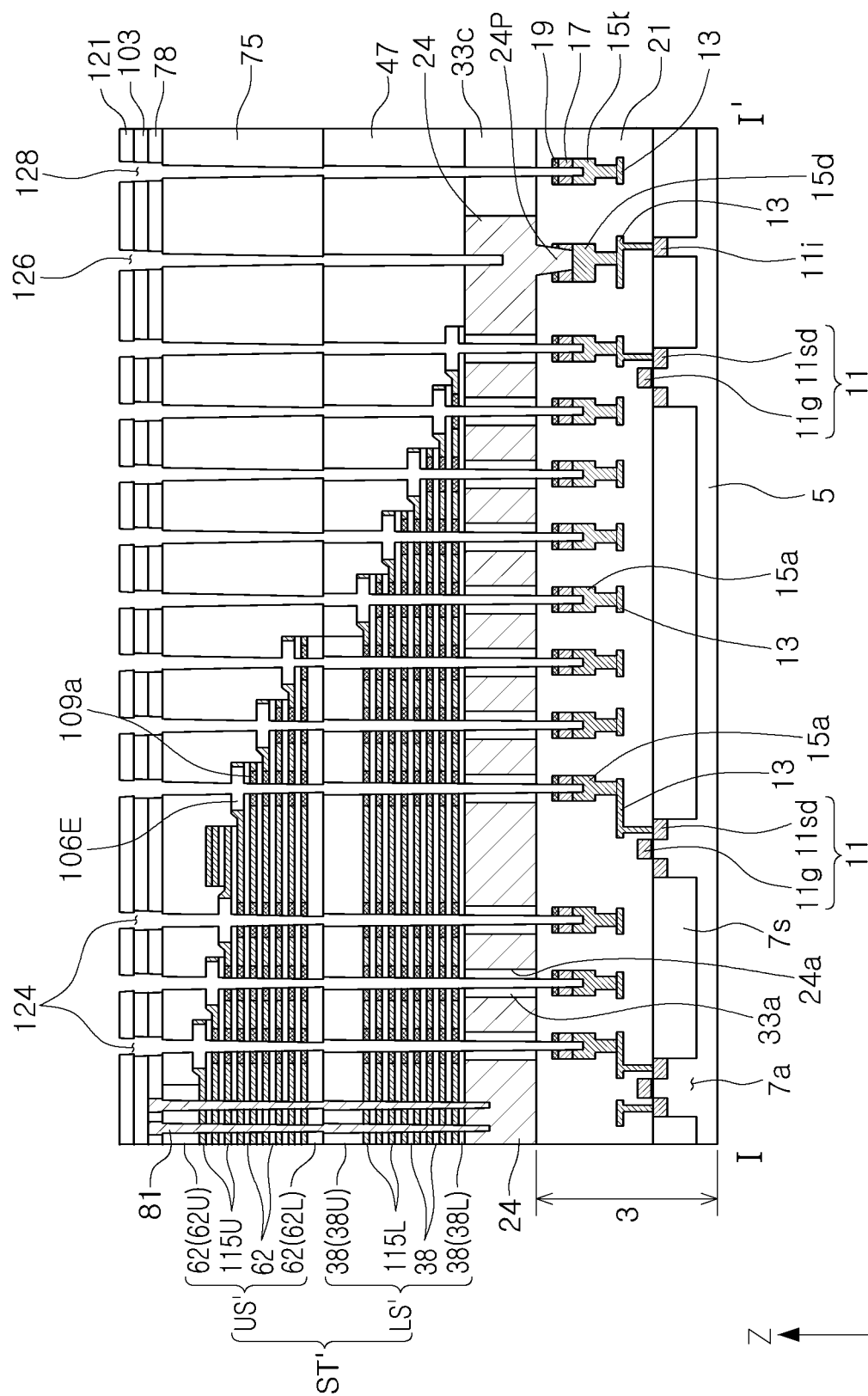
Figure 25B:
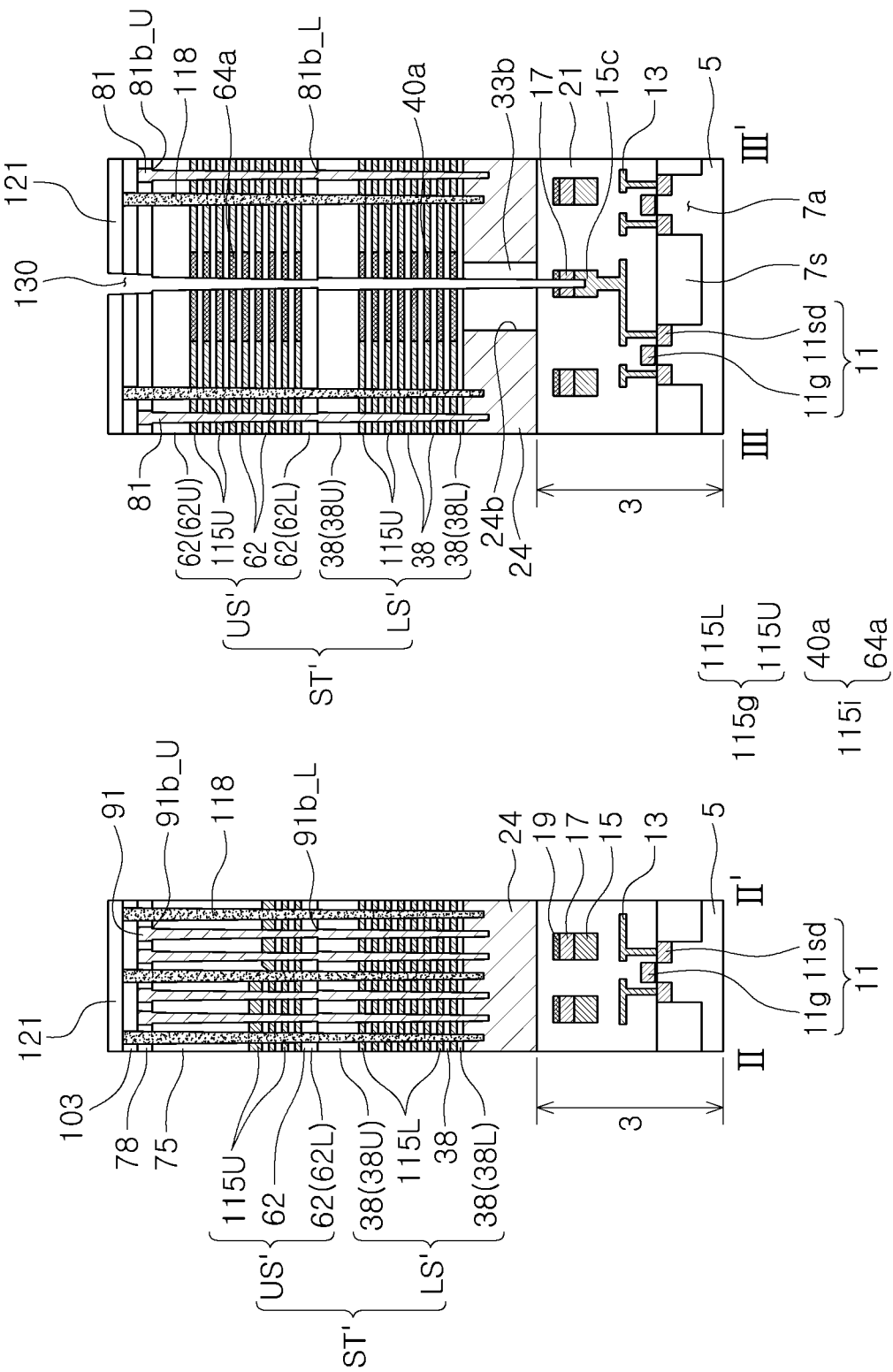

Referring to FIGS. 25A and 25B, a fifth capping insulating layer 121 may be formed on the fourth capping insulating layer 103.

Fourth upper holes penetrating the fifth capping insulating layer 121 may be formed by performing a fifth semiconductor process including a photo process and an etching process each performed once. The fourth upper holes may expose the sacrificial gate contact plugs 110, the upper sacrificial source contact portion 54b, the first upper sacrificial peripheral contact portion 56b, and the second upper sacrificial contact portion 58b. Thereafter, the fourth upper holes may expose the peripheral pads 15 by removing the sacrificial gate contact plugs 110, the upper sacrificial source contact portion 54b, the first upper sacrificial peripheral contact portion 56b, and the second upper sacrificial contact portion 58b, etching the lower sacrificial source contact portion 54a, the first lower sacrificial peripheral contact portion 56a, and the second lower sacrificial contact portion 58a, and etching the capping layer 17. Accordingly, gate contact holes 124 exposing the first peripheral pads 15a, first peripheral contact holes 128 exposing the second peripheral pad 15b, second peripheral contact hole 130 exposing the third peripheral pad 15c, and a source contact hole 126 exposing the pattern structure 24 may be formed.

The buffer insulating patterns 109a may be partially etched until the conductive material portions of the gate layers 115g are exposed in the gate expanded holes 106E.

Among the buffer insulating patterns 109a, the buffer insulating patterns 109a formed in the gate expanded holes 106E may be removed, and the buffer insulating patterns 109a formed below the gate expanded holes 106E may remain.

Figure 26A:
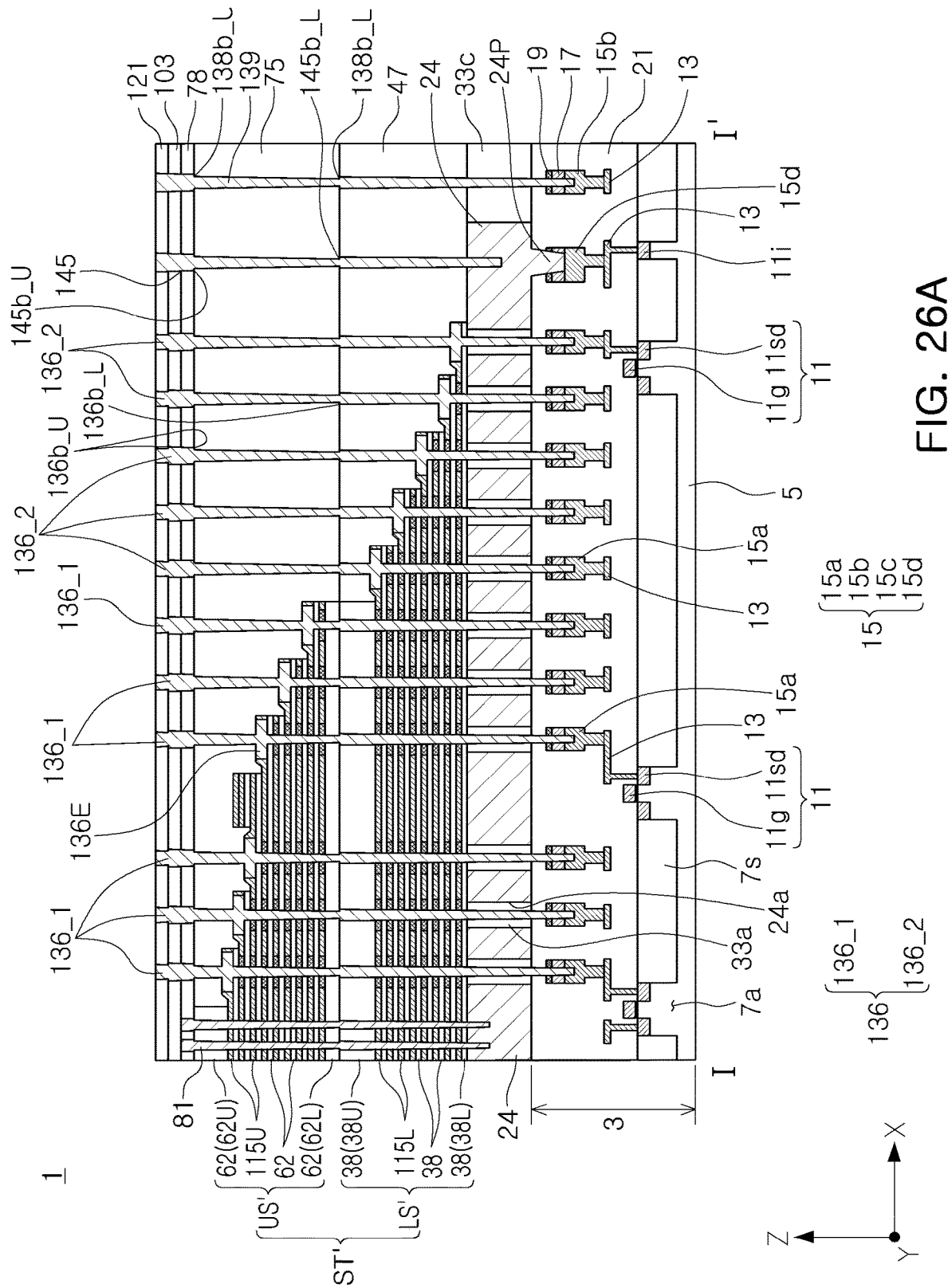
Figure 26B:
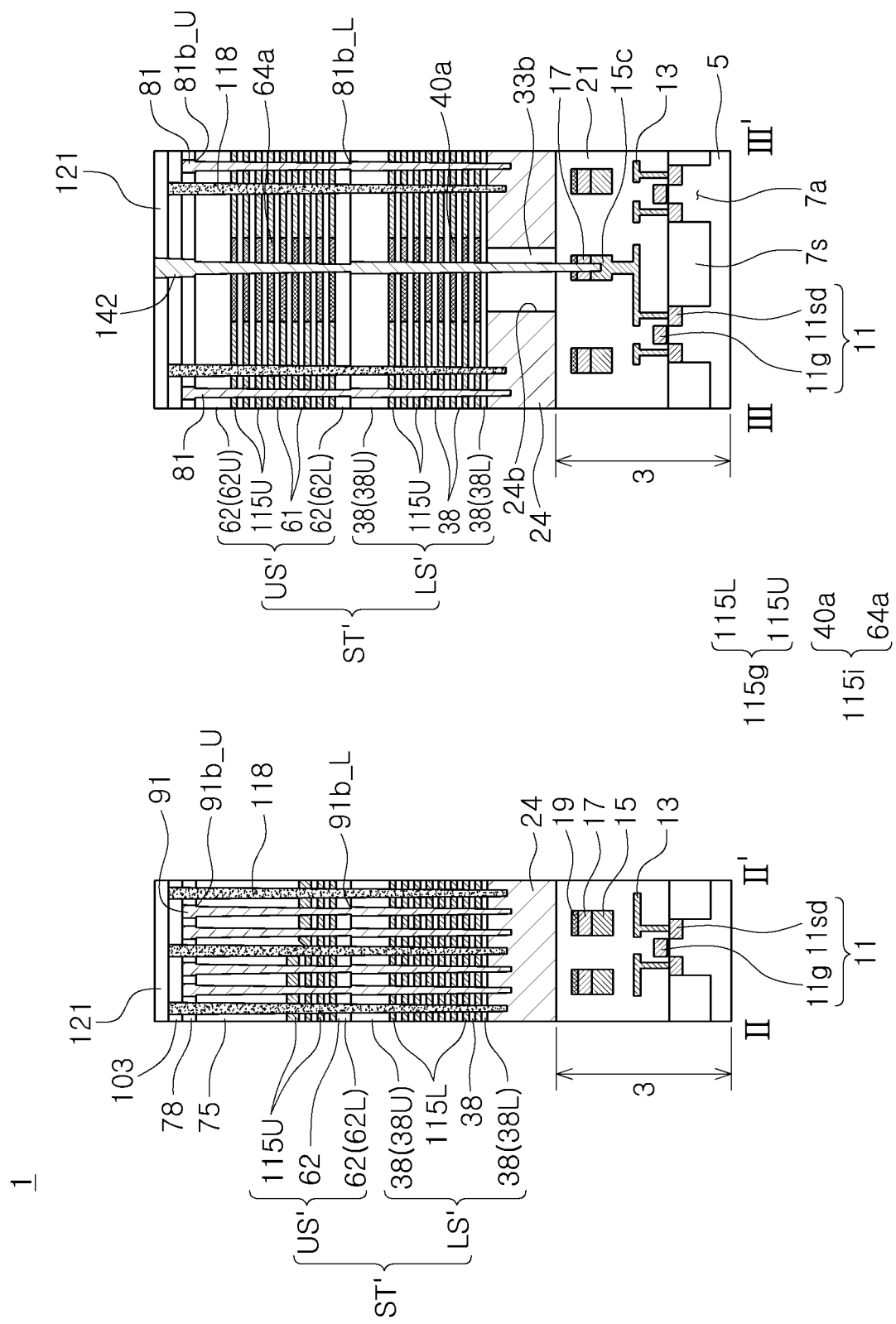

Referring to FIGS. 26A and 26B, the gate contact plugs 136, the first peripheral contact plug 139, the second peripheral contact plug 142, and the source contact plug 145 which may fill the gate contact holes 124, the first peripheral contact hole 128, the second peripheral contact hole 130, and the source contact hole 126 may be formed simultaneously.

In the above-described example embodiments, the gate contact holes 124 may be formed by the four photo processes, a first semiconductor process including a photo process and an etching process performed once described in FIGS. 19A and 19B, a second semiconductor process including a photo process and an etching process performed once described in FIGS. 20A and 20B, a fourth semiconductor process including a photo process and an etching process performed once, described in FIGS. 21A and 21B, and a fifth semiconductor process including a photo process and an etching process performed once, described in FIGS. 25A and 25B.

In the above-described example embodiments, the first peripheral contact hole 128, the second peripheral contact hole 130, and the source contact hole 126 may be formed by three photo processes, the first semiconductor process, the second semiconductor process, and the fifth semiconductor process.

By the photo processes performed in different stages, side surface profiles of the gate contact holes 124, the first peripheral contact hole 128, the second peripheral contact hole 130, and the source contact hole 126 may be determined. Accordingly, the gate contact holes 124 may have three bending portions formed by four photo processes performed in different stages on a side surface taken in one direction, and the first peripheral contact hole 128, the second peripheral contact hole 130, and the source contact hole 126 may have two bending portions by three photo processes performed in different stages on a side surface taken in one direction. The side surface profiles of the gate contact holes 124, the first peripheral contact hole 128, the second peripheral contact hole 130, and the source contact hole 126 may be substantially the same as the side surface profiles of the gate contact plugs 136, the first peripheral contact plug 139, the second peripheral contact plug 142, and the source contact plug 145.

As described above, by simultaneously forming the gate contact plugs 136, the first peripheral contact plugs 139, the second peripheral contact plugs 142, and the source contact plug 145 which fill the gate contact holes 124, the first peripheral contact holes 128, the second peripheral contact holes 130, and the gate contact holes 124, respectively, formed through several photo processes and etching processes, the gate contact plugs 136, the first peripheral contact plug 139, the second peripheral contact plug 142, and the source contact plug 145 may be formed stably with reliability. Therefore, reliability of the semiconductor device may improve.

Figure 27:
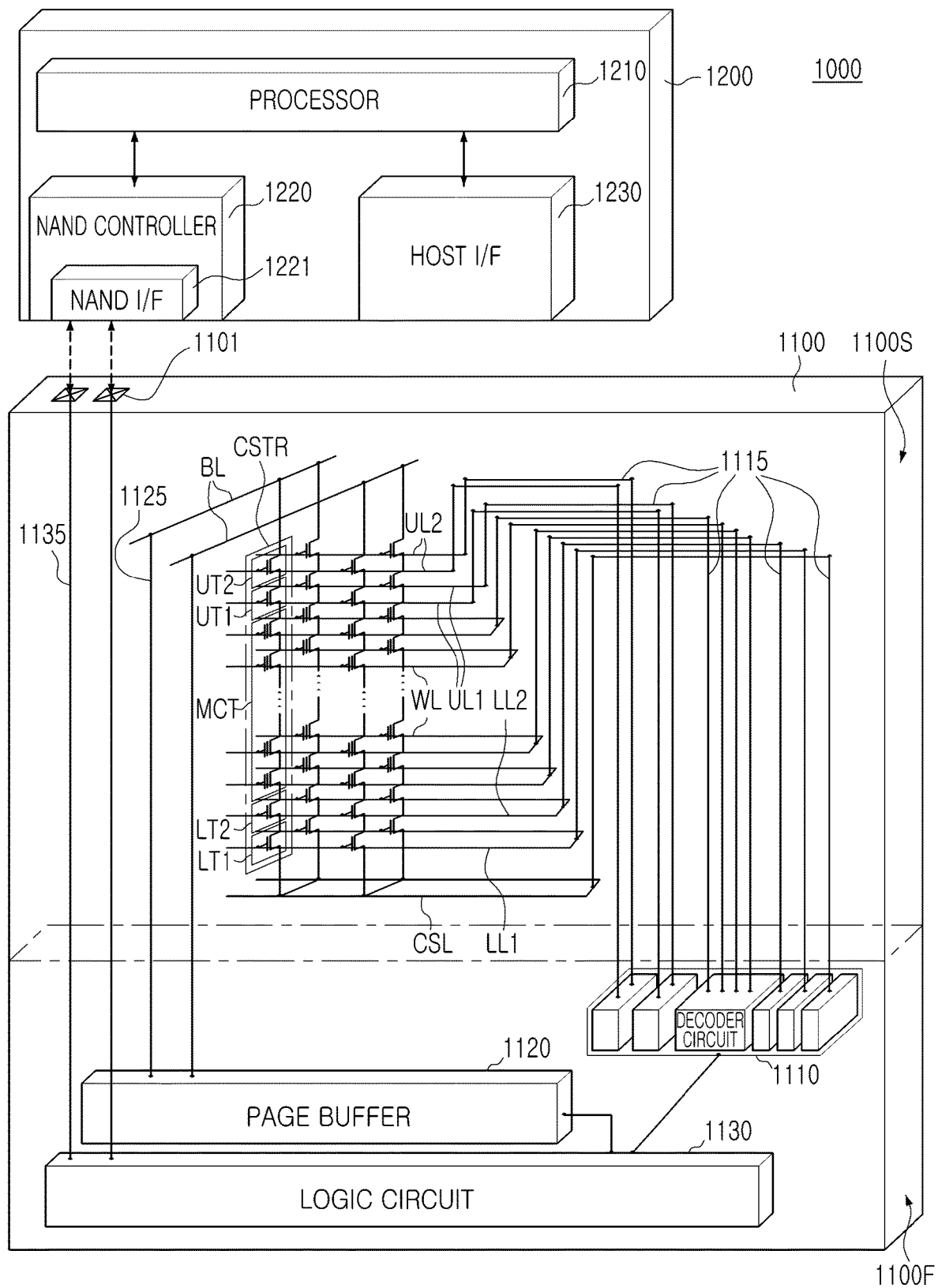
FIG. 27 is a diagram illustrating a data storage system including a semiconductor device, according to an example embodiment of the present disclosure.

FIG. 27 is a diagram illustrating a data storage system including a semiconductor device according to an example embodiment.

Referring to FIG. 27, a data storage system 1000 in the example embodiment may include a semiconductor device 1100 and a controller 1200 electrically connected to the semiconductor device 1100. The data storage system 1000 may be implemented as a storage device including the semiconductor device 1100 or an electronic device including a storage device. For example, the data storage system 1000 may be implemented by a solid state drive device (SSD) device, a universal serial bus (USB), a computing system, a medical device, or a communication device, including the semiconductor device 1100.

In the example embodiment, the data storage system 1000 may be implemented as an electronic system storing data.

The semiconductor device 1100 may be implemented by the semiconductor device described in the aforementioned example embodiments with reference to FIGS. 1 to 18, or the semiconductor device manufactured by the method of manufacturing a semiconductor device described in the aforementioned example embodiments with reference to FIGS. 19A to 26B. The semiconductor device 1100 may include a first structure 1100F and a second structure 1100S on the first structure 1100F.

The first structure 1100F may be implemented as a peripheral circuit structure including a decoder circuit 1110, a page buffer 1120, and a logic circuit 1130. For example, the first structure 1100F may include the peripheral circuit (the peripheral circuit 11 in FIG. 3A or the peripheral circuit 311 in FIGS. 17 and 18) described in the aforementioned example embodiment.

The second structure 1100S may be configured as a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

The pattern structure 24 described in the aforementioned example embodiment may include a silicon layer having N-type conductivity, and the silicon layer having N-type conductivity may be configured as the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be varied in example embodiments.

In example embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

The gate layers 115g described in the aforementioned example embodiment may form the gate lower lines LL1 and LL2, the word lines WL, and the gate upper lines UL1 and UL2.

In example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each in series. At least one of the lower erase control transistor LT1 and the upper erase control transistor UT1 may be used for an erase operation of erasing data stored in the memory cell transistors MCT using a gate induced leakage current (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection wirings 1115 extending from the first structure 1100F to the second structure 1100S.

The bit lines BL may be electrically connected to the page buffer 1120 through second connection wirings 1125 extending from the first structure 1100F to the second structure 1100S. The bit lines BL may be the bit lines 155b described in the aforementioned example embodiment.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by a logic circuit 1130. The semiconductor device 1000 may communicate with the controller 1200 through the input and output pad 1101 electrically connected to the logic circuit 1130. The input and output pad 1101 may be electrically connected to the logic circuit 1130 through an input and output connection line 1135 extending from the first structure 1100F to the second structure 1100S.

The controller 1200 may include a processor 1210, a NAND controller 1220, and a host interface 1230. In example embodiments, the data storage system 1000 may include a plurality of semiconductor devices 1100, and in this case, the controller 1200 may control the plurality of semiconductor devices 1000.

The processor 1210 may control overall operation of the data storage system 1000 including the controller 1200. The processor 1210 may operate according to a predetermined firmware, and may access the semiconductor device 1100 by controlling the NAND controller 1220. The NAND controller 1220 may include a NAND interface 1221 for processing communication with the semiconductor device 1100. A control command for controlling the semiconductor device 1100, data to be written in the memory cell transistors MCT of the semiconductor device 1100, and data to be read from the memory cell transistors MCT of the semiconductor device 1100 may be transmitted through the NAND interface 1221. The host interface 1230 may provide a communication function between the data storage system 1000 and an external host. When a control command is received from an external host through the host interface 1230, the processor 1210 may control the semiconductor device 1100 in response to the control command.

Figure 28:
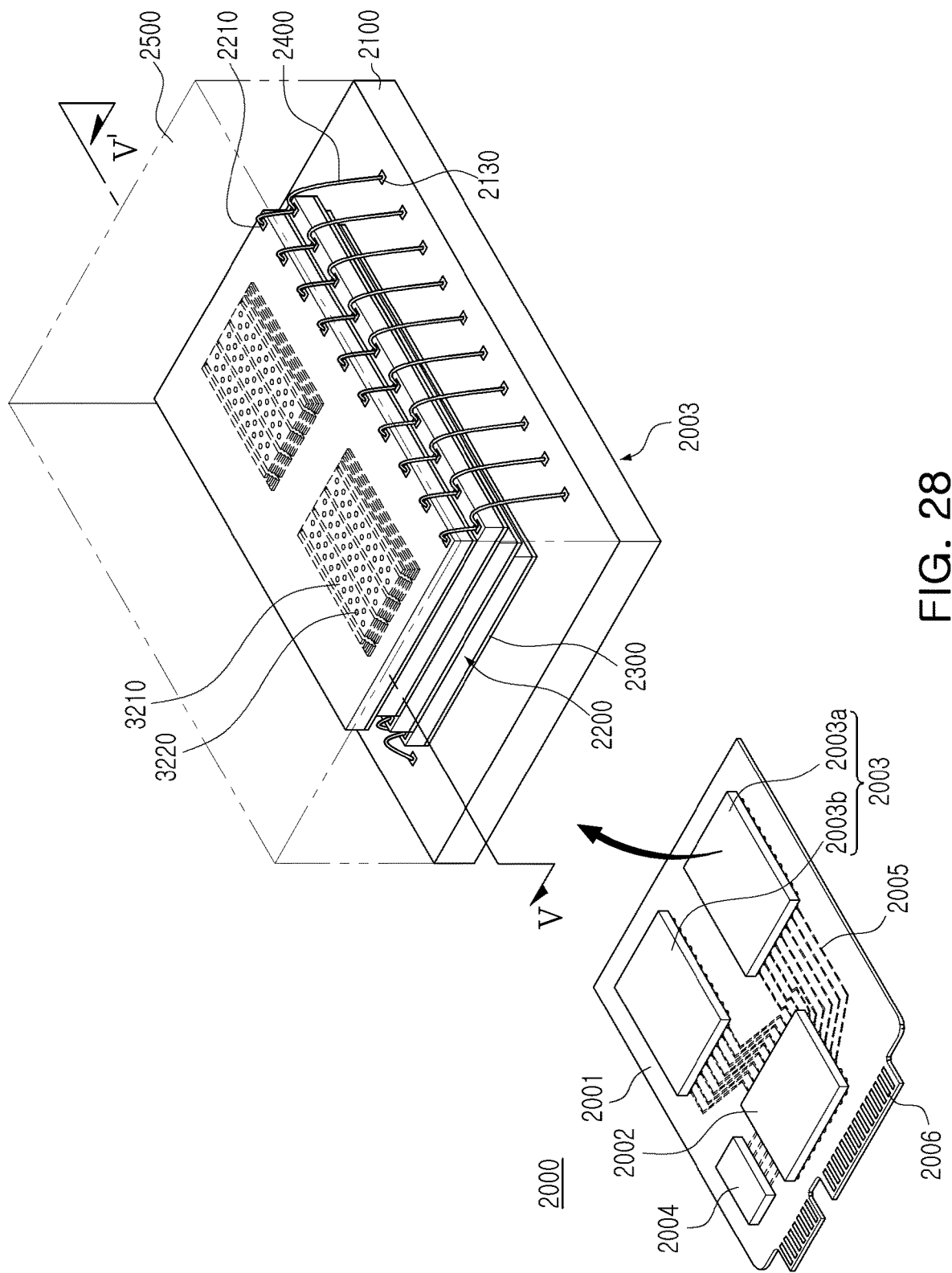
FIG. 28 is a perspective diagram illustrating a data storage system including a semiconductor device, according to an example embodiment of the present disclosure.

FIG. 28 is a perspective diagram illustrating a data storage system including a semiconductor device according to an example embodiment.

Referring to FIG. 28, a data storage system 2000 in the example embodiment may include a main substrate 2001, a controller 2002 mounted on the main substrate 2001, and one or more semiconductor packages 2003, and a DRAM 2004. The semiconductor package 2003 and the DRAM 2004 may be connected to the controller 2002 by wiring patterns 2005 formed on the main substrate 2001.

The main substrate 2001 may include a connector 2006 including a plurality of pins coupled to an external host. The number and the arrangement of the plurality of pins in the connector 2006 may be varied depending on a communication interface between the data storage system 2000 and the external host. In example embodiments, the data storage system 2000 may communicate with an external host according to one of interfaces such as a universal serial bus (USB), a peripheral component interconnect express (PCI-Express), a serial advanced technology attachment (SATA), a M-Phy for universal flash storage (UFS). In example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data in the semiconductor package 2003 or may read data from the semiconductor package 2003, and may improve an operation speed of the data storage system 2000.

The DRAM 2004 may be configured as a buffer memory for mitigating a difference in speed between the semiconductor package 2003, a data storage space, and an external host. The DRAM 2004 included in the data storage system 2000 may also operate as a cache memory, and may provide a space for temporarily storing data in a control operation for the semiconductor package 2003. When the DRAM 2004 is included in the data storage system 2000, the controller 2002 may further include a DRAM controller for controlling the DRAM 2004 in addition to a NAND controller for controlling the semiconductor package 2003.

The semiconductor package 2003 may include first and second semiconductor packages 2003a and 2003b spaced apart from each other. Each of the first and second semiconductor packages 2003a and 2003b may be implemented as a semiconductor package including a plurality of semiconductor chips 2200. Each of the semiconductor chips 2200 may include the semiconductor device described in the aforementioned example embodiments with reference to FIGS. 1 to 18, or the semiconductor device manufactured by the method of manufacturing a semiconductor device described in the aforementioned example embodiments with reference to FIGS. 19A to 26B.

Each of the first and second semiconductor packages 2003a and 2003b may include a package substrate 2100, semiconductor chips 2200 on the package substrate 2100, adhesive layers 2300 disposed on lower surfaces of the semiconductor chips 2200, respectively, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be implemented as a printed circuit board including package upper pads 2130. Each of the semiconductor chips 2200 may include an input and output pad 2210.

In example embodiments, the connection structure 2400 may be configured as a bonding wire electrically connecting the input and output pad 2210 to the package upper pads 2130. Accordingly, in each of the first and second semiconductor packages 2003a and 2003b, the semiconductor chips 2200 may be electrically connected to each other by a bonding wire method, and may be electrically connected to the package upper pads 2130 of the package substrate 2100. In example embodiments, in each of the first and second semiconductor packages 2003a and 2003b, the semiconductor chips 2200 may be electrically connected to each other through a connection structure including a through silicon via (TSV), instead of the connection structure 2400 of a bonding wire method.

In example embodiments, the controller 2002 and the semiconductor chips 2200 may be included in a single package. For example, the controller 2002 and the semiconductor chips 2200 may be mounted on an interposer substrate different from the main substrate 2001, and the controller 2002 may be connected to the semiconductor chips 2200 by wirings formed on the interposer substrate.

Figure 29:
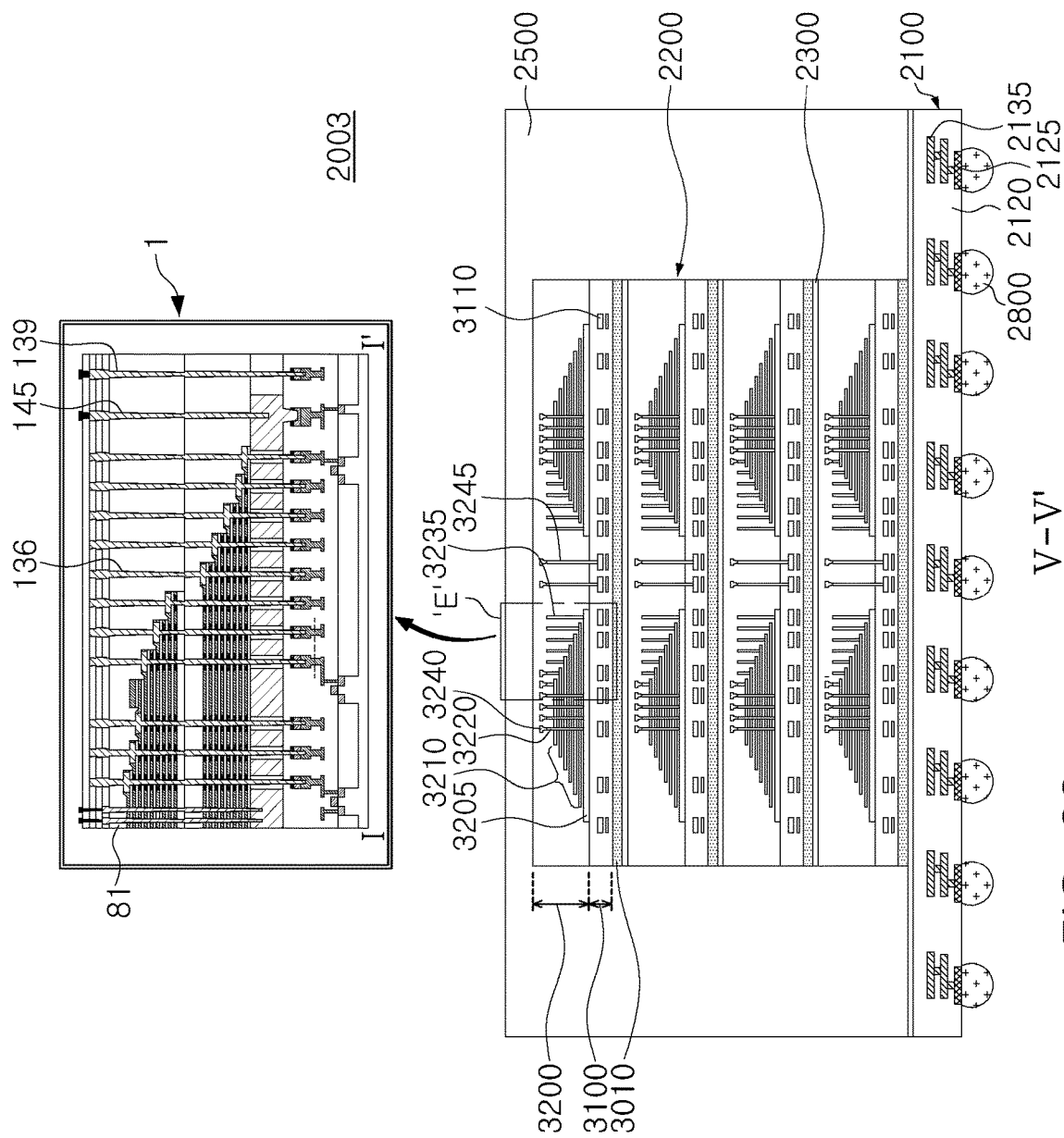
FIG. 29 is a cross-sectional diagram illustrating a data storage system including a semiconductor device, according to an example embodiment of the present disclosure.

FIG. 29 is a cross-sectional diagram illustrating a data storage system including a semiconductor device according to an example embodiment. FIG. 29 illustrates an example embodiment of the semiconductor package 2003 in FIG. 28, illustrating a region of the semiconductor package 2003 in FIG. 28 taken along line V-V'.

Referring to FIG. 29, in a semiconductor package 2003, the package substrate 2100 may be configured as a printed circuit board. The package substrate 2100 may include a package substrate body portion 2120, package upper pads 2130 disposed on an upper surface of the package substrate body portion 2120, lower pads 2125 disposed on a lower surface of the package substrate body portion 2120 or exposed through the lower surface, and internal wirings 2135 electrically connecting the package upper pads 2130 to the lower pads 2125 in the package substrate body portion 2120. The package upper pads 2130 may be electrically connected to the connection structures 2400. The lower pads 2125 may be connected to the wiring patterns 2005 of the main substrate 2010 of the data storage system 2000 through conductive connection portions 2800.

Each of the semiconductor chips 2200 may include a semiconductor substrate 3010 and a first structure 3100 and a second structure 3200 stacked on the semiconductor substrate 3010 in order. The first structure 3100 may include a peripheral circuit region including peripheral wirings 3110. The second structure 3200 may include a common source line 3205, a gate stack structure 3210 on the common source line 3205, memory channel structures 3220 and separation structures 3230 penetrating the gate stack structure 3210, bit lines 3240 electrically connected to the memory channel structures 3220, and gate connection wires (e.g., the gate connection wires 93b in FIG. 2A) electrically connected to the word lines WL of the gate stack structure 3210. The first structure 3100 may include the first structure 1100F in FIG. 27, and the second structure 3200 may include the second structure 1100S in FIG. 27.

Each of the semiconductor chips 2200 may include a through wiring 3245 electrically connected to the peripheral wirings 3110 of the first structure 3100 and extending into the second structure 3200. The through wiring 3245 may penetrate the gate stack structure 3210, and may be further disposed on an external side of the gate stack structure 3210.

Each of the semiconductor chips 2200 may further include an input and output connection wiring 3265 electrically connected to the peripheral wirings 3110 of the first structure 3100 and extending into the second structure 3200, and an input and output pad 2210 electrically connected to the input and output connection wiring 3265.

In FIG. 29, the enlarged portion of the semiconductor device 1, denoted by reference numeral 1, is provided to indicate that the semiconductor chips 2200 in FIG. 29 may be modified to include the cross-sectional structure as in FIG. 3A. Therefore, each of the semiconductor chips 2200 may include the semiconductor device 1 described in the aforementioned example embodiments with reference to FIGS. 1 to 18, or the semiconductor device 1 manufactured by the method of manufacturing a semiconductor device described in the aforementioned example embodiments with reference to FIGS. 19A to 26B.

According to the aforementioned example embodiments, by forming various types of contact holes by performing several photo processes and etching processes, and simultaneously forming various types of contact plugs filling each of the various types of contact holes, various types of contact plugs may be formed stably with reliability. Therefore, reliability of the semiconductor device may improve. Further, since the gate layers may be formed and stacked in a vertical direction, integration density of the semiconductor device may improve.

Accordingly, a semiconductor device and a data storage system which may improve integration density and reliability may be provided.

While the example embodiments have been illustrated and described above, it will be apparent to those skilled in the art that modifications and variations could be made without departing from the scope of the present disclosure as defined by the appended claims.

What is claimed is:
1. A semiconductor device, comprising:
a pattern structure;
a stack structure including a plurality of gate layers stacked and spaced apart from each other in a vertical direction in a first region on the pattern structure and extending into a second region on the pattern structure;
a memory vertical structure penetrating through the stack structure in the first region; and
a plurality of gate contact plugs electrically connected to the plurality of gate layers in the second region,
wherein the plurality of gate layers includes a first gate layer, wherein the plurality of gate contact plugs includes a gate contact plug in contact with and electrically connected to the first gate layer, wherein a side surface of the gate contact plug includes a first upper bending portion, wherein a side surface of the memory vertical structure includes a second upper bending portion, and wherein the first upper bending portion and the second upper bending portion are at a higher level than an uppermost gate layer of the plurality of gate layers.

2. The semiconductor device of claim 1,
wherein the second upper bending portion is substantially at the same level as the first upper bending portion.

3. The semiconductor device of claim 2,
wherein the side surface of the gate contact plug further includes an uppermost bending portion, and
wherein the uppermost bending portion is at a higher level than the first and second upper bending portions.

4. The semiconductor device of claim 3, further comprising:
a peripheral contact plug spaced apart from the plurality of gate layers,
wherein an upper end of the peripheral contact plug is at a higher level than an uppermost gate layer of the plurality of gate layers,
wherein a lower end of the peripheral contact plug is at a lower level than a lowermost gate layer of the plurality of gate layers, and
wherein a side surface of the peripheral contact plug does not include a bending portion at the same height level as the uppermost bending portion.

5. The semiconductor device of claim 4,
wherein an upper surface of the peripheral contact plug is substantially at the same level as an upper surface of the gate contact plug, and
wherein the upper surfaces of the peripheral contact plug and the gate contact plug are at a higher level than an upper surface of the memory vertical structure.

6. The semiconductor device of claim 1, further comprising:
a peripheral contact plug spaced apart from the plurality of gate layers,
wherein an upper end of the peripheral contact plug is at a higher level than an uppermost gate layer of the plurality of gate layers,
wherein a lower end of the peripheral contact plug is at a lower level than a lowermost gate layer of the plurality of gate layers,
wherein a side surface of the peripheral contact plug includes a third upper bending portion, and
wherein the third upper bending portion is substantially at the same level as the first and second upper bending portions.

7. The semiconductor device of claim 6,
wherein the first, second, and third upper bending portions are arranged in the same direction.

8. The semiconductor device of claim 6,
wherein the side surface of the memory vertical structure further includes a first lower bending portion,
wherein the side surface of the gate contact plug further includes a second lower bending portion,
wherein a side surface of the peripheral contact plug further includes a third lower bending portion,
wherein the plurality of gate layers includes a plurality of lower gate layers and a plurality of upper gate layers on the plurality of lower gate layers, wherein the first, second, and third lower bending portions are at a higher level than the plurality of lower gate layers, and
wherein the first, second, and third lower bending portions are at a lower level than the plurality of upper gate layers.

9. The semiconductor device of claim 8,
wherein the first, second, and third lower bending portions are substantially at the same level.

10. The semiconductor device of claim 8,
wherein the first, second, and third lower bending portions are arranged in the same direction.

11. The semiconductor device of claim 6,
wherein the peripheral contact plug includes a first conductive pattern,
wherein the first conductive pattern extends continuously from a lower surface of the first conductive pattern to an upper surface of the first conductive pattern,
wherein the upper surface of the first conductive pattern is at a higher level than an uppermost gate layer of the plurality of gate layers, and
wherein the lower surface of the first conductive pattern is at a lower level than a lowermost gate layer of the plurality of gate layers.

12. The semiconductor device of claim 11,
wherein the gate contact plug includes a second conductive pattern,
wherein the second conductive pattern extends continuously from a lower surface of the second conductive pattern to an upper surface of the second conductive pattern,
wherein the upper surface of the second conductive pattern is at a higher level than the uppermost gate layer,
wherein the lower surface of the second conductive pattern is at a lower level than the lowermost gate layer, and
wherein the first gate layer contacts a portion of the side surface of the gate contact plug.

13. The semiconductor device of claim 1,
wherein the memory vertical structure includes:
a gap-fill insulating pattern;
a channel layer on a side surface of the gap-fill insulating pattern;
a data storage structure between the channel layer and the stack structure; and
a pad layer on and in contact with an upper surface of the gap-fill insulating pattern, and
wherein an upper surface of the pad layer is at a higher level than the first upper bending portion.

14. The semiconductor device of claim 1, further comprising:
a structure including a peripheral circuit,
wherein the pattern structure and the stack structure are on the structure.

15. The semiconductor device of claim 1, further comprising:
a structure including a peripheral circuit;
a bit line between the structure and the memory vertical structure;
a gate wiring between the structure and the gate contact plug;
a bit line contact plug between the memory vertical structure and the bit line; and
a gate connection plug between the gate contact plug and the gate wiring.

16. A semiconductor device, comprising:

a pattern structure;

a stack structure on the pattern structure, the stack structure including a plurality of gate layers stacked and spaced apart from each other in a vertical direction;

a memory vertical structure penetrating through the stack structure; and a plurality of gate contact plugs electrically connected to the plurality of gate layers, wherein the plurality of gate layers includes a first gate layer, wherein the plurality of gate contact plugs includes a gate contact plug in contact with and electrically connected to the first gate layer, wherein an upper surface of the gate contact plug is at a higher level than an upper surface of the memory vertical structure, wherein a side surface of the gate contact plug includes a first upper bending portion, wherein the first upper bending portion is at a lower level than the upper surface of the memory vertical structure, and wherein the first upper bending portion is at a higher level than an uppermost gate layer of the plurality of gate layers.

17. The semiconductor device of claim 16, wherein a side surface of the gate contact plug further includes a second upper bending portion, and wherein the second upper bending portion is at a higher level than the upper surface of the memory vertical structure.

18. The semiconductor device of claim 17, wherein the gate contact plug includes a conductive pattern, wherein the conductive pattern extends continuously from a lower surface of the conductive pattern to an upper surface of the conductive pattern, wherein the upper surface of the conductive pattern is at a higher level than the uppermost gate layer, wherein the lower surface of the conductive pattern is at a lower level than a lowermost gate layer of the plurality of gate layers, wherein the first gate layer contacts a portion of the side surface of the gate contact plug, wherein the memory vertical structure includes:

a gap-fill insulating pattern;

a channel layer on a side surface of the gap-fill insulating pattern;

a data storage structure between the channel layer and the stack structure; and a pad layer on and in contact with an upper surface of the gap-fill insulating pattern, and wherein an upper surface of the pad layer is at a higher level than the first upper bending portion.

19. A data storage system, comprising:

a main substrate;

a semiconductor device on the main substrate; and a controller electrically connected to the semiconductor device on the main substrate, wherein the semiconductor device includes:

a pattern structure;

a stack structure including a plurality of gate layers stacked and spaced apart from each other in a vertical direction in a first region on the pattern structure and extending into a second region on the pattern structure;

a memory vertical structure penetrating through the stack structure in the first region; and a plurality of gate contact plugs electrically connected to the plurality of gate layers in the second region, wherein the plurality of gate layers includes a first gate layer, wherein the plurality of gate contact plugs includes a gate contact plug in contact with and electrically connected to the first gate layer, wherein a side surface of the gate contact plug includes a first upper bending portion, wherein a side surface of the memory vertical structure includes a second upper bending portion, and wherein the first upper bending portion and the second upper bending portion is at a higher level than an uppermost gate layer of the plurality of gate layers.

20. The data storage system of claim 19, wherein the second upper bending portion is substantially at the same level as the first upper bending portion, wherein the side surface of the gate contact plug further includes an uppermost bending portion, and wherein the uppermost bending portion is at a higher level than the first and second upper bending portions.

* * * * *